(12) United States Patent
Seddon et al.

(10) Patent No.: US 11,908,699 B2
(45) Date of Patent: Feb. 20, 2024

(54) SEMICONDUCTOR PACKAGES WITH DIE INCLUDING CAVITIES

(71) Applicant: SEMICONDUCTOR COMPONENTS INDUSTRIES, LLC, Phoenix, AZ (US)

(72) Inventors: Michael J. Seddon, Gilbert, AZ (US); Francis J. Carney, Phoenix, AZ (US); Chee Hiong Chew, Seremban (MY); Soon Wei Wang, Seremban (MY); Eiji Kurose, Oizumi-machi (JP)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 17/660,477

(22) Filed: Apr. 25, 2022

(65) Prior Publication Data

US 2022/0246434 A1 Aug. 4, 2022

Related U.S. Application Data

(60) Continuation of application No. 16/985,995, filed on Aug. 5, 2020, now Pat. No. 11,342,189, which is a
(Continued)

(51) Int. Cl.
*H01L 21/302* (2006.01)
*H01L 21/48* (2006.01)
(Continued)

(52) U.S. Cl.
CPC ............ *H01L 21/302* (2013.01); *H01L 21/48* (2013.01); *H01L 21/561* (2013.01);
(Continued)

(58) Field of Classification Search
CPC ...................................................... H01L 21/302
(Continued)

(56) References Cited

U.S. PATENT DOCUMENTS 3,462,650 A 8/1969 Hennings
3,761,782 A 9/1973 Youmans
(Continued)

FOREIGN PATENT DOCUMENTS

CN 104201114 A 12/2014
JP 2002076326 A 3/2002
(Continued)

OTHER PUBLICATIONS

Extended European Search Report, European Patent Application No. 18184165.1, dated Jan. 17, 2019, 8 pages.
(Continued)

*Primary Examiner* — Ajay Arora
(74) *Attorney, Agent, or Firm* — Adam R. Stephenson, LTD.

(57) ABSTRACT

Implementations of a method of forming a semiconductor package may include forming a plurality of notches into the first side of a semiconductor substrate; forming an organic material over the first side of the semiconductor substrate and into the plurality of notches; forming a cavity into each of a plurality of semiconductor die included in the semiconductor substrate; applying a backmetal into the cavity in each of the plurality of semiconductor die included in the semiconductor substrate; and singulating the semiconductor substrate through the organic material into a plurality of semiconductor packages.

13 Claims, 35 Drawing Sheets

Related U.S. Application Data continuation-in-part of application No. 16/862,120, filed on Apr. 29, 2020, now Pat. No. 11,430,746, and a continuation-in-part of application No. 16/861,740, filed on Apr. 29, 2020, and a continuation-in-part of application No. 16/862,063, filed on Apr. 29, 2020, said application No. 16/861,740 is a continuation-in-part of application No. 16/702,958, filed on Dec. 4, 2019, now Pat. No. 11,328,930, said application No. 16/985,995 is a continuation of application No. 16/545,139, filed on Aug. 20, 2019, now Pat. No. 10,950,534, said application No. 16/861,740 is a continuation-in-part of application No. 16/395,822, filed on Apr. 26, 2019, now Pat. No. 10,763,173, said application No. 16/545,139 is a division of application No. 16/101,259, filed on Aug. 10, 2018, now Pat. No. 10,446,480, said application No. 16/702,958 is a division of application No. 15/679,661, filed on Aug. 17, 2017, now Pat. No. 10,529,576, said application No. 16/395,822 is a continuation of application No. 15/679,664, filed on Aug. 17, 2017, now Pat. No. 10,319,639, said application No. 16/101,259 is a division of application No. 15/244,737, filed on Aug. 23, 2016, now Pat. No. 10,079,199.

(60) Provisional application No. 62/219,666, filed on Sep. 17, 2015.

(51) Int. Cl.
  *H01L 21/56* (2006.01)
  *H01L 21/78* (2006.01)
  *H01L 23/12* (2006.01)
  *H01L 23/31* (2006.01)
  *H01L 23/00* (2006.01)

(52) U.S. Cl.
  CPC .......... *H01L 21/565* (2013.01); *H01L 21/78* (2013.01); *H01L 23/12* (2013.01); *H01L 23/3185* (2013.01); *H01L 24/04* (2013.01); *H01L 24/26* (2013.01); *H01L 2224/94* (2013.01)

(58) Field of Classification Search
  USPC ......................................... 438/137
  See application file for complete search history.

(56) References Cited

U.S. PATENT DOCUMENTS

| | | | |
|---|---|---|---|
| 4,772,929 A * | 9/1988 | Manchester | G11B 5/378 |
| | | | 257/E27.005 |
| 4,896,194 A * | 1/1990 | Suzuki | H01L 24/24 |
| | | | 257/664 |
| 5,122,856 A | 6/1992 | Komiya | |
| 5,274,265 A | 12/1993 | Tsuruta | |
| 5,343,071 A | 8/1994 | Kazior et al. | |
| 5,360,984 A | 11/1994 | Kirihata | |
| 5,420,458 A | 5/1995 | Shimoji | |
| 5,629,535 A | 5/1997 | Ajit | |
| 5,841,197 A | 11/1998 | Adamic, Jr. | |
| 6,034,415 A | 3/2000 | Johnson et al. | |
| 6,104,062 A | 8/2000 | Zeng | |
| 6,111,280 A | 8/2000 | Gardner et al. | |
| 6,124,179 A | 9/2000 | Adamic, Jr. | |
| 6,252,300 B1 | 6/2001 | Hsuan | |
| 6,319,796 B1 | 11/2001 | Laparra et al. | |
| 6,352,923 B1 | 3/2002 | Hsuan | |
| 6,461,956 B1 | 10/2002 | Hsuan | |
| 7,227,242 B1 | 6/2007 | Lin et al. | |
| 7,230,314 B2 | 6/2007 | Udrea et al. | |
| 7,235,439 B2 | 6/2007 | Udrea et al. | |
| 7,960,800 B2 | 6/2011 | Gruenhagen et al. | |
| 8,058,732 B2 | 11/2011 | Gruenhagen et al. | |
| 8,378,496 B2 | 2/2013 | Schrank | |
| 8,492,260 B2 | 7/2013 | Parsey, Jr. et al. | |
| 8,872,310 B2 | 10/2014 | Cobbley et al. | |
| 8,981,533 B2 | 3/2015 | Grivna | |
| 9,012,810 B2 | 4/2015 | Santoruvo et al. | |
| 9,165,886 B2 | 10/2015 | Bowles et al. | |
| 9,472,490 B1 | 10/2016 | Sullivan | |
| 9,496,193 B1 | 11/2016 | Roesner et al. | |
| 9,530,857 B2 | 12/2016 | Roozeboom | |
| 9,653,383 B2 | 5/2017 | Yilmaz et al. | |
| 10,319,639 B2 | 6/2019 | Krishnan et al. | |
| 2001/0005046 A1 | 6/2001 | Hsuan | |
| 2006/0131691 A1 | 6/2006 | Roozeboom | |
| 2008/0014677 A1 | 1/2008 | Xiaochun et al. | |
| 2008/0251902 A1 | 10/2008 | Masuda et al. | |
| 2009/0057844 A1 | 3/2009 | Tanida | |
| 2009/0215227 A1 | 8/2009 | Tan et al. | |
| 2010/0264548 A1 | 10/2010 | Sander et al. | |
| 2010/0314762 A1 | 12/2010 | Schrank | |
| 2011/0175242 A1 | 7/2011 | Grivna et al. | |
| 2012/0104580 A1 * | 5/2012 | Feng | H01L 23/49575 |
| | | | 257/E23.06 |
| 2013/0154068 A1 * | 6/2013 | Sanchez | H01L 24/97 |
| | | | 438/122 |
| 2013/0344652 A1 | 12/2013 | Haba et al. | |
| 2014/0070375 A1 | 3/2014 | Grivna | |
| 2014/0138856 A1 | 5/2014 | Sekiguchi et al. | |
| 2014/0217556 A1 | 8/2014 | Peh et al. | |
| 2014/0264802 A1 | 9/2014 | Yilmaz et al. | |
| 2015/0023376 A1 | 1/2015 | Yamanaka | |
| 2015/0155230 A1 | 6/2015 | Cao | |
| 2015/0364376 A1 | 12/2015 | Yu et al. | |
| 2016/0197149 A1 | 7/2016 | Sakai | |
| 2016/0225733 A1 * | 8/2016 | Wilcoxen | H01L 21/561 |
| 2017/0032981 A1 | 2/2017 | Chinnusamy | |
| 2017/0033026 A1 | 2/2017 | Ho et al. | |
| 2017/0098612 A1 | 4/2017 | Lin et al. | |
| 2017/0243846 A1 | 8/2017 | Chen et al. | |
| 2020/0135661 A1 * | 4/2020 | Lee | H01L 23/562 |

FOREIGN PATENT DOCUMENTS

| | | | |
|---|---|---|---|
| JP | 2002368218 A | 12/2002 | |
| JP | 2003243356 A | 8/2003 | |
| JP | 2004281551 A | 10/2004 | |
| JP | 2007208074 A | 8/2007 | |
| JP | 2010205761 A | 9/2010 | |

OTHER PUBLICATIONS

Insulating Film Ajinomoto Build-Up Film, Ajinomoto Fine-TechnoCo., Inc., available at https: www.aft-website.com/en/electron/abf. Last vivisted Jul. 14, 2017.

JCAP Sidewall Isolated 0201/01005 DSN, Slide from JCAP, available at least as early as Jun. 22, 2017.

Sumitomo Bakelite Co., Ltd., Sumikon—EME-G600, Product Specification Sheet, Nov. 2005, 1 page.

Sumitomo Bakelite Co., Ltd., Sumikon—EME-G770H Type CD, Product Specification Sheet, May 2007, 1 page.

* cited by examiner

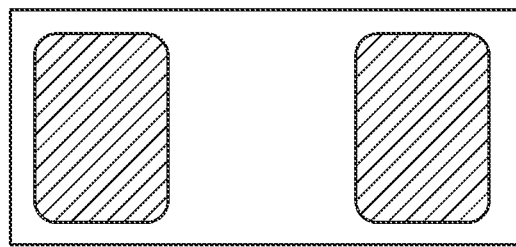
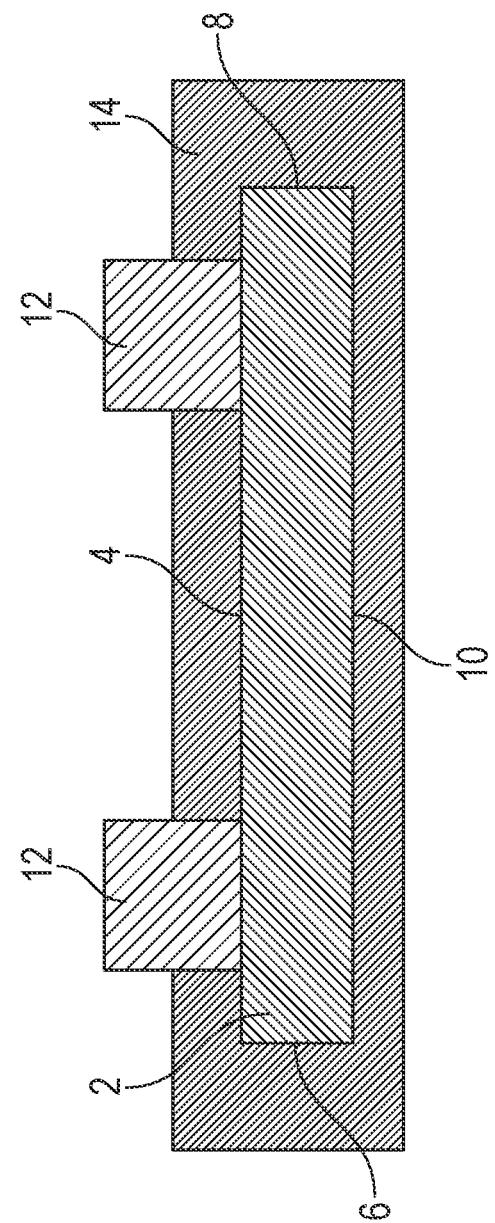

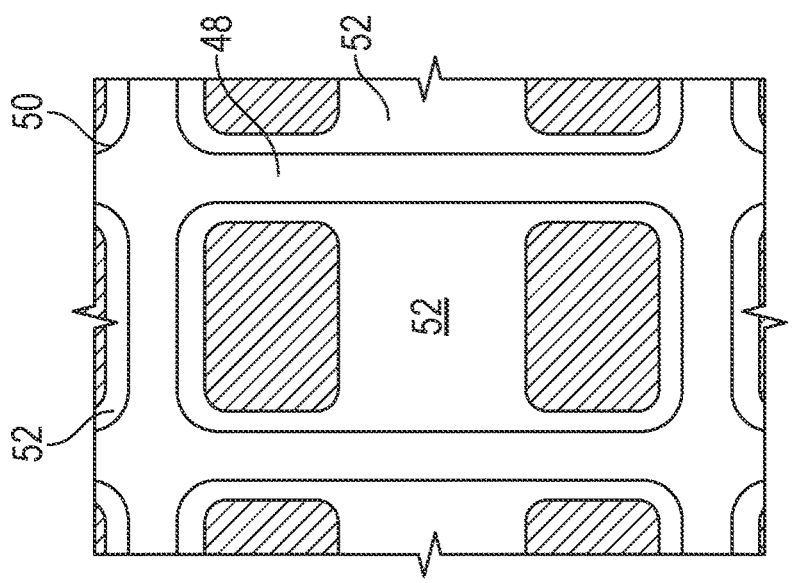
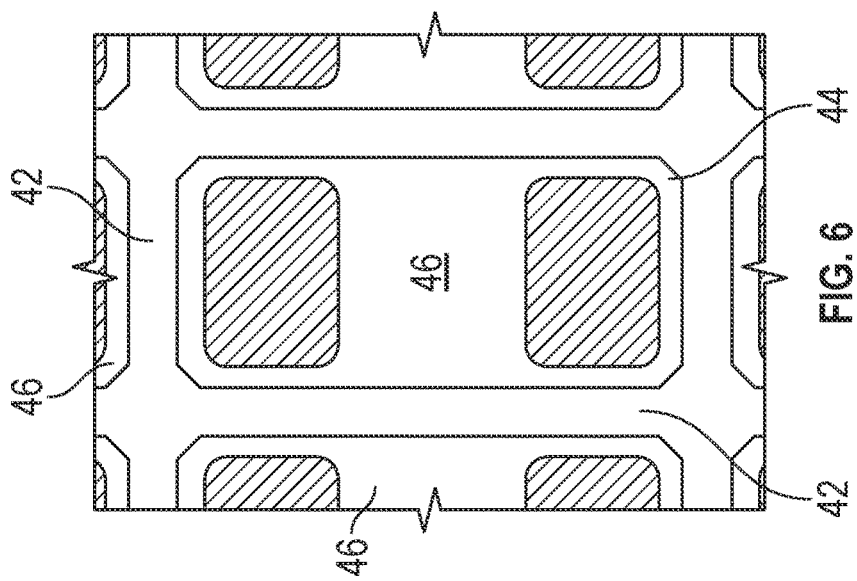
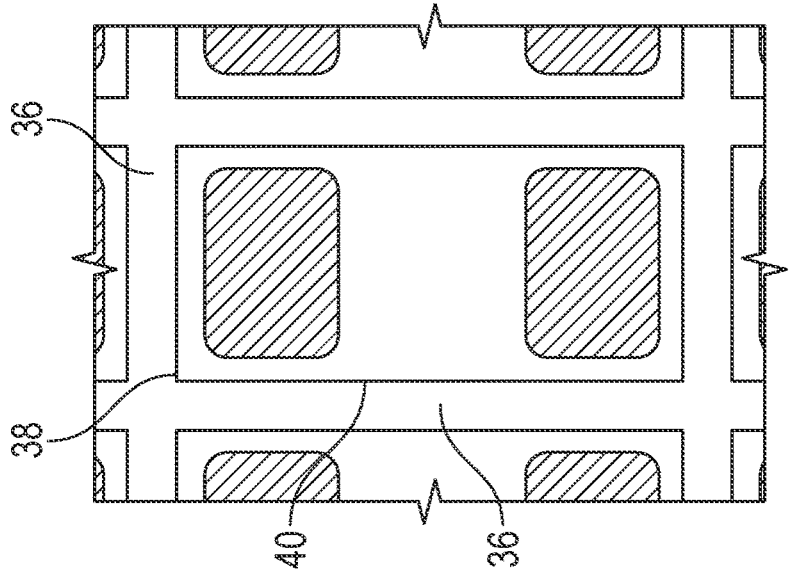

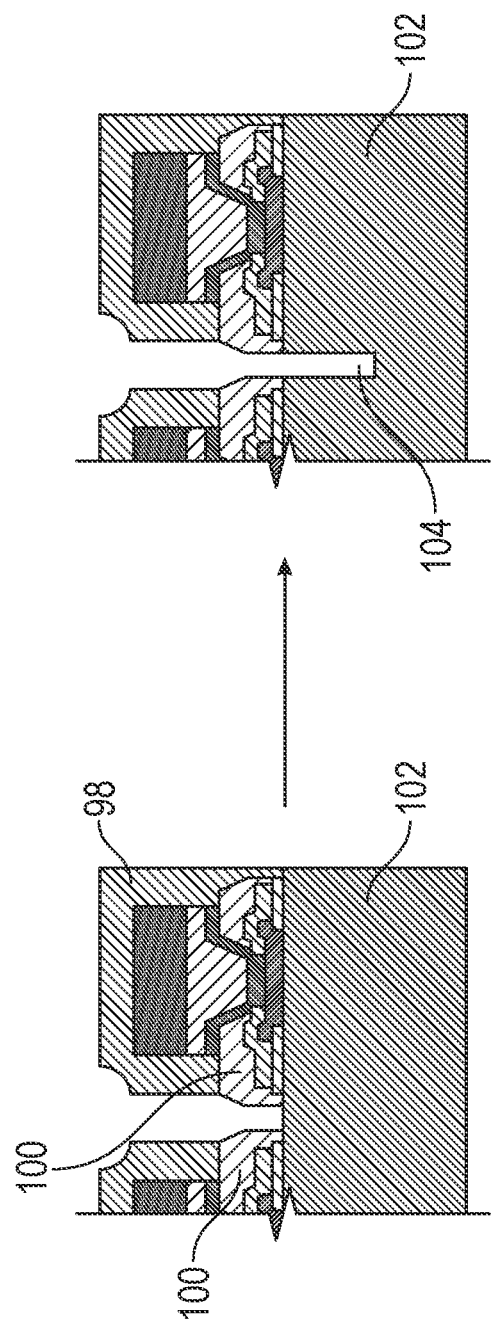
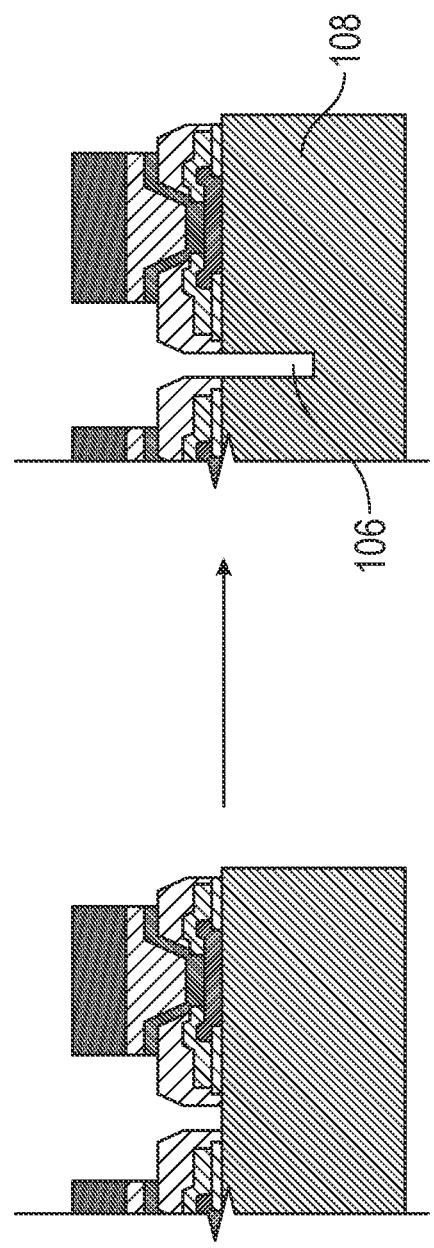
FIG. 11
FIG. 12

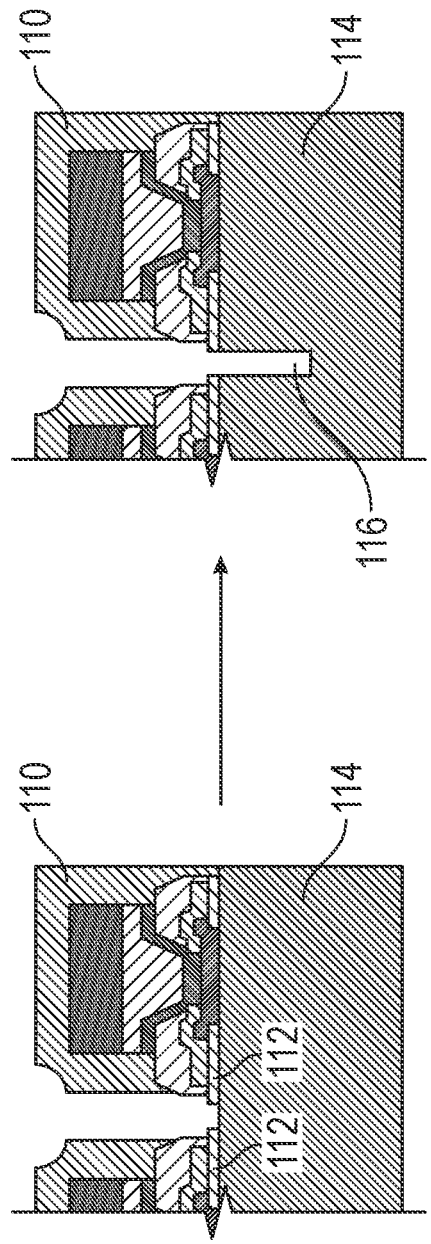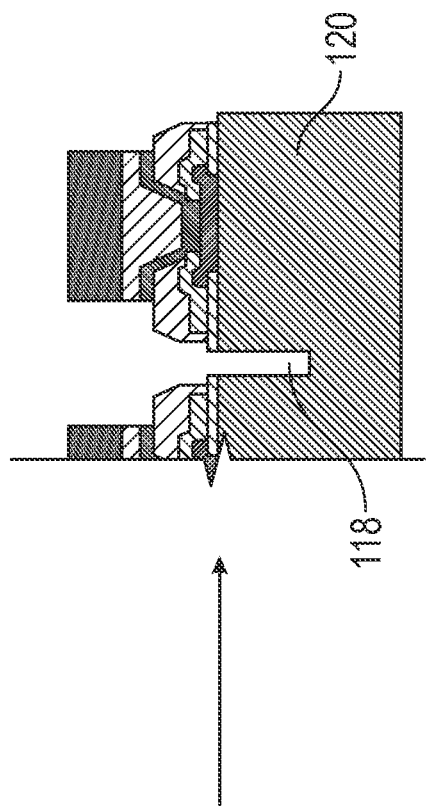
FIG. 13
FIG. 14

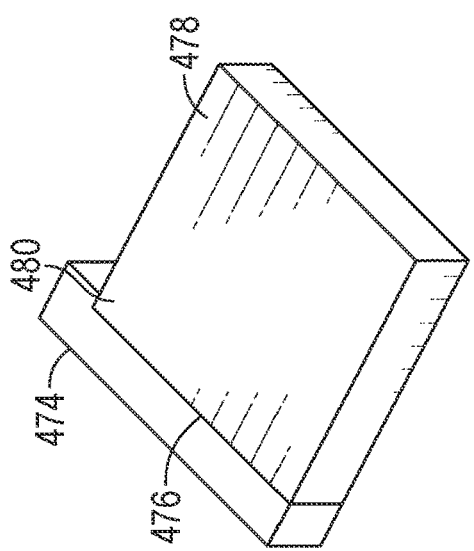
FIG. 38
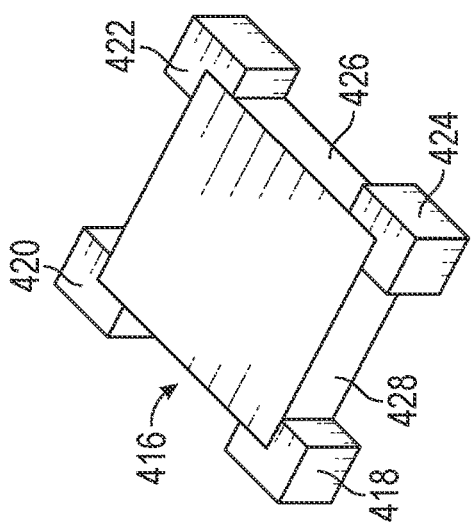
FIG. 37
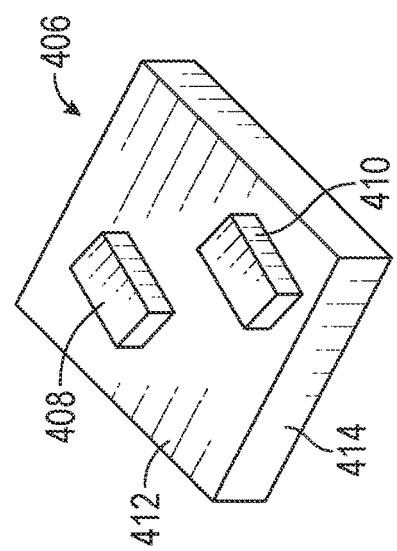
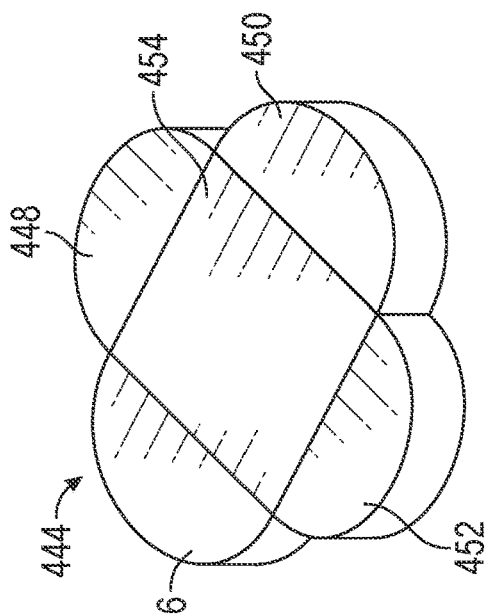
FIG. 39
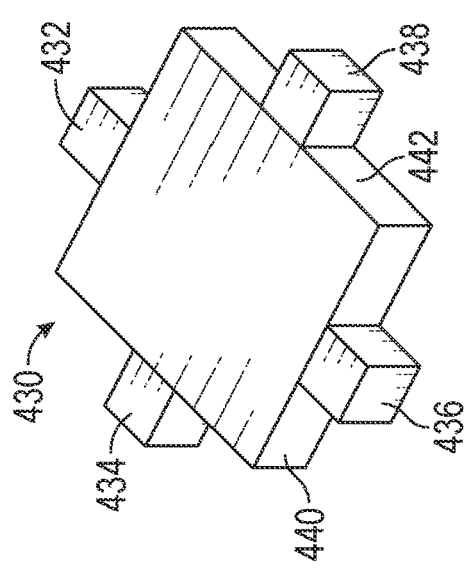
FIG. 41
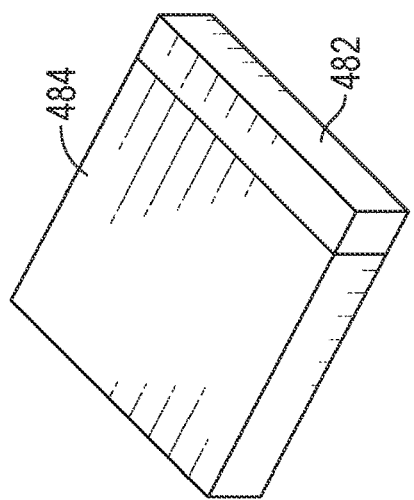
FIG. 40

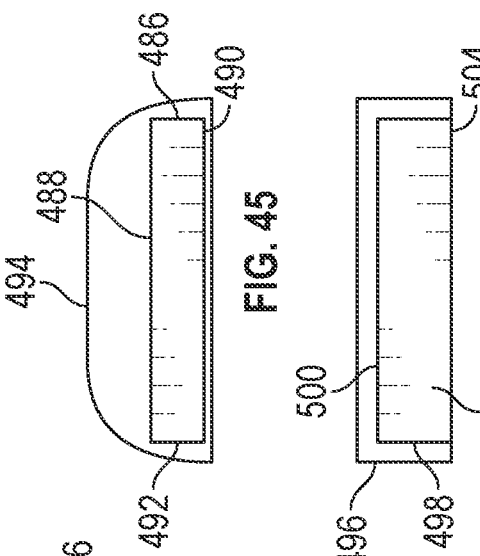
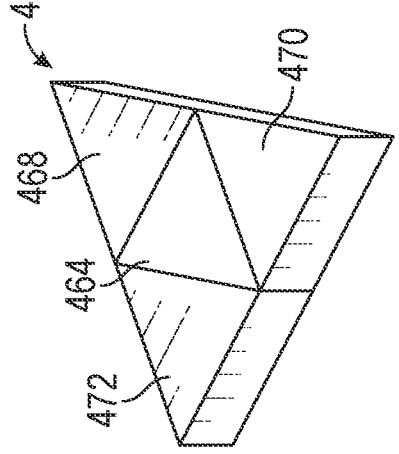
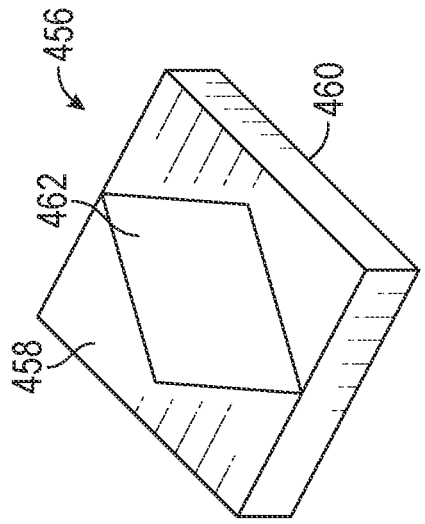
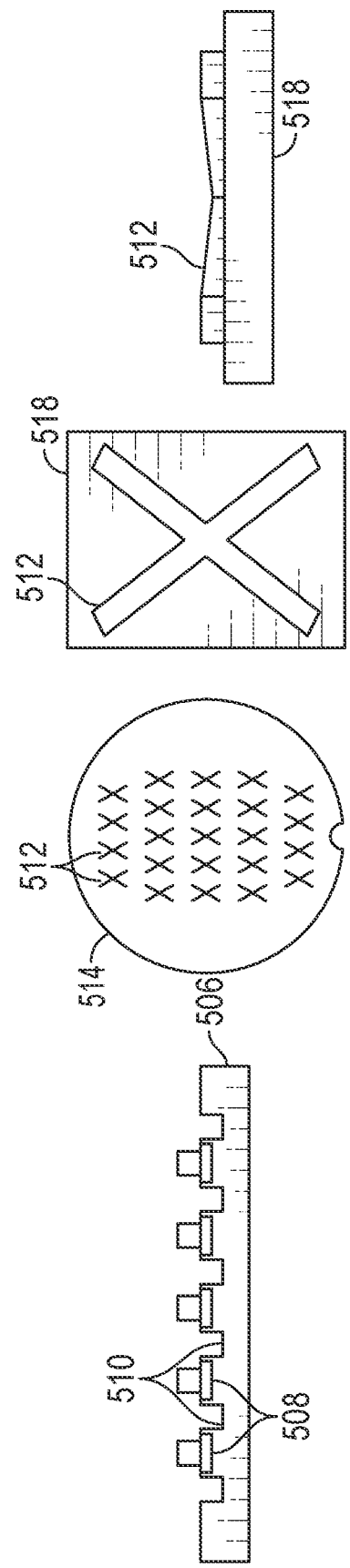

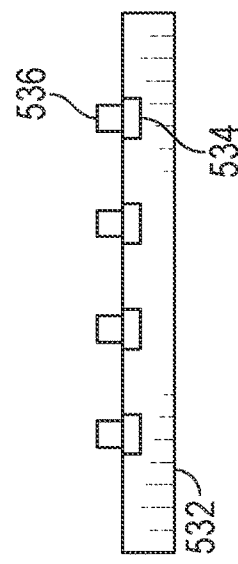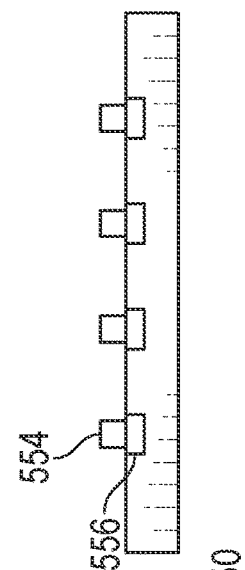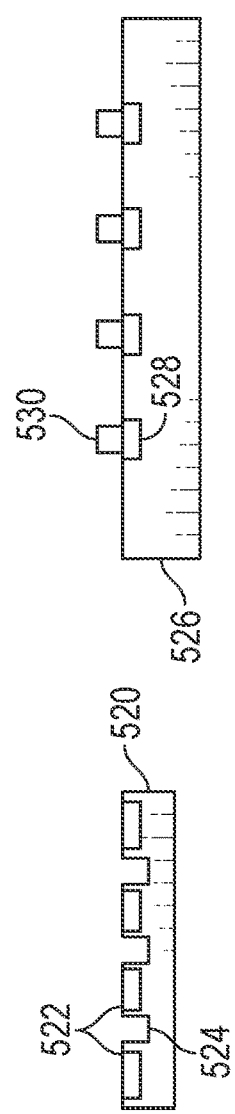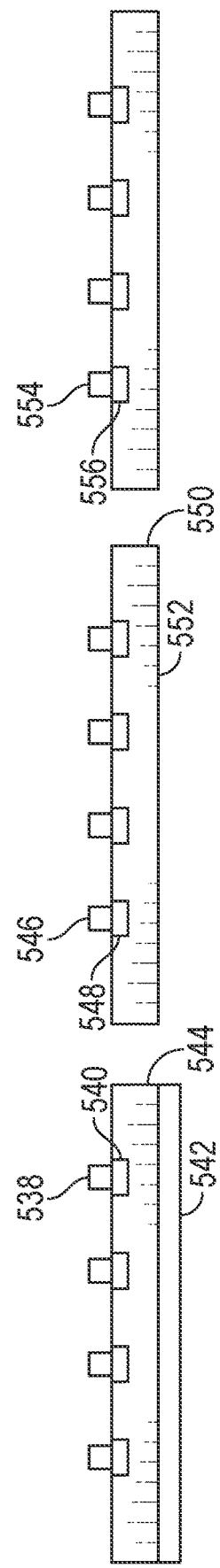

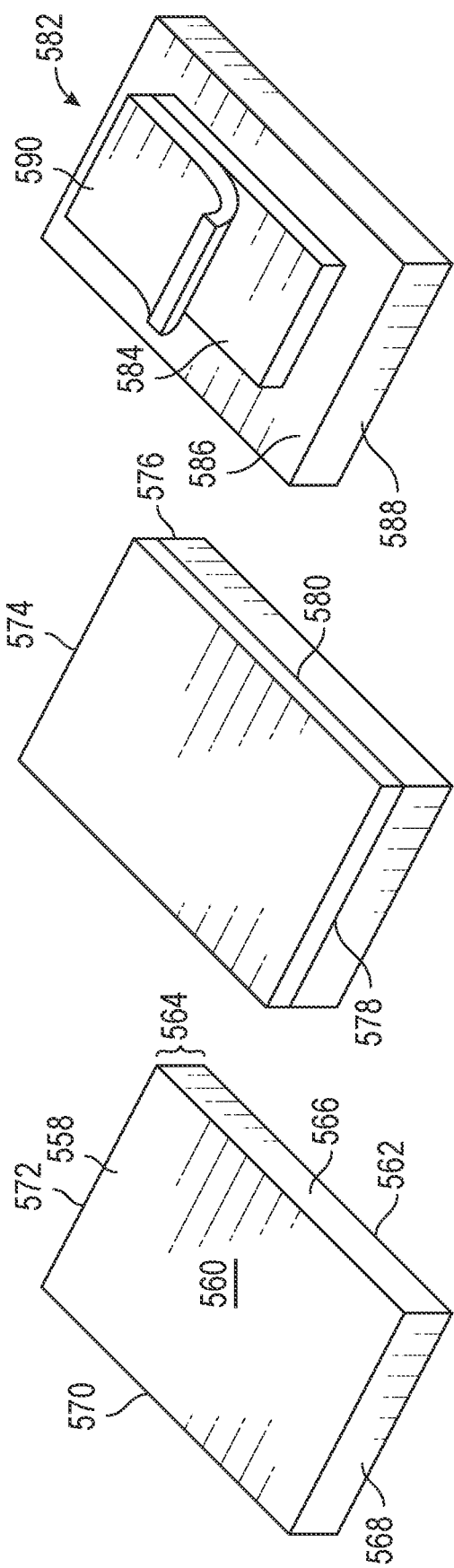
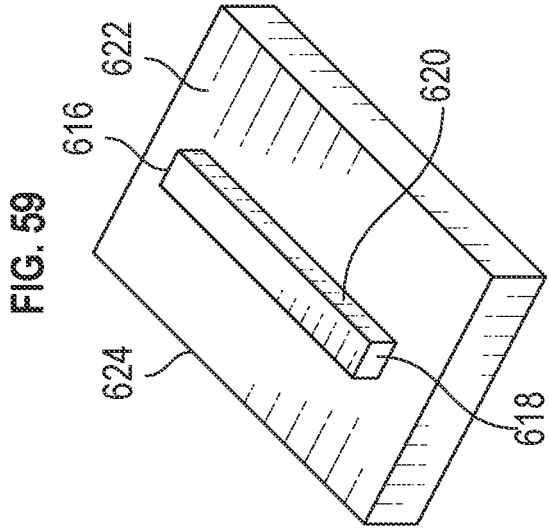
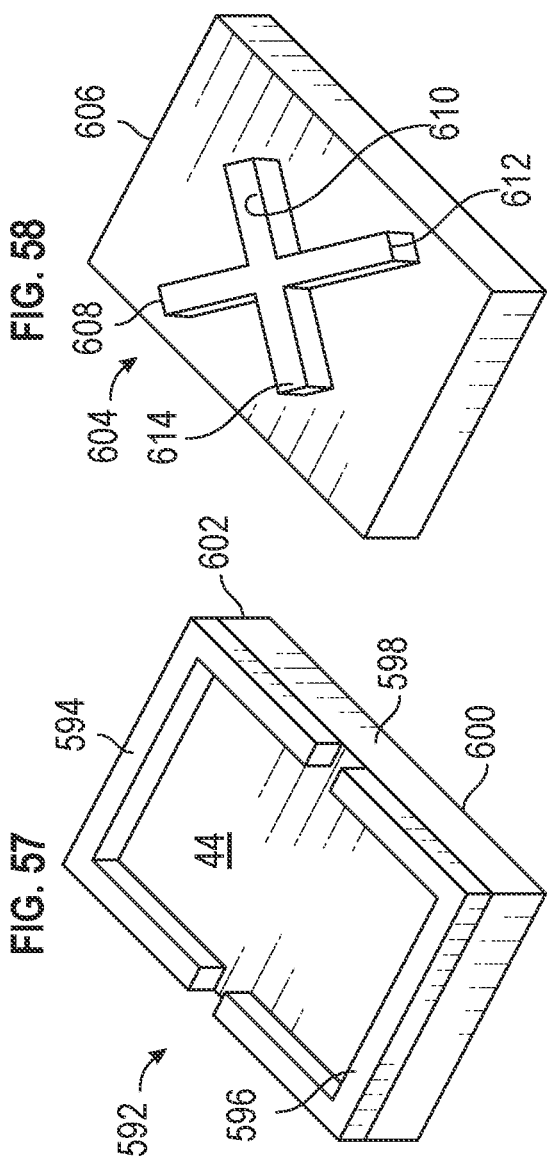

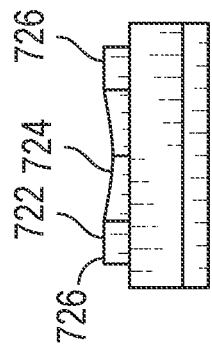
FIG. 77
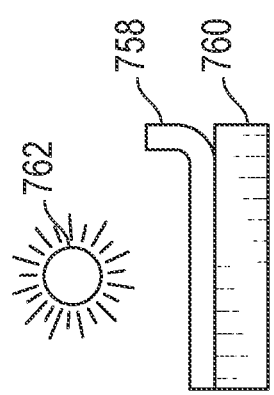
FIG. 80
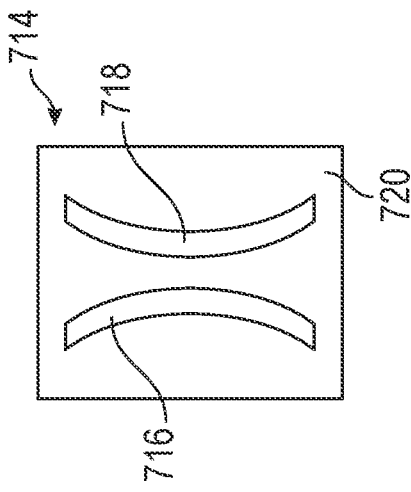
FIG. 76
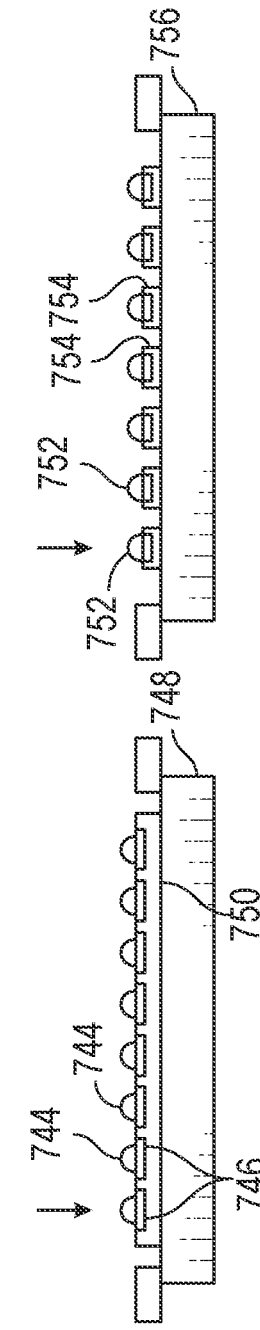
FIG. 79
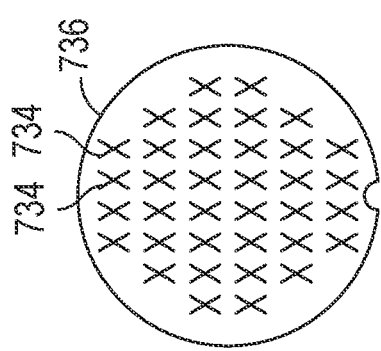
FIG. 75
FIG. 78

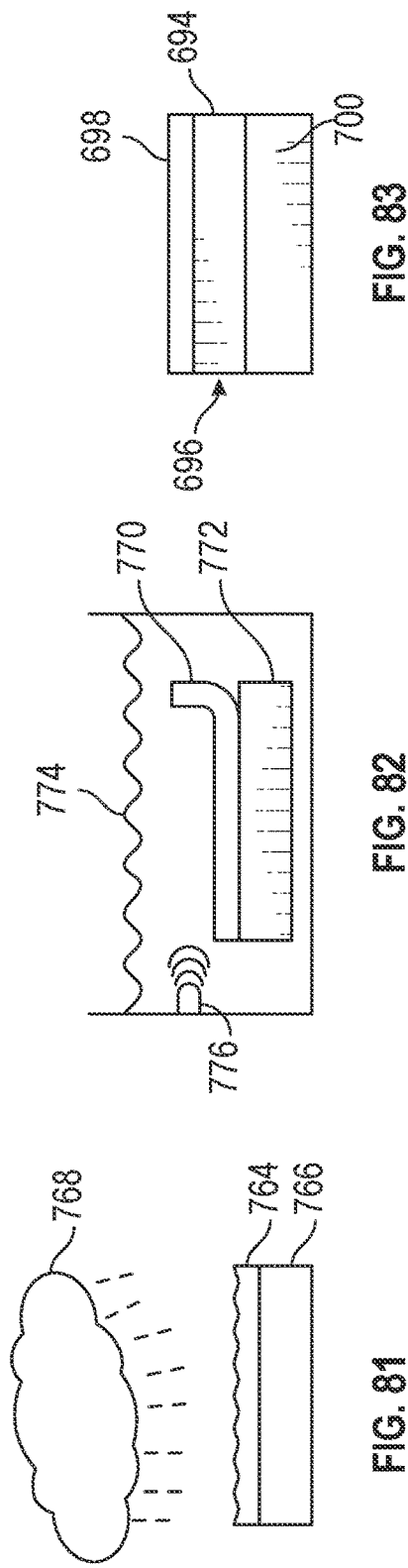
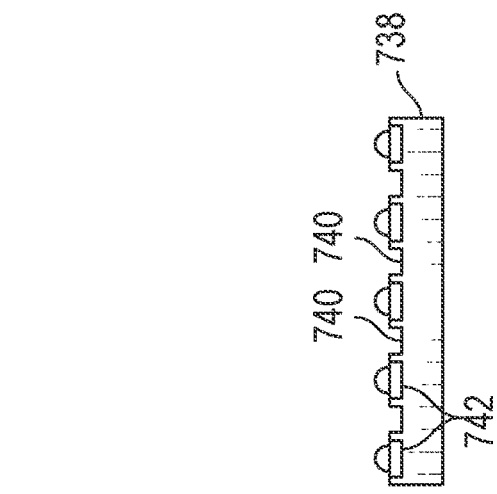
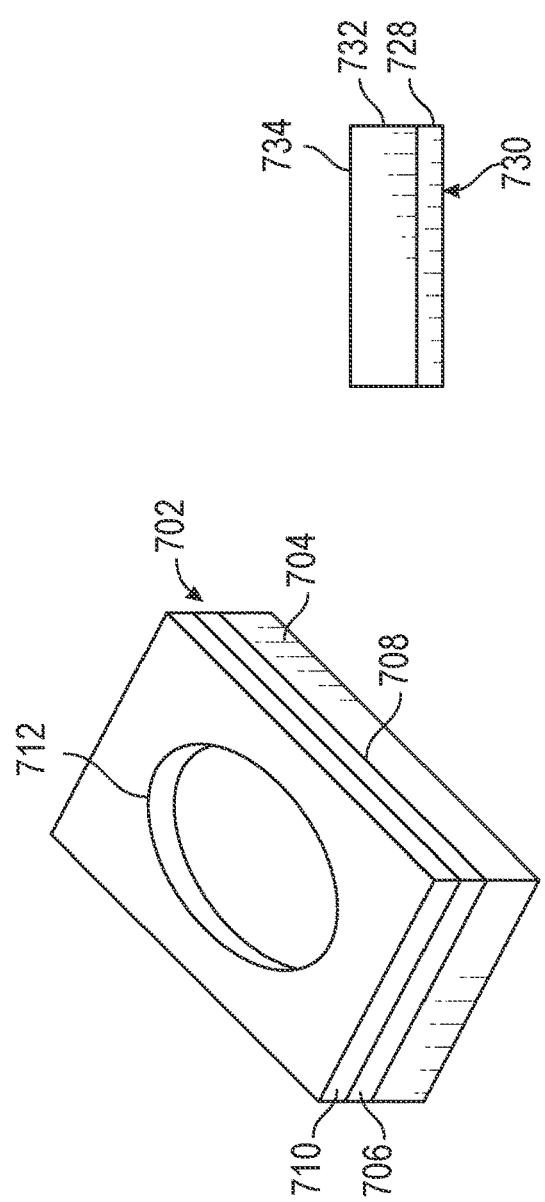

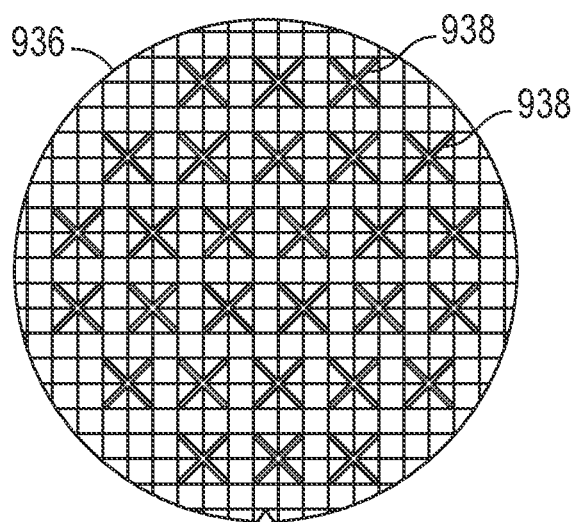
FIG. 102
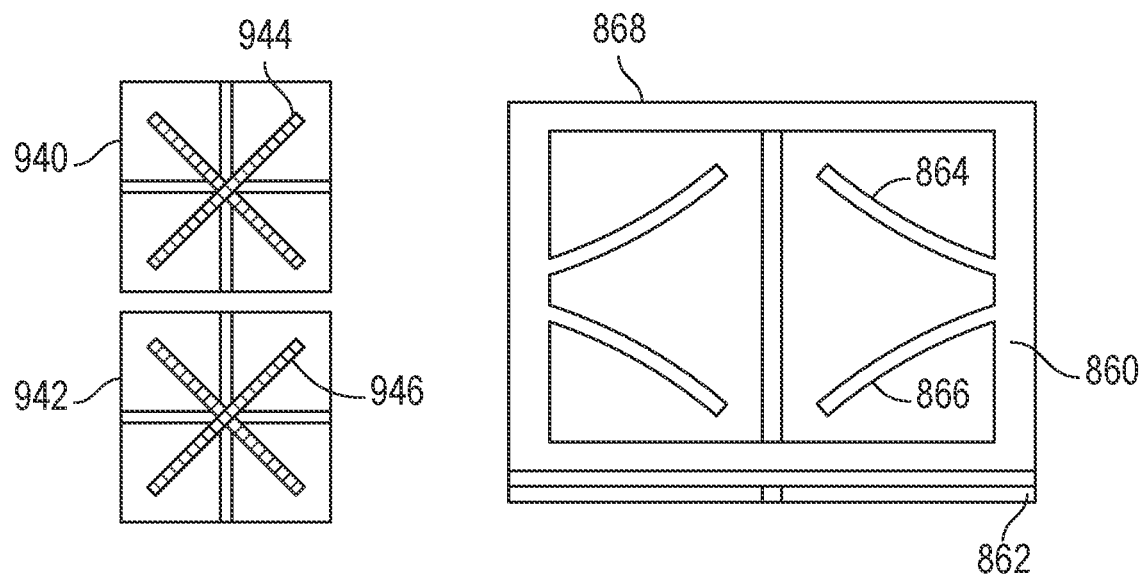
FIG. 103
FIG. 104

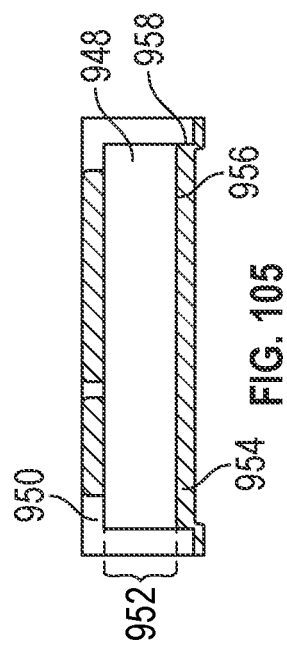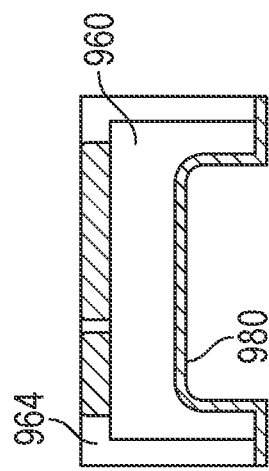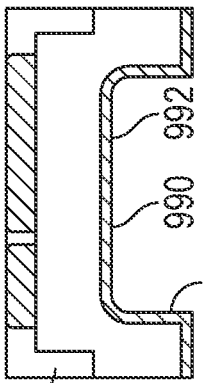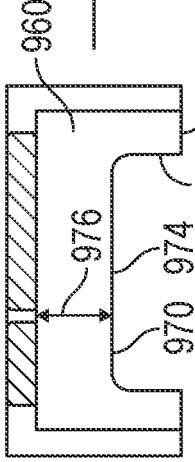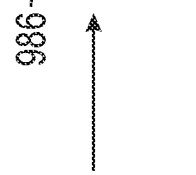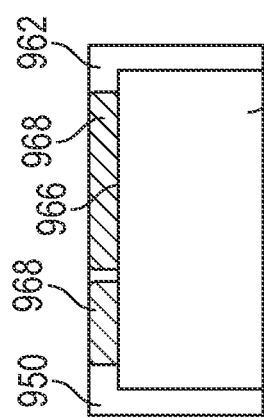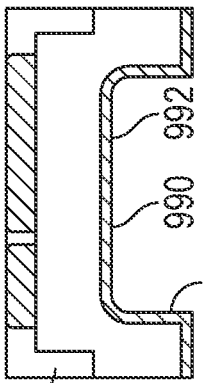

SEMICONDUCTOR PACKAGES WITH DIE INCLUDING CAVITIES

CROSS REFERENCE TO RELATED APPLICATIONS

This application is a continuation application of the earlier U.S. Utility patent application to Carney et al. entitled "Semiconductor Packages with Die Including Cavities and Related Methods," application Ser. No. 16/985,995, filed Aug. 5, 2020, now pending ('995 application); which '995 application is a continuation-in-part application of the earlier U.S. Utility patent application to Carney et al. entitled "Die Support Structures and Related Methods," application Ser. No. 16/861,740, filed Apr. 29, 2020, now pending ('740 application); which '740 application is a continuation-in-part application of the earlier U.S. Utility patent application to Eiji Kurose entitled "Multi-Faced Molded Semiconductor Package and Related Methods," application Ser. No. 16/702,958, filed Dec. 4, 2019, now pending; which application is a divisional application of the earlier U.S. Utility patent application to Eiji Kurose entitled "Multi-Faced Molded Semiconductor Package and Related Methods," application Ser. No. 15/679,661, filed Aug. 17, 2017, now U.S. Pat. No. 10,529,576, issued Jan. 7, 2020; which '740 application is also a continuation-in-part application of the earlier U.S. Utility patent application to Krishnan et al. entitled "Thin Semiconductor Package and Related Methods," application Ser. No. 16/395,822, filed Apr. 26, 2019, now pending; which application is a continuation of the earlier U.S. Utility patent application to Krishnan et al. entitled "Thin Semiconductor Package and Related Methods," application Ser. No. 15/679,664, filed Aug. 17, 2017, now U.S. Pat. No. 10,319,639, issued Jun. 11, 2019; the disclosures of each of which are hereby incorporated entirely herein by reference.

This application is also a continuation-in-part application of the earlier U.S. Utility patent application to Carney et al. entitled "Temporary Die Support Structures and Related Methods," application Ser. No. 16/862,063, filed Apr. 29, 2020, now pending, the disclosure of which is hereby incorporated entirely herein by reference.

This application is also a continuation-in-part application of the earlier U.S. Utility patent application to Seddon et al. entitled "Multidie Supports and Related Methods," application Ser. No. 16/862,120, filed Apr. 29, 2020, now pending, the disclosure of which is hereby incorporated entirely herein by reference.

This application is also a continuation-in-part application of the earlier U.S. Utility application to Seddon et al., entitled, "Through-Substrate Via Structure and Method of Manufacture," application Ser. No. 16/545,139, filed Aug. 20, 2019, now U.S. Pat. No. 10,950,534, issued on Mar. 16, 2021; which application is a divisional application of U.S. patent application to Seddon et al., entitled "Through-Substrate Via Structure and Method of Manufacture," application Ser. No. 16/101,259 filed on Aug. 10, 2018, now U.S. Pat. No. 10,446,480, issued Oct. 15, 2019; which application was a divisional of U.S. patent application to Seddon, et al., entitled, "Through-Substrate Via Structure and Method of Manufacture," application Ser. No. 15/244,737 filed on Aug. 23, 2016, now U.S. Pat. No. 10,079,199, issued on Sep. 18, 2018; which application claimed priority to U.S. Provisional Application to Seddon et al., entitled "Semiconductor Packages and Methods," application Ser. No. 62/219,666 filed on Sep. 17, 2015, the disclosures of each of which are hereby incorporated entirely herein by reference.

BACKGROUND

1. Technical Field

Aspects of this document relate generally to semiconductor packages, such as wafer scale or chip scale packages. More specific implementations involve packages including an encapsulating or mold compound.

2. Background

Semiconductor packages work to facilitate electrical and physical connections to an electrical die or electrical component in the package. A protective cover or molding has generally covered portions of the semiconductor packages to protect the electrical die or electrical component from, among other things, the environment, electrostatic discharge, and electrical surges.

SUMMARY

Implementations of a method of forming a semiconductor package may include forming a plurality of notches into the first side of a semiconductor substrate; forming an organic material over the first side of the semiconductor substrate and into the plurality of notches; forming a cavity into each of a plurality of semiconductor die included in the semiconductor substrate; applying a backmetal into the cavity in each of the plurality of semiconductor die included in the semiconductor substrate; and singulating the semiconductor substrate through the organic material into a plurality of semiconductor packages.

Implementations of a method of forming a semiconductor package may include one, all, or any of the following:

The method may include stress relief etching the second side of the semiconductor substrate.

The method may include thinning a second side of the semiconductor substrate opposite the first side one of to or into the plurality of notches prior to forming the cavity into each of the plurality of semiconductor die.

Forming the organic material over the first side of the semiconductor substrate further may include forming a permanent die support structure, a temporary die support structure, or any combination thereof.

The method may include filling the cavity of each semiconductor die with a conductive metal.

The method may include filling the cavity of each semiconductor die with a conductive metal that contacts only a largest planar surface of the cavity.

Implementations of a method of forming a semiconductor package may include forming a plurality of notches into the first side of a semiconductor substrate; forming an organic material over the first side of the semiconductor substrate and the plurality of notches; thinning a second side of the semiconductor substrate opposite the first side toward the plurality of notches to expose the organic material in the plurality of notches; forming a cavity into each of a plurality of semiconductor die included in the semiconductor substrate; applying a backmetal over the second side of the semiconductor substrate; and singulating the semiconductor substrate into a plurality of semiconductor packages.

Implementations of a method of forming a semiconductor package may include one, all, or any of the following:

The method may include stress relief etching the second side of the semiconductor substrate.

Forming the cavity into each of the plurality of semiconductor die further may include forming using etching.

Forming the organic material over the first side of the semiconductor substrate further may include forming a permanent die support structure, a temporary die support structure, or any combination thereof.

The method may include may include filling the cavity of each semiconductor die with a conductive metal.

The method may include filling the cavity of each semiconductor die with a conductive metal that contacts only a largest planar surface of the cavity.

The method may include forming a plurality of electrical connectors on the first side of the semiconductor substrate.

Implementations of a method of forming a semiconductor package may include forming an organic material over the first side of a semiconductor substrate and a plurality of notches in the semiconductor substrate; forming a cavity into each of a plurality of semiconductor die included in the semiconductor substrate; applying a backmetal into the cavity in each of the plurality of semiconductor die included in the semiconductor substrate; and singulating the semiconductor substrate into a plurality of semiconductor packages. The organic material may extend one of partially across a thickness of each of the plurality of semiconductor die or fully across the thickness of each of the plurality of semiconductor die.

Implementations of a method of forming a semiconductor package may include one, all, or any of the following:

The plurality of notches may be die streets between a plurality of die included on the semiconductor die.

The method may include thinning a second side of the semiconductor substrate opposite the first side toward the plurality of notches prior to forming the cavity into each of the plurality of semiconductor die.

Forming the organic material over the first side of the semiconductor substrate further may include forming a permanent die support structure, a temporary die support structure, or any combination thereof.

The method may include filling the cavity of each semiconductor die with a conductive metal.

The method may include filling the cavity of each semiconductor die with a conductive metal that contacts only a largest planar surface of the cavity.

The method may include forming a plurality of electrical connectors on the first side of the semiconductor substrate.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 1 is a cross sectional side view of a semiconductor package;

FIG. 2 is a top view of a semiconductor package;

FIG. 5 is a top view of a semiconductor wafer with a plurality of notches etched therein;

FIG. 6 is a top view of a second implementation of a semiconductor wafer with a plurality of notches etched therein;

FIG. 7 is a top view of a third implementations of a semiconductor wafer with a plurality of notches etched therein;

FIG. 11 illustrates a first alternative for forming the notches in the third process flow.

FIG. 12 illustrates a second alternative for forming the notches in the third process flow;

FIG. 13 illustrates a third alternative for forming the notches in the third process flow;

FIG. 14 illustrates a fourth alternative for forming the notches in the third process flow;

FIG. 37 is a perspective view of a thirteenth implementation of a permanent die support structure coupled with a thinned die showing a first portion of material and a second portion of material;

FIG. 38 is a perspective view of a fourteenth implementation of a permanent die support structure coupled with a thinned die showing first, second, third, and fourth portions of material;

FIG. 39 is a perspective view of a fifteenth implementation of a permanent die support structure coupled with a thinned die;

FIG. 40 is a perspective view of a sixteenth implementation of a permanent die support structure coupled with a thinned die;

FIG. 41 is a perspective view of a seventeenth implementation of a permanent die support structure coupled with a thinned die showing first, second, third, and fourth portions of material;

FIG. 42 is a perspective view of an eighteenth implementation of a permanent die support structure coupled with a thinned die showing first, second, third, and fourth portions of material;

FIG. 43 is a perspective view of a nineteenth implementation of a permanent die support structure coupled with a thinned die showing a first portion of material and a second portion of material;

FIG. 44 is a perspective view of an twentieth implementation of a permanent die support structure coupled with a thinned die showing first, second, and third portions of material;

FIG. 45 is a side cross-sectional view of an implementation of a permanent die support structure coupled with a thinned die;

FIG. 46 is a side cross-sectional view of an implementation of a permanent die support structure coupled with a thinned die;

FIG. 47 is a side view of an implementation of a semiconductor substrate with a molded permanent die support structure coupled following partial singulation;

FIG. 48 is a top view of a semiconductor substrate with a plurality of permanent die support structures coupled over a plurality of die formed therein;

FIG. 49 is a top view of a die of the plurality of die of FIG. 48 showing the permanent die support structure with a varying thickness across the die support structure;

FIG. 50 is a side view of the die of FIG. 49 showing the thickness of the die and the permanent die support structure;

FIG. 51 is a side view of a semiconductor substrate with a plurality of saw streets formed thereon;

FIG. 52 is a side view of a full-thickness (original thickness) semiconductor substrate with a plurality of die with a corresponding plurality of permanent die support structures coupled thereto;

FIG. 53 is a side view of a thinned semiconductor substrate with a plurality of die with a corresponding plurality of permanent die support structures coupled thereto applied after thinning;

FIG. 54 is a side view of a thinned semiconductor substrate with a plurality of die with a corresponding plurality of permanent die support structures coupled thereto applied after formation of backmetal;

FIG. 55 is a side view of a partially thinned semiconductor substrate with a plurality of die with a corresponding plurality of permanent die support structures coupled thereto after a partial grind has been performed;

FIG. 56 is a side view of a thinned semiconductor substrate with a plurality of die with a corresponding plurality of permanent die support structures coupled thereto after a full grind has been performed but before or after a stress relief etching process is carried out;

FIG. 57 is a perspective view of a semiconductor die;

FIG. 58 is a perspective view of an implementation of a temporary die support structure (temporary die support) coupled to a largest planar surface of a semiconductor die;

FIG. 59 a perspective view of another implementation of a second layer of temporary die support being coupled over a first layer;

FIG. 60 is a perspective view of an implementation of a temporary die support with two C- or U-shaped portions;

FIG. 61 is a perspective view of an implementation of a temporary die support with an X-shape;

FIG. 62 is a perspective view of an implementation of a temporary die support with a rod-shape;

FIG. 75 is a top view of a semiconductor substrate with a plurality of die thereon with a corresponding plurality of implementations of temporary die support structures coupled thereto;

FIG. 76 is a top view of an implementation of a temporary die support structure comprising two mirrored curved portions;

FIG. 77 is a side view of an implementation of a temporary die support structure with a varying thickness across the structure;

FIG. 78 is a side view of a semiconductor substrate prior to singulation with a plurality of die thereon following application of a plurality of temporary die supports thereon;

FIG. 79 is a side view of a semiconductor substrate following singulation and following application of a plurality of temporary die supports thereon;

FIG. 80 is a side view of an implementation of a temporary die support while being peeling from a semiconductor die after exposure to light;

FIG. 81 is a side view of an implementation of a temporary die support being etched from a semiconductor die by a plasma etching process;

FIG. 82 is a view of a liquid bath with an ultrasonic energy source therein along with an implementation of a temporary die support being peeled from a semiconductor die under the influence of the ultrasonic energy;

FIG. 83 is a side view of an implementation of a multilayer temporary die support;

FIG. 84 is a perspective view of an implementation of a temporary die support with a first layer with a second layer having an opening therein coupled over the first layer;

FIG. 85 is a side view of an implementation of a temporary die support having a thickness larger than a thickness of a semiconductor die;

FIG. 86 is a side view of an implementation of a semiconductor substrate with a plurality of die streets therein;

FIG. 102 is a top view of a semiconductor substrate with a plurality of die with a plurality of X-shaped die support structures applied over adjacent groups of 4 die;

FIG. 103 is a top view of two adjacent groups of 4 die with an X-shaped die support structure applied over each;

FIG. 104 is a top view of a die support comprising multiple curved portions coupled over two semiconductor die;

FIG. 105 is a side cross sectional view of an implementation of a thinned die with organic material extending across a thickness of the die;

FIG. 106 is a side cross sectional view of an implementation of a thinned die with organic material extending into a plurality of notches;

FIG. 107 is a side cross sectional view of the implementation of the thinned die of FIG. 106 with a cavity formed therein;

FIG. 108 is a side cross sectional view of an implementation of the thinned die of FIG. 107 with a backmetal formed into the cavity;

FIG. 109 is a side cross sectional view of an implementation of a thinned die with organic material extending partially across a thickness of a die into a plurality of notches;

FIG. 110 is a side cross sectional view of an implementation of the thinned die of FIG. 109 with a cavity formed therein;

FIG. 111 is a side cross sectional view of an implementation of the thinned die of FIG. 110 with a backmetal formed into the cavity;

FIG. 119 illustrates an enlarged partial cross-sectional view of the through-substrate via structure of FIG. 117 after further processing;

FIG. 120 illustrates an enlarged partial cross-sectional view of the through-substrate via structure of FIG. 117 after still further processing;

FIG. 121 illustrates an enlarged partial cross-sectional view of through-substrate via structures in accordance with additional implementations of semiconductor packages; and FIG. 122 illustrates an enlarged partial cross-sectional view of through-substrate via structures in accordance with further implementations of semiconductor packages.

DESCRIPTION

Figure 3:
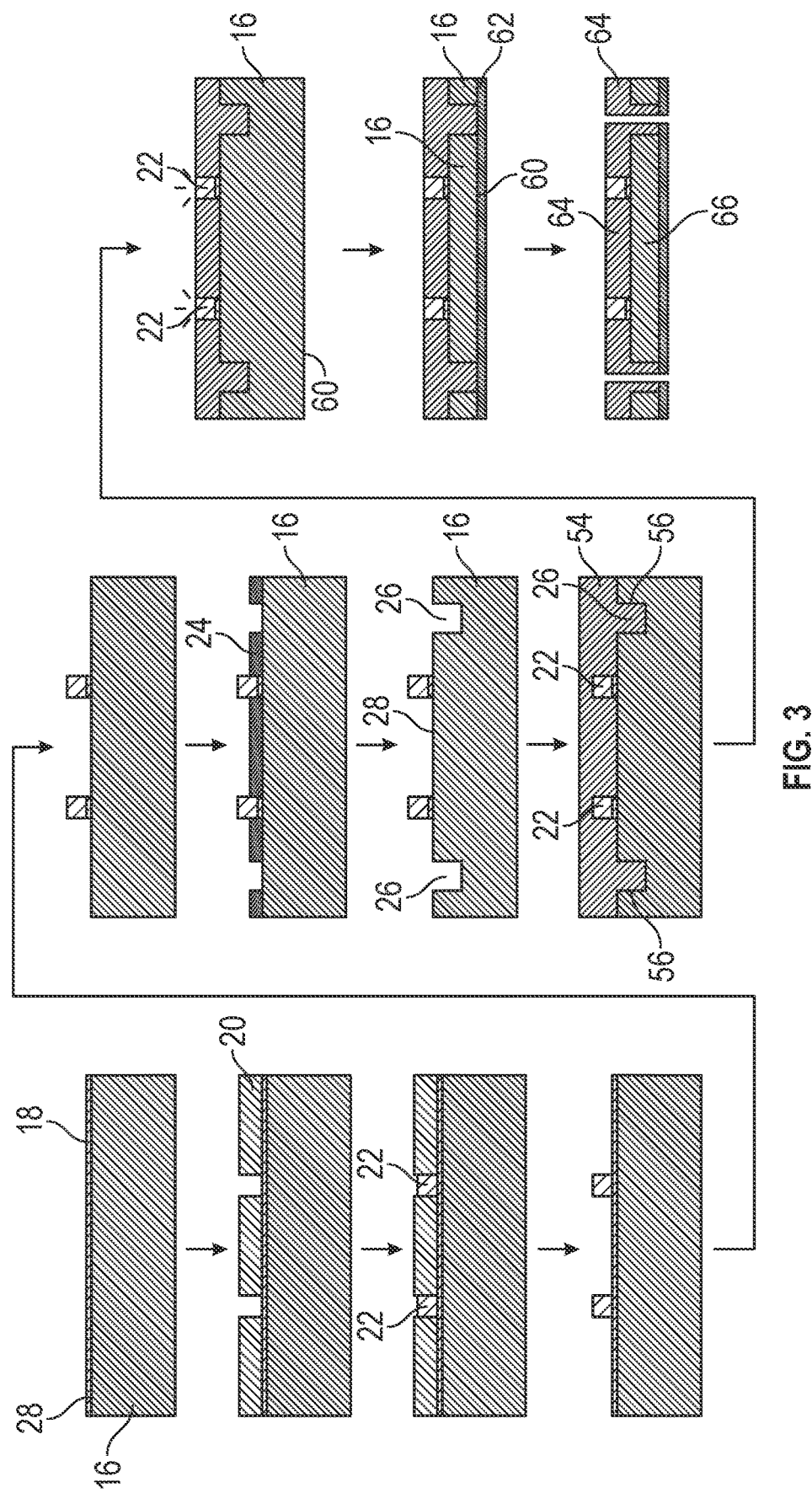
FIG. 3 is a first process flow illustrating the formation of a semiconductor package.

This disclosure, its aspects and implementations, are not limited to the specific components, assembly procedures or method elements disclosed herein. Many additional components, assembly procedures and/or method elements known in the art consistent with the intended die support structures and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such die support structures, and implementing components and methods, consistent with the intended operation and methods.

Referring to FIG. 1, a cross sectional side view of a semiconductor package is illustrated. The semiconductor package includes a die 2 which includes a first side 4, a second side 6, a third side 8 opposite the second side 6, a fourth side, a fifth side opposite the fourth side (both fourth and fifth sides are located into and out of the drawing surface in this view), and a sixth side 10 opposite the first side 4. In various implementations, the second side 6 of the die 2, the third side 8 of the die, the fourth side of the die, and/or the fifth side of the die may include a notch therein.

In various implementations, one or more electrical contacts 12 are coupled to the first side 4 of the die 2. In various implementations, the electrical contacts are metal and may be, by non-limiting example, copper, silver, gold, nickel, titanium, aluminum, any combination or alloy thereof, or another metal. In still other implementations, the electrical contacts 12 may not be metallic but may rather be another electrically conductive material.

In various implementations, a first mold compound 14 covers the first, second, third, fourth, and fifth sides of the die. In various implementations, the mold compound may be, by non-limiting example, an epoxy mold compound, an acrylic molding compound, or another type of material capable of physically supporting the die and providing protection against ingress of contaminants. In various implementations, a laminate resin or second mold compound covers the sixth side 10 of the die.

The electrical contacts 12 each extend through a corresponding plurality of openings in the first mold compound 14. In various implementations, the electrical contacts 12 extend beyond the surface of the molding 14, as illustrated in FIG. 1, while in other implementations the electrical contacts are level or flush with the surface of the molding compound 14.

In various implementations, the sides of the die will have no chips or cracks, particularly on the semiconductor device side of the die. This is accomplished through forming the second, third, fourth, and fifth sides of each die using etching techniques rather than a conventional sawing technique. Such a method is more fully disclosed is association with the discussion of FIG. 3 herein.

Further, the first mold compound may be anchored to the second, third, fourth, and fifth sides of the die. In various implementations, the anchor effect is the result of interaction of the mold compound with a plurality of ridges formed along the second, third, fourth, and fifth sides of the die. This anchoring effect is more fully disclose in association with the discussion of FIG. 3 herein.

Referring to FIG. 2, a top view of a semiconductor package is illustrated. The molding compound 14 is clearly seen in FIG. 2 encompassing a perimeter of each electrical contact 12 (the shaded areas in FIG. 2) so that the entire first side of the die (along with every other side) is not exposed.

Referring to FIG. 3, a first process flow illustrating the formation of a semiconductor package is illustrated. In various implementations, the method for making a semiconductor package includes providing a wafer 16 which may include any particular type of substrate material, including, by non-limiting example, silicon, sapphire, ruby, gallium arsenide, glass, or any other semiconductor wafer substrate type. In various implementations, a metal layer 18 is formed on a first side 28 of the wafer 16 and may be formed using a sputtering technique. In other implementations, the metal layer 18 is formed using other techniques, such as, by non-limiting example, electroplating, electroless plating, chemical vapor deposition, and other methods of depositing a metal layer. In a particular implementation, the metal layer is a titanium/copper seed layer, while in other implementations, the metal layer may include, by non-limiting example, copper, titanium, gold, nickel, aluminum, silver, or any combination or alloy thereof.

In various implementations, a first photoresist layer 20 is formed and patterned over the metal layer 18. One or more electrical contacts 22 may be formed on the metal layer 18 and within the photoresist layer 20. In various implementations this may be done using various electroplating or electroless plating techniques, though deposition and etching techniques could be employed in various implementations. The electrical contacts 22 may be any type of electrical contact previously disclosed herein (bumps, studs, and so forth). In various implementations, the first photoresist layer 20 is removed through an ashing or solvent dissolution process and the metal layer 18 may be etched away after the electrical contacts are formed.

Figure 9:
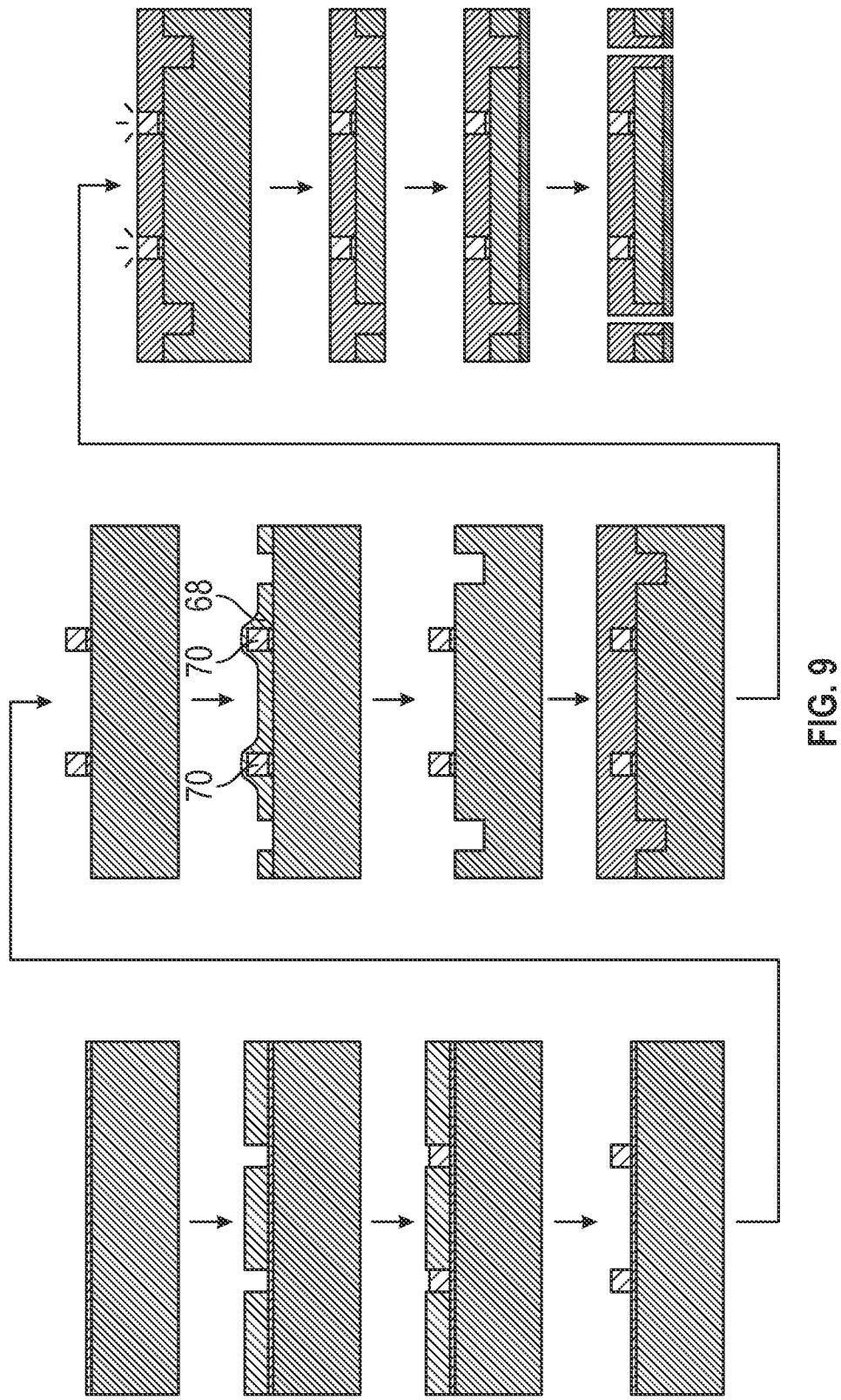
FIG. 9 is a second process flow illustrating the formation of a semiconductor package.

In various implementations, a second photoresist layer 24 is formed and patterned over the wafer 16. In various implementations, as illustrated in FIG. 3, the second patterned photoresist layer 24 does not cover the electrical contacts 22. In other implementations, the second photoresist layer is formed conformally over the electrical contacts along with the wafer. Referring to FIG. 9, a second process flow illustrating the formation of a semiconductor package is illustrated. In this process flow, a second photoresist layer 68 is formed as a conformal layer over the electrical contacts 70. Aside from this difference, the process depicted in FIG. 9 includes the same process steps as the process depicted in FIG. 3.

Referring back to FIG. 3, in various implementations, the method includes etching a plurality of notches 26 into the first side 28 of the wafer 16 using the second patterned photoresist layer. In various implementations, the width of the notches may be between about 50 and about 150 microns wide while in other implementations, the width of the notches may be less than about 50 microns or more than about 150 microns. In various implementations, the depth of the plurality of notches 26 may extend between about 25 and 200 microns into the wafer while in other implementations, the depth of the plurality of notches 26 may be less than about 25 microns or more than about 200 microns.

In various implementations, the plurality of notches may be formed using, by non-limiting example, plasma etching, deep-reactive ion etching, or wet chemical etching. In various implementations, a process marketed under the tradename BOSCH® by Robert Bosch GmbH, Stuttgart Germany (the "Bosch process"), may be used to form the plurality of notches 26 in the first side 28 of the wafer 16.

Figure 4:
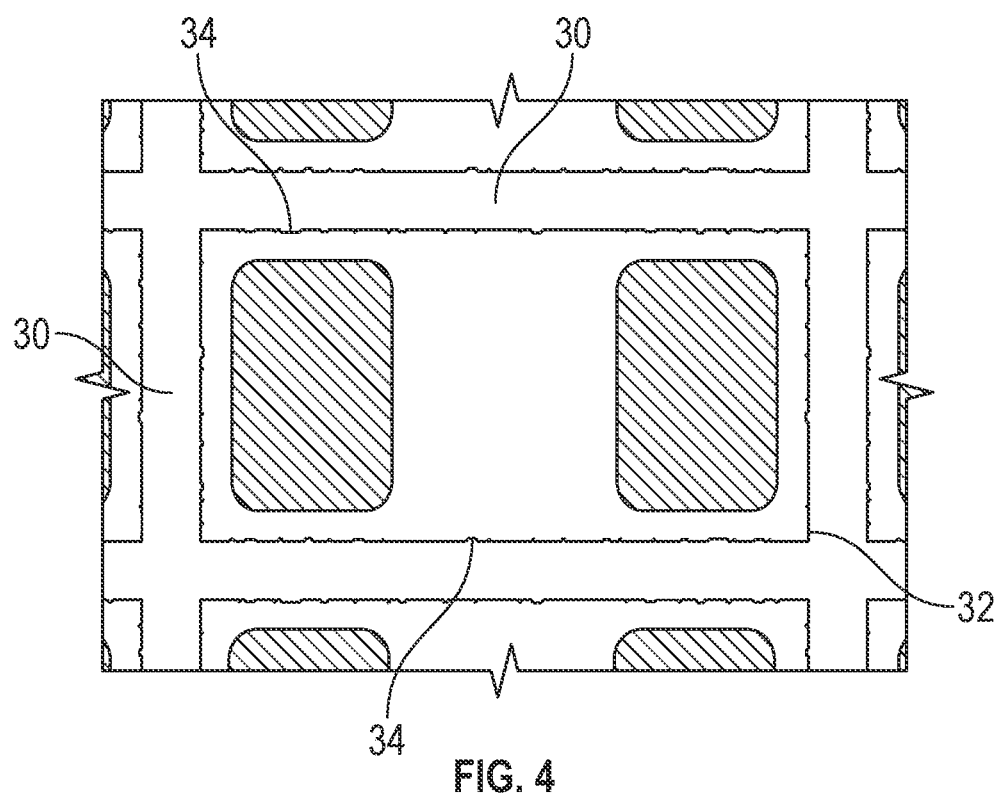
FIG. 4 is a top view of a semiconductor wafer with a plurality of notches cut therein.

Referring now to FIG. 4, a top view of a conventional semiconductor wafer with a plurality of saw cuts surrounding the plurality of die is illustrated. Using a saw to cut notches in a semiconductor wafer invariably results in the production of chips and cracks on the device side of the die and in the sidewalls 34 of the notches 30. The presence of the cracks and chips has the potential to compromise the reliability of the semiconductor package if the cracks and chips propagate into the device portion of the semiconductor die. Since the saw process involves the rubbing of the rotating blade against the die surface, the chipping and cracking can only be managed through saw processing variables (wafer feed speed, blade kerf width, cut depth, multiple saw cuts, blade materials, etc.) but not eliminated. Furthermore, because the saw process relies on passing the wafer underneath the blades, only square and rectangular sized die are typically produced using conventional saw techniques.

Referring to FIG. 5, a top view of a semiconductor wafer with a plurality of notches etched therein is illustrated. In contrast to the appearance of the die processed using the conventional sawing method illustrated in FIG. 4, the plurality of notches 36 in the wafer 38 formed using etching techniques have edges and sidewalls 40 that do not exhibit cracks or chips therein. Because of the absence of the cracks and chips, the use of etching techniques to form a plurality of notches in a semiconductor wafer is likely to improve the reliability of the resulting semiconductor packages.

Furthermore, using etching techniques to form a plurality of notches in a wafer allows for different shapes of perimeters of die to be produced. In various implementations, the second photoresist layer described in relation to FIG. 3 may be patterned in a way to form a plurality of notches that do not form die with rectangular perimeters. For example, referring to FIG. 6, a top view of a second implementation of a semiconductor wafer with a plurality of notches etched therein is illustrated. In various implementations, a plurality of notches 42 may be formed in a wafer 44. The plurality of notches 42 may form eventual die 46 with perimeters that are octagons. Referring to FIG. 7, a top view of a third implementations of a semiconductor wafer with a plurality of notches etched therein is illustrated. In various implementations, a plurality of notches 48 may be formed in a wafer 50. The plurality of notches 48 may form eventual die 52 with perimeters that are rounded rectangles. In other implementations, a plurality of notches may be formed in a wafer that form eventual die with perimeters that are any other closed geometrical shape.

Referring back to FIG. 3, in various implementations, the plurality of notches 26 formed have two substantially parallel sidewalls that extend substantially straight into the first side 28 of the wafer 16. In other implementations, two or more stepwise notches are formed in the first side 28 of the wafer 16. Each stepwise notch may be formed by creating a first notch in the wafer, and then forming a second narrower notch within each first notch.

Referring to FIG. 3, an implementation of a method for forming a semiconductor package includes applying a first mold compound 54 into the plurality of notches 26 and over the first side of the wafer. In various implementations, as illustrated by FIG. 3, the first mold compound 54 may cover the electrical contacts 22. In other implementations, the first mold compound 54 may not completely cover the electrical contacts 22. The first mold compound may be applied using, by non-limiting example, a liquid dispensing technique, a transfer molding technique, a printer molding technique, or a compression molding technique. The molding compound may be an epoxy molding compound, an acrylic molding compound, or another type of molding compound disclosed herein.

Figure 8:
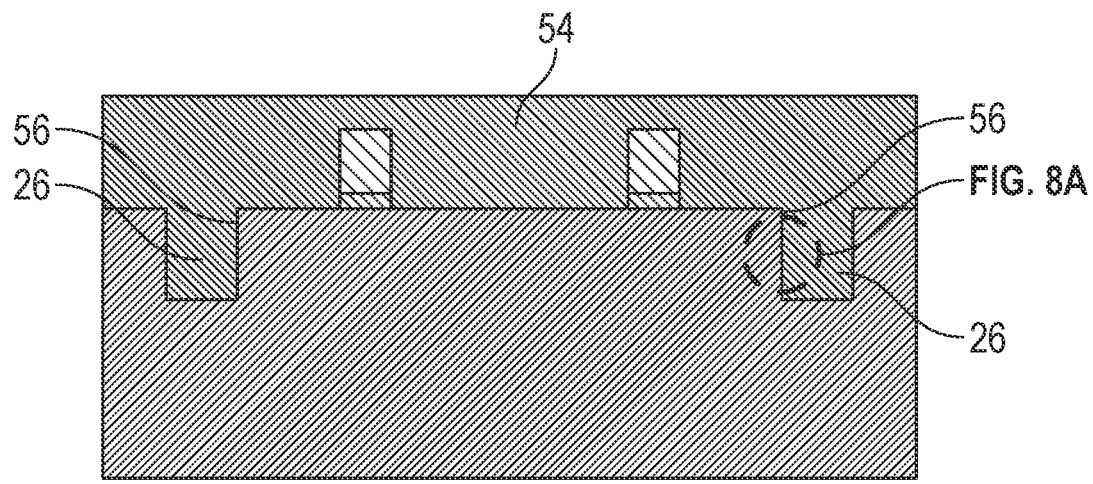
FIG. 8 is a cross sectional view of a portion of a wafer with molding applied thereto.
Figure 8A:
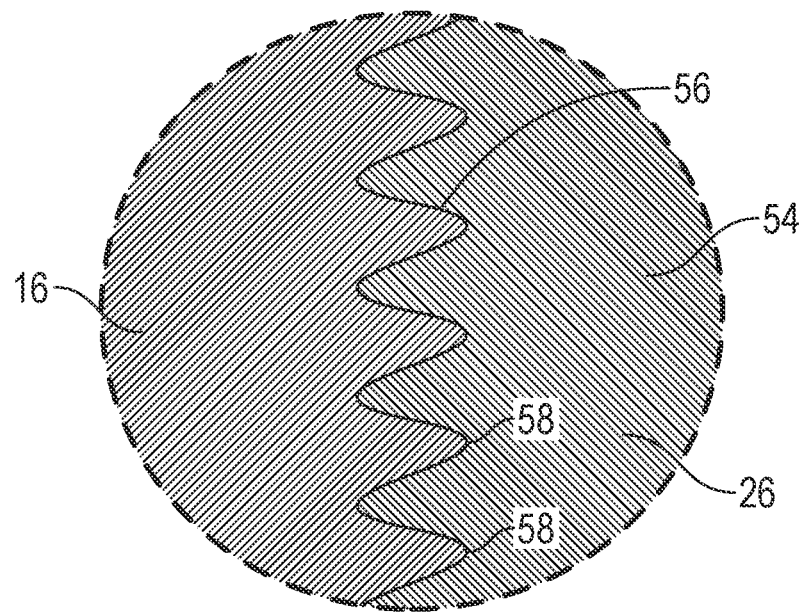
FIG. 8A is a magnified cross sectional view of the bond between a mold and a sidewall of a notch formed in the die.

In various implementations, the first mold compound 54 may be anchored to a plurality of sidewalls 56 of a plurality of notches 26. Referring now to FIG. 8, a cross sectional view of a portion of a wafer with molding applied thereto is illustrated. Referring now to FIG. 8A, a magnified cross sectional view of the bond between a mold and a sidewall of a notch formed in the die is illustrated. In various implementations, a plurality of ridges 58 may be formed in a sidewall 56 of each notch within the plurality of notches. In a particular implementation, the height of each ridge extending from the sidewall is substantially 0.2 microns tall with a pitch of substantially one micron. Thus, in implementations where the notch is 150 microns deep, there may be substantially 150 microns on each sidewall of the notch. In other implementations, the notches may be taller or shorter than 0.2 microns and may have a pitch more or less than one micron. The ridges may anchor the first mold compound 54 to the sidewalls 56 of the plurality of notches. In various implementations where the plurality of notches are etched using the Bosch process, the etching process may form ridges in the plurality of notches while etching the plurality of notches via the deposition/etching cycles of the deep reactive ion etch, thus increasing the adhesion between the first mold compound and the sidewall of each notch.

Referring back to FIG. 3, in various implementations where the first mold compound 54 covers the electrical contacts 22, the electrical contacts 22 may be exposed by grinding the first mold compound. In various implementations, a second side 60 of the wafer 16 may be ground to the plurality of notches 26 formed in the first side 28 of the wafer 16. In this way the various die of the semiconductor wafer are singulated from each other. In various implementations, the second side 60 of the wafer 16 may be ground using, by non-limiting example, a mechanical polishing technique, a chemical etching technique, a combination of a mechanical polishing and chemical etching technique, or any other grinding technique.

In various implementations, a second mold compound 62 or a laminate resin may be applied to the second side 60 of the wafer 16. In implementations where a second mold compound is applied, the mold compound may be any type of mold compound disclosed herein and may be applied using any technique disclosed herein.

In various implementations, as illustrated in the process flow depicted in FIG. 3, the first mold compound 54 is ground to expose the electrical contacts 22 before the second side 60 of the wafer 16 is ground and the second mold compound is applied. In other implementations, the first mold compound 54 may be ground to expose the electrical contacts 22 after the second side 60 of the wafer 16 is ground and the second mold compound is applied.

The method for making a semiconductor package includes singulating the wafer 16 into a plurality of semiconductor packages 64. The wafer 16 may be singulated by cutting or etching through the wafer where the plurality of notches 26 were originally formed. The wafer may be singulated by using, by non-limiting example, a saw, a laser, a waterjet, plasma etching, deep reactive-ion etching, or chemical etching. In various implementations, the Bosch process may be used to singulate the wafer 16. The method used to singulate the wafer may include singulating the wafer using thinner cuts or etches than were used to form the plurality of notches 26. In this manner, the first mold compound will cover the sides of each singulated die 66 within each semiconductor package 64. Specifically, in particular implementations the saw width used to singulate each semiconductor package may be between 20 and 40 microns thick. The semiconductor die within the semiconductor package may be covered by either a mold compound or a laminate resin on all six sides of the semiconductor die.

In various implementations, the first side of the die within each semiconductor package may include a perimeter that is, by non-limiting example, a rectangle, an octagon, a rectangle with rounded edges, or any other closed geometric shape.

Figure 10:
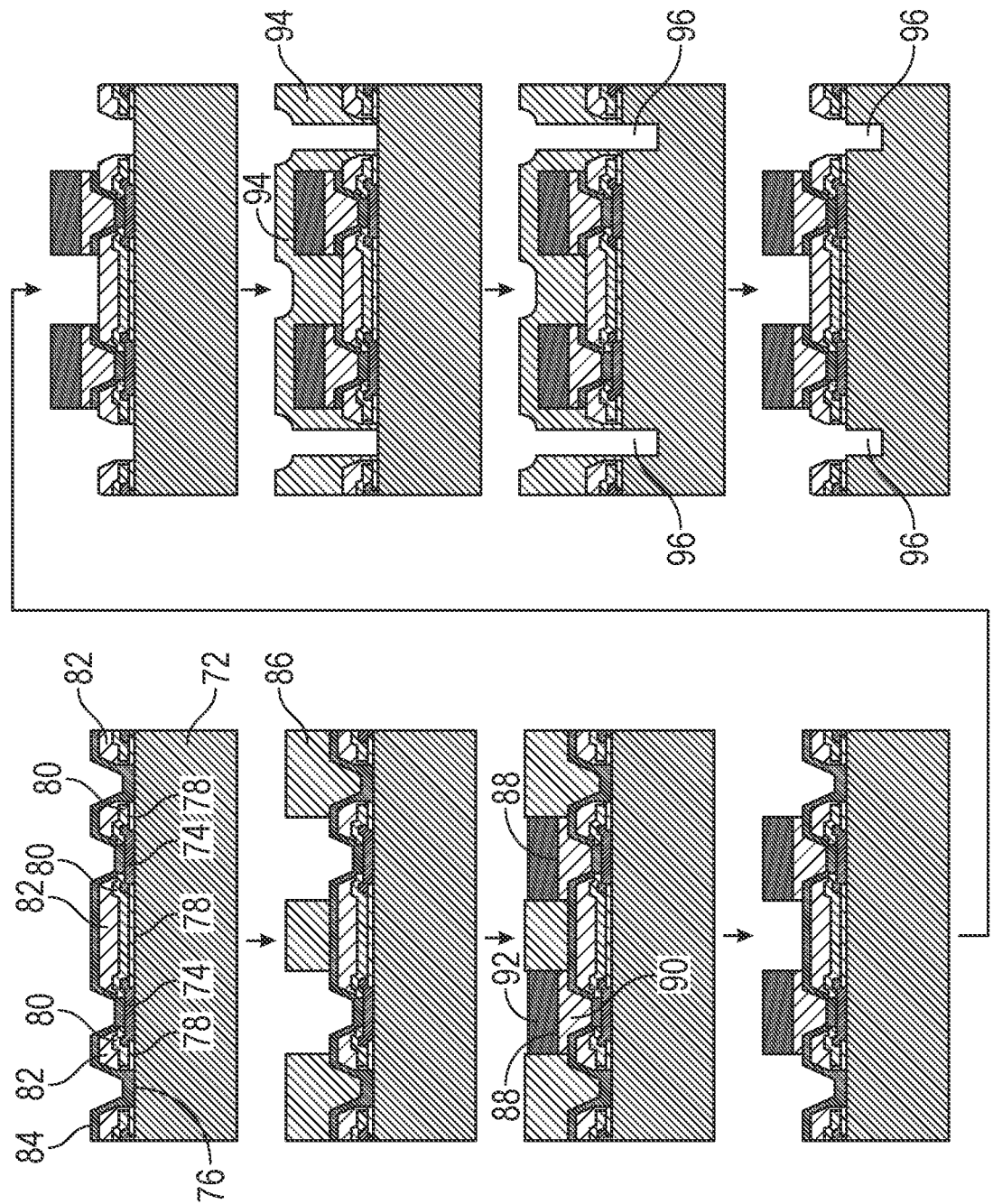
FIG. 10 is a third process flow illustrating a portion of the formation of a semiconductor package.

Referring now to FIG. 10, a third process flow illustrating a portion of the formation of a semiconductor package is illustrated. In various implementations the method for forming a semiconductor package includes providing a wafer 72, which may be any type of wafer substrate disclosed herein. In various implementations, one or more metal pads 74 may be coupled to a first side 76 of the wafer 72. The metal pad may include, by non-limiting example, aluminum, copper, nickel silver, gold, titanium, or any combination or alloy thereof.

In various implementations, a first passivation layer 78 may be coupled to a portion of the first side 76 of the wafer 72. The first passivation layer 78 may be a silicon dioxide passivation layer in various implementations, though it could be any of a wide variety of other types of layers, including, by non-limiting example, silicon nitride, polyimide, or another polymer or deposited material. In various implementations, a second passivation layer 80 may be coupled to a portion of the first side 76 of the wafer 72. The second passivation layer 80 may be a silicon nitride passivation layer. The second passivation layer may include the same material or a different material from the first passivation layer.

In various implementations, a third layer 82 may be coupled to a portion of the first side 76 of the wafer 72. The third layer may be either a polyimide, a polybenzoxazole, a phenol resin, or a combination of a polyimide, a polybenzoxazole, and a phenol resin. In various implementations, a metal seed layer 84 may be formed over the third layer and over the first side 76 of the wafer 72. The metal seed layer 84 may be any type of metal layer disclosed herein. In various implementations, the metal seed layer 84 may directly contact portions of the first side 76 of the wafer 72. In various implementations, the method includes forming and patterning a first photoresist layer 86 over the metal seed layer 84.

In various implementations, the method includes forming electrical contacts 88 coupled to the metal seed layer 84 and within the first photoresist layer 86. The electrical contacts 88 may be any type of electrical contact disclosed herein. In various implementations, the electrical contacts 88 may include a first layer 90 and a second layer 92. In various implementations, the first layer 90 may include copper and the second layer 92 may include tin, silver, or a combination of tin and silver. In various implementations, the method of forming a semiconductor package includes removing the first photoresist layer 86 and etching the portions of the metal seed layer 84 away that are not covered by the electrical contacts, after the electrical contacts are formed.

In various implementations, the method of forming a semiconductor package includes forming and patterning a second photoresist layer 94 over the first side 76 of the wafer 72. In various implementations, the second photoresist layer covers the electrical contacts 88, while in other implementations, the second photoresist layer 94 does not cover the electrical contacts 88. The second photoresist layer 94 may be used to etch a plurality of notches 96 into the wafer 72. The method includes removing the second photoresist layer 94 after the plurality of notches are etched into the wafer.

A first mold compound may be applied into the plurality of notches and over the first side 76 of the wafer 72 in the same manner the first mold compound in FIG. 3 is applied. The remainder of the method for forming a semiconductor package as depicted in FIG. 10 may include exposing the electrical contacts through grinding, grinding the backside of the wafer to the plurality of notches, applying a second mold compound or laminate resin to a backside of the wafer, and singulating the wafer into a plurality of semiconductor packages. These portions of forming a semiconductor package may be the same as or similar to respective portions for forming a semiconductor package illustrated by FIG. 3 and previously disclosed herein.

In various implementations, the semiconductor package produced by the method depicted in FIG. 10 may include one or more metal pads, one or more passivation layers, a polyimide, a phenol resin, a polybenzoxazole, and any combination thereof, between the semiconductor die and the first mold compound.

Referring to FIGS. 11-14, alternative methods for forming a plurality of notches in the process illustrated by FIG. 10 is illustrated. Referring to FIG. 11, a method of forming a plurality of notches using a patterned photoresist layer and one of a polyimide, polybenzoxazole, and a phenol resin in combination with an etching process is illustrated. In various implementations, a patterned photoresist layer 98 may be over a mask 100 including either a patterned polyimide layer, a patterned polybenzoxazole layer, or a patterned phenol resin layer. The mask 100 may be over a wafer 102. A notch 104 may be formed in the wafer 102 using the patterned photoresist layer and the mask using any etching process disclosed herein.

Referring to FIG. 12, a method of forming a plurality of notches using one of a polyimide, polybenzoxazole, and a phenol resin in combination with any etching process disclosed herein is illustrated. The method may be the same as the method depicted by FIG. 11, with the difference being that the method depicted by FIG. 12 does not include a patterned photoresist layer used to form a notch 106 into a wafer 108.

Referring to FIG. 13, a method of forming a plurality of notches using a patterned photoresist layer and passivation mask is illustrated. In various implementations, a patterned photoresist layer 110 may be over a passivation mask 112.

The passivation mask 112 may include any passivation layer disclosed herein. The passivation mask 112 may be over a wafer 114. A notch 116 may be formed in the wafer 114 using the patterned photoresist layer 110 and the passivation mask 112 and any etching process disclosed herein.

Referring to FIG. 14, a method of forming a plurality of notches using a passivation mask in combination with any of the etching method disclosed herein is illustrated. The method may be the same as the method depicted by FIG. 13, with the difference being that the method depicted by FIG. 14 does not include a patterned photoresist layer used to form a notch 116 into a wafer 118.

Figure 15:
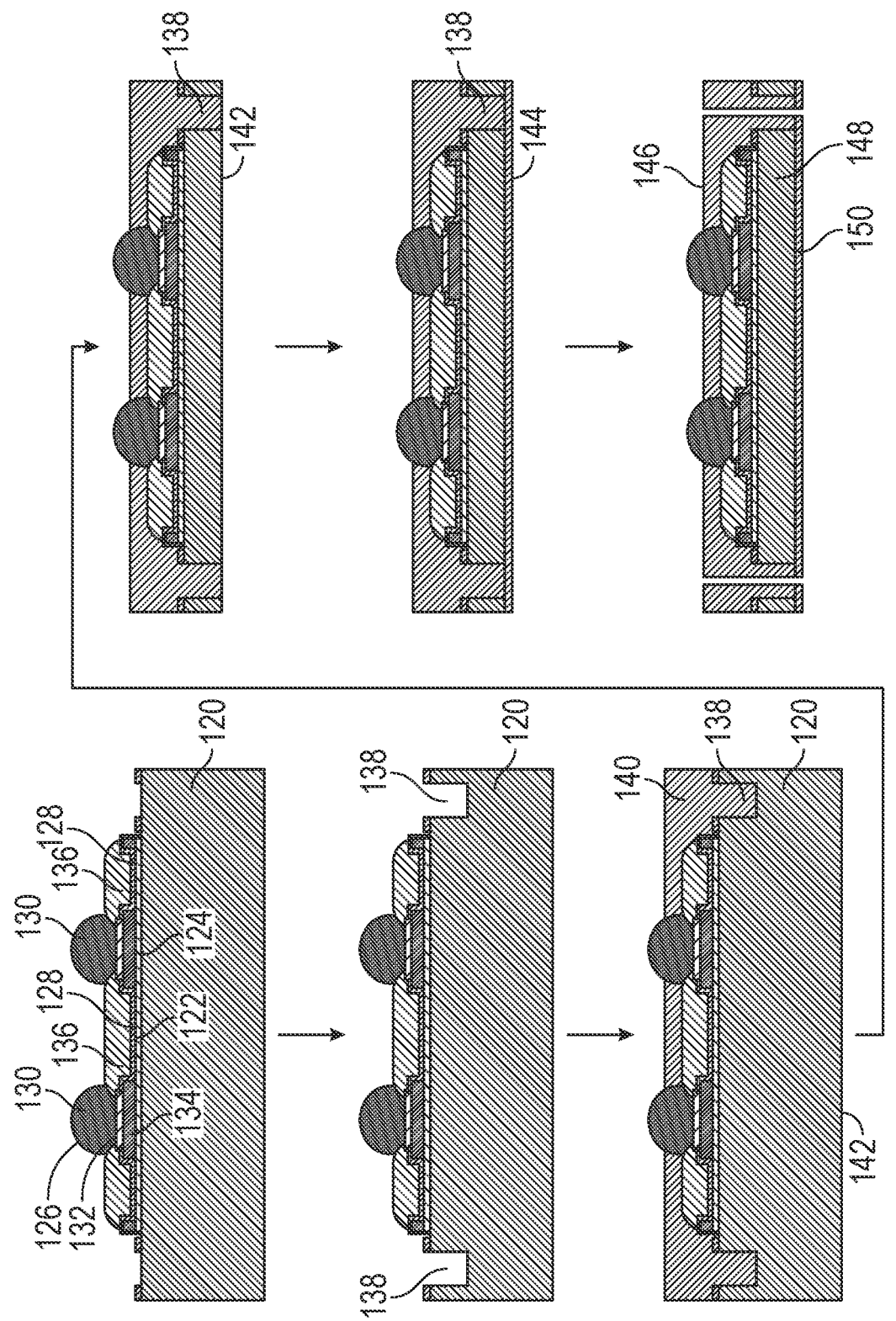
FIG. 15 is a fourth process flow illustrating the formation of a semiconductor package.

Referring to FIG. 15, a fourth process flow illustrating the formation of a semiconductor package is illustrated. The method for forming a semiconductor package illustrated in FIG. 15 includes providing a wafer 120. In various implementations, an interlayer 122 may be coupled to a first side 124 of the wafer 120. In various implementations, a passivation layer 128 may be coupled to the wafer 120. The passivation layer may be any type of passivation layer disclosed herein.

In various implementations, one or more electrical contacts 126 may be coupled to the wafer 120. In various implementations, the electrical contacts include a bump 130. The electrical contacts may include a first metal layer 132 coupled to the bump 130. The first metal layer may include any metal disclosed herein. In a particular implementation, the first metal layer includes nickel and gold. The electrical contacts 128 may include a second metal layer 134 coupled to the first metal layer 132. The second metal layer 134 may include any metal disclosed herein. In a particular implementation, the second metal layer 134 includes aluminum. In various implementations, a solder resist layer 136 may be coupled over the wafer 120. In other implementations, no solder resist layer is included.

In various implementations, the passivation layer 128 may be patterned and may directly contact portions of the wafer 120. In such implementations, the patterned passivation layer, or mask, may be used to etch a plurality of notches 138 into the first side 124 of the wafer 120 using any etching process disclosed herein. The plurality of notches may be etched using any method disclosed herein, and may be any type of notch previously disclosed herein.

In various implementations, a first mold compound 140 is applied into the plurality of notches 138 and over the first wafer 120. The first mold compound 140 may be any mold compound disclosed herein and may be applied using any technique disclosed herein. In various implementations, the first mold compound 140 does not entirely cover the electrical contacts 126, as is illustrated by FIG. 15. In other implementations, the first mold compound does entirely cover the electrical contacts 126. In implementations where the first mold compound 140 does entirely cover the electrical contacts 126, the first mold compound may be ground to expose the electrical contacts 126.

In various implementations, a second side 142 opposite the first side 124 of the wafer 120 may be ground using any grinding method disclosed herein to the plurality of notches. A second mold compound 144 or laminate resin may then be applied to the second side 142 of the wafer 120.

The wafer 120 may then be singulated into a plurality of semiconductor packages 146. The wafer may be singulated using any technique disclosed herein. The semiconductor die 148 with the semiconductor package 146 may have all six sides covered by a mold compound. In other implementations, the sixth side of the die 150 may be covered by a laminate resin.

In various implementations, the semiconductor package formed by the method illustrated in FIG. 15 may include either a solder resist layer, a passivation layer, an interlayer, or a combination of a solder resist layer, a passivation layer, and an interlayer coupled to the first side of the wafer and covered by the first mold compound.

Figure 16:
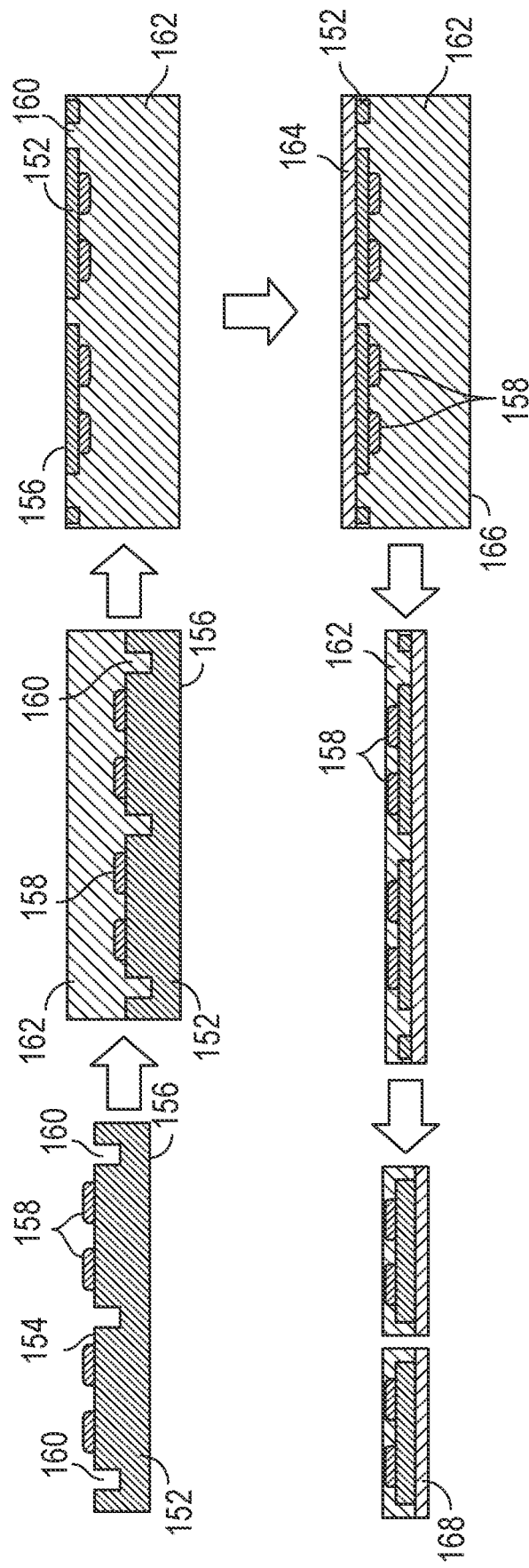
FIG. 16 is an illustration of a process flow for forming an ultra-thin semiconductor package.

Referring to FIG. 16, a process flow for forming an ultra-thin semiconductor package is illustrated. As used herein, an "ultra-thin" semiconductor package is designed to handle a device die of about 25 microns in thickness or thinner. The process flow illustrates cross sectional side views of the wafer and die. In various implementations, a method for forming an ultra-thin semiconductor package includes providing a wafer 152 with a first side 154 and a second side 156. The wafer 152 may include a substrate material which may be, by non-limiting example, silicon, gallium nitride, silicon carbide, or another wafer substrate material. The first side of the wafer 154 includes or is coupled to a plurality of electrical contacts 158. The electrical contacts 158 may be metallic or made of another material that is electrically conductive.

In various implementations, the method for forming the ultra-thin semiconductor package includes forming a plurality of notches 160 in the first side 154 of the wafer 152. While not shown in FIG. 16, it is understood that the plurality of notches intersect one another in a substantially perpendicular direction across the first side 154 of the wafer 152. In various implementations, the notches formed may extend about 25 or more microns deep into the wafer. In other implementations, the notches 160 only extend between about 10 and about 25 microns deep in the wafer 152. In still other implementations, the notches 160 extend less than about 10 microns deep in the wafer 152. The plurality of notches may be formed using, by non-limiting example, a saw, a laser, a waterjet, plasma etching, or chemical etching. In various implementations, a chemical etching process marketed under the tradename BOSCH® (the "Bosch process") by Robert Bosch GmbH, Stuttgart Germany, may be used to form the notches 160 in the first side 154 of the wafer 152.

In various implementations, the notches 160 formed have two substantially parallel sidewalls that extend substantially straight into the first side 154 of the wafer 152. In other implementations, a plurality of stepwise notches are formed in the first side 154 of the wafer 152. Each stepwise notch may be formed by forming a first notch in the wafer having a first width, and then forming a second notch with a second width within each first notch where the first width is wider than the second width.

The method for forming the ultra-thin semiconductor package includes coating the first side 154 of the wafer 152 and the interiors of the plurality of notches 160 with a molding compound 162. The molding compound may also cover the electrical contacts 158 in various method implementations. The molding compound 162 may be applied using, by non-limiting example, a liquid dispensing technique, a transfer molding technique, or a compression molding technique.

The molding compound may be an epoxy molding compound, an acrylic molding compound, or any other molding compound capable of hardening and providing physical support and/or humidity protection to a semiconductor device. In various implementations, the molding compound 162 may be cured under a temperature between about 100-200 degrees Celsius and while a pressure of substantially 5 psi is applied to the second side 156 of the wafer. In other implementations, the molding may be cured with different temperatures and different pressures. In implementations with an epoxy molding compound, after the molding compound 162 is applied, it may be heat treated to enhance the epoxy cross linking.

In various implementations, the method for forming an ultra-thin semiconductor package includes grinding the second side 156 of the wafer 152 to a desired thickness. In various implementations the second side 156 of the wafer 152 may be ground away to an extent that the plurality of notches 160 filled with molding compound 162 extends completely through the wafer. In various implementations, more than this may be ground away, thus decreasing the depth of the notches 160. In this way the semiconductor devices in the wafer are separated from each other, but still held together through the molding compound. Because the molding compounds now supports the semiconductor devices, the devices can be ground very thin. In various implementations, the second side 156 of the wafer 152 may be ground using, by non-limiting example, a mechanical polishing technique, a chemical etching technique, a combination of a mechanical polishing and chemical etching technique, or any other grinding technique. In various implementations, the wafer is ground to a thickness between about 10 and about 25 microns. In other implementations, the wafer is ground to a thickness less than about 10 microns. In still other implementations, the wafer may be ground to a thickness more than about 25 microns.

In various implementations, the method for forming an ultra-thin semiconductor package includes forming a back metal 164 on the second side 156 of the wafer 152. The back metal may include a single metal layer or multiple metal layers. In various implementations, the back metal may include, by non-limiting example, gold, titanium, nickel, silver, copper, or any combination and/or alloy thereof. Because the wafer 152 is thinned and the back metal 164 is applied to the thinned wafer while the entirety of the molding compound 162 is coupled to the front side 154 of the wafer 152 and the interior of the notches 160, it may be possible to reduce or eliminate warpage of the wafer. Further, wafer handling issues are reduced when thinning the wafer and applying the back metal 164 because the entirety of the molding compound 162 is still coupled to the wafer 152. Furthermore, curling and warpage of the extremely thin semiconductor die now coated with back metal are significantly reduced due to the support provided by the molding compound.

In various implementations, the method for forming an ultra-thin semiconductor package includes exposing the plurality of electrical contacts 158 covered by the molding compound 162 by grinding a first side 166 of the molding compound 162. The first side 166 of the molding compound 162 may be ground using, by non-limiting example, a mechanical polishing technique, a chemical etching technique, a combination of a mechanical polishing and chemical etching technique, or other grinding technique.

In various implementations, the method for forming an ultra-thin semiconductor package includes singulating the wafer 152 into single die. The wafer may be singulated by cutting or etching through the wafer where the plurality of notches 160 were originally formed. The wafer may be singulated by using, by non-limiting example, a saw, a laser, a waterjet, plasma etching, or chemical etching. In various implementations, the Bosch process previously mentioned may be used to singulate the wafer 152. The method used to the singulate the wafer may include singulating the wafer using thinner cuts or etches than were used to form the plurality of notches 160. In this manner, the molding compound 162 will cover the sides of each singulated die 168.

Figure 17:
FIG. 17 is a cross sectional view of an ultra-thin semiconductor package formed by the process of FIG. 16.

Referring to FIG. 17, a cross sectional view of an ultra-thin semiconductor package formed by the process of FIG. 16 is illustrated. In various implementations, the ultra-thin semiconductor package 170 may be a power semiconductor package. Specifically, the ultra-thin semiconductor package may be a MOSFET. In other implementations, the ultra-thin semiconductor package 170 is not used for a power semiconductor device, but may be used for other semiconductor device types. In various implementations, the ultra-thin semiconductor package has a plurality of electrical contacts 186 coupled to the first side 174 of the die and exposed through a first molding compound 184. In various implementations, the die 172 of the semiconductor package 170 may be between about 10-25 microns thick. In other implementations, the die 172 is less than about 10 microns thick. In still other implementations, the die 172 may be more than about 25 microns thick. The ultra-thin nature of the power semiconductor package may improve the $R_{DS(ON)}$ of the package and/or semiconductor device/die.

In various implementations, the ultra-thin semiconductor package 170 is covered by the first molding compound 184 on a first side 174, a second side 176, a third side 178, a fourth side, and a fifth side of the die 172. A metal layer 180 may be coupled to a sixth side 182 of the die. In various implementations, more than one metal layer may be coupled to the sixth side 182 of the die. The metal may include, by non-limiting example, gold, titanium, nickel, silver, copper, or any combination or alloy thereof.

Figure 18:
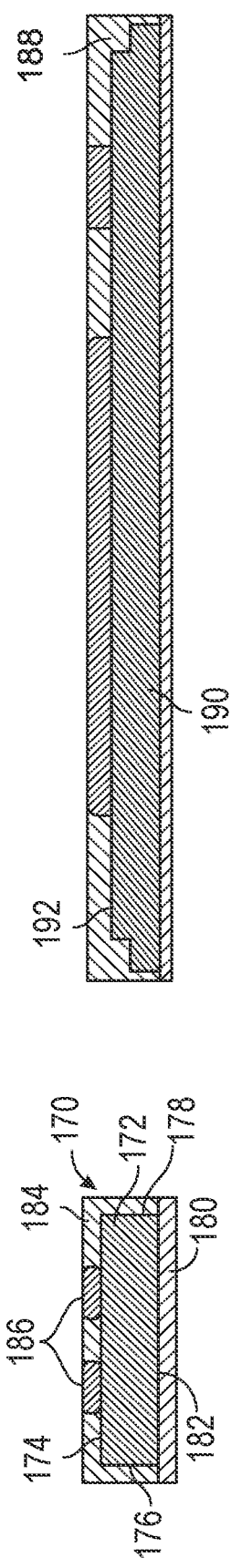
FIG. 18 is a cross sectional view of an ultra-thin semiconductor package with a notch formed therein.

Referring now to FIG. 18, a cross sectional view of an ultra-thin semiconductor package with a notch formed therein is illustrated. The package illustrated in FIG. 18 may be the same or similar to the package illustrated in FIG. 17, with the exception that the package illustrated in FIG. 18 includes a notch 188 around a perimeter of the first side 192 of the die 190. The notch 188 may result from forming a stepwise notch in a wafer as described above in relation to FIG. 16. In various implementations, the stepwise notch may not extend around the entire perimeter of the die, but may be formed just along two opposing edges of the first side 192 of the die 190.

Figure 19:
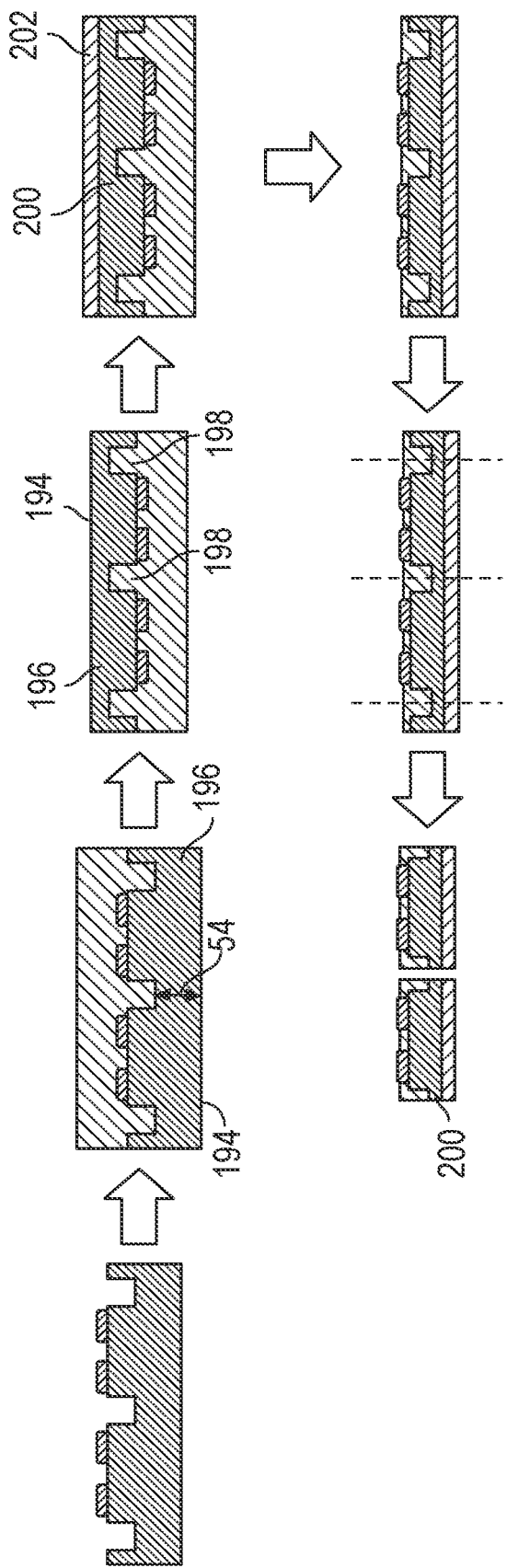
FIG. 19 is an illustration of a process flow for forming an ultra-thin semiconductor package with a portion of the die exposed.

Referring to FIG. 19, a process flow for another implementation of a method of forming an ultra-thin semiconductor package with a portion of the die exposed is illustrated. The method implementation illustrated in FIG. 19 is the same as the process illustrated by FIG. 16, with the exception that the second side 194 of the wafer 196 is not ground through to the plurality of notches 198. Because of this, a portion 200 of the wafer 196 exists between the plurality of notches 198 and the back metal 202. In various implementations, about 90-95% of the back portion 194 of the wafer 196, or the portion of the wafer that extends from the second side 194 of the wafer to the plurality of notches 198, is removed through grinding. In other implementations, more or less than this may be removed through grinding. The other process steps in the method implementation (molding, grinding, and singulation, etc.) are carried out similarly to the method implementation illustrated in FIG. 16 and described herein.

Figure 20:
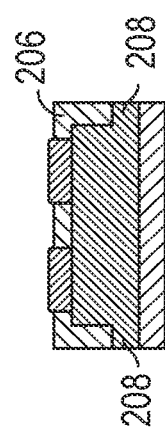
FIG. 20 is a cross sectional view of an ultra-thin semiconductor package formed by the process of FIG. 19.

Referring to FIG. 20, a cross sectional view of an ultra-thin semiconductor package formed by the process of FIG. 19 is illustrated. The semiconductor package of FIG. 20 may be the same as the semiconductor package of FIG. 17, with the exception that a portion of the die 208 is present between the molding compound and the back metal along the sides of the die. Thus, in the implementation illustrated by FIG. 20, a portion of the die 208 is exposed on the various opposing sides of the die.

Figure 21:
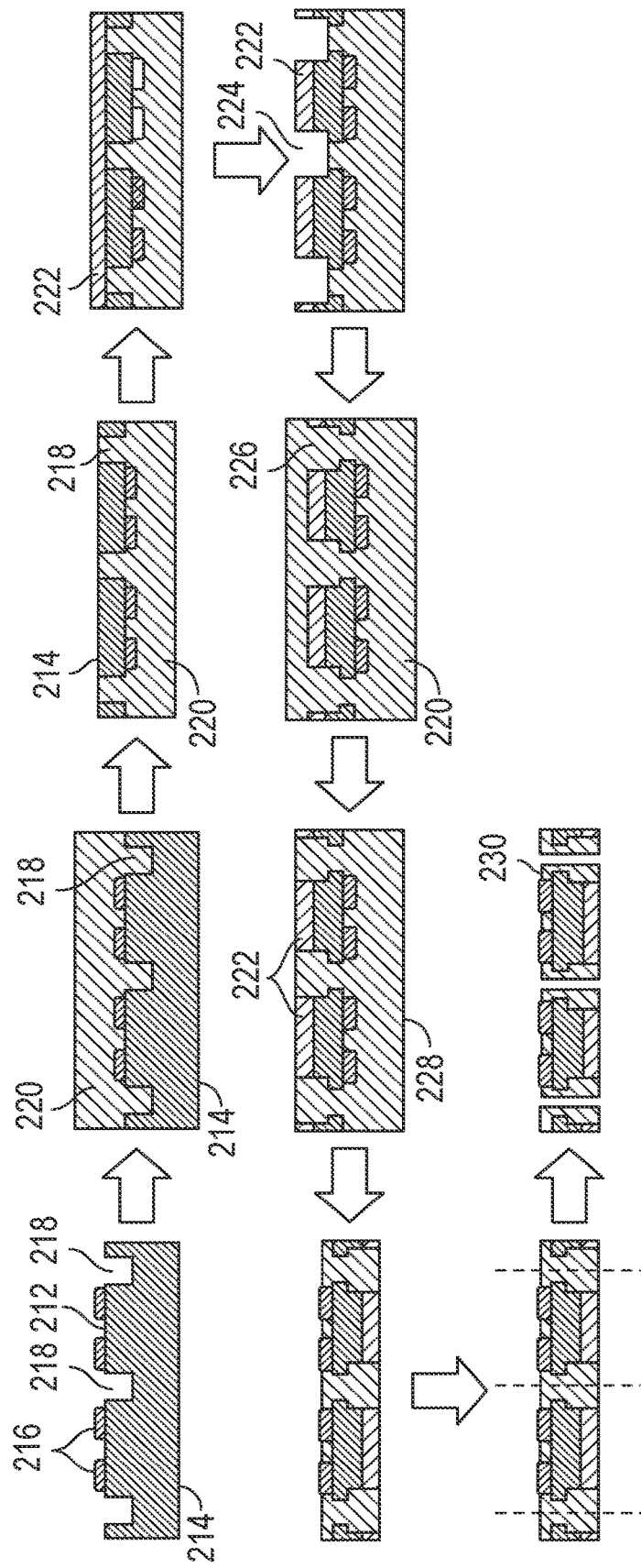
FIG. 21 is an illustration of a process flow for forming an ultra-thin semiconductor package with a notch formed therein.

Referring to FIG. 21, a process flow for another implementation of forming an ultra-thin semiconductor package with a notch formed therein is illustrated. The process flow illustrates cross sectional side views of the wafer and die. In various implementations, the method includes providing a wafer. The wafer has a first side 212 and a second side 214. The wafer may be, by non-limiting example, silicon, gallium nitride, silicon carbide, or other wafer material like those disclosed herein. The first side 212 of the wafer includes or is coupled to a plurality of electrical contacts 216. The electrical contacts 216 may be metallic or made of any other electrically conductive material disclosed herein.

In various implementations, the method includes forming a plurality of notches 218 in the first side 212 of the wafer. While not illustrated in FIG. 21, it is understood that the plurality of notches intersect one another in a substantially perpendicular direction. The notches 218 formed may be any depth previously disclosed herein, any shape previously disclosed herein (including stepwise), and formed using any method previously disclosed herein.

The method for forming the ultra-thin semiconductor package of FIG. 21 includes coating the first side 212 of the wafer and the interiors of the plurality of notches 218 with a molding compound 220. The molding compound may also cover the electrical contacts 216. The molding compound 220 may be applied using any method previously disclosed herein, and may be any type of molding compound previously disclosed herein. In various implementations, the molding compound may be cured or heat treated as described above in relation to FIG. 16.

In various implementations, the method for forming an ultra-thin semiconductor package includes grinding the second side 214 of the wafer to a desired thickness. The second side of the wafer may be ground using any grinding method disclosed herein, and may be ground to any thickness described herein. In various implementations the second side 214 of the wafer may be ground away to an extent that the plurality of notches 218 filled with molding compound 220 extend completely through the wafer. In various implementations, more of the wafer material (and, correspondingly some of the molding compound) may be ground away, thus decreasing the depth of the notches 220.

In various implementations, the method for forming an ultra-thin semiconductor package includes forming a back metal 222 on the second side 214 of the wafer. The back metal may include a single metal layer or multiple metal layers. In various implementations, the back metal may include, by non-limiting example, gold, titanium, nickel, silver, copper, or any combination thereof.

The method of forming the ultra-thin semiconductor package as illustrated in FIG. 21 includes forming at least one groove 224 through the back metal 222. In various implementations, the at least one groove is aligned with a notch from the plurality of notches 218. In various implementations, there is a groove formed for every notch. In various implementations, the groove is wider than the notch, while in other implementations, the groove is as wide as, or less wide than, the corresponding notch. As illustrated in FIG. 21, the groove 224 may extend into the second side 214 of the wafer. In other implementations, the groove 224 may only extend through the thickness of the back metal 222.

Because the wafer is thinned and the back metal 222 is applied to the thinned wafer while the entirety of the first molding compound 220 is coupled to the front side 212 of the wafer and the interior of the notches 218, it reduces warpage of the wafer. Further, wafer handling issues are reduced when thinning the wafer, applying the back metal 222, and forming the at least one groove 224 through the back metal because the entirety of the molding compound 220 is still coupled to the wafer as previously discussed.

The method implementation illustrated in FIG. 21 includes coating the second side 214 of the wafer and the back metal layer 222 with a second molding compound 226. In this manner, as illustrated by FIG. 21, the first molding compound and the second molding compound may completely encapsulate the electrical contacts 216, the wafer, and the back metal 222. The second molding compound may be any type disclosed herein and may be applied and cured using any method described herein. In various implementations, the second molding compound may be chemically the same as the first molding compound, but it may be chemically different in other implementations. The method implementation illustrated in FIG. 21 includes grinding the second molding compound to a desired thickness. In various implementations, the second molding compound is ground to expose the back metal 222. The second molding compound may be ground using any grinding method disclosed herein.

In various implementations, the method for forming an ultra-thin semiconductor package includes exposing the plurality of electrical contacts 216 covered by the molding compound 220 by grinding a first side 228 of the molding compound 220. The first side 228 of the molding compound 220 may be ground using any method disclosed herein.

In various implementations, the method for forming an ultra-thin semiconductor package also includes singulating the wafer, first molding compound 220, and second molding compound 226 into single die packages (or multi-die packages as desired). The wafer may be singulated by cutting or etching through the wafer where the plurality of notches 218 were originally formed. The wafer may be singulated by using, by non-limiting example, a saw, a laser, a waterjet, plasma etching, or chemical etching. In various implementations, the Bosch process may be used to singulate the wafer, first molding compound 220, and second molding compound 226 into individual packages. The method used to the singulate the wafer may include singulating the wafer using thinner cuts or etches than were used to form the plurality of notches 218. In this manner the first molding compound 220 and second molding compound 226 cover all the sides of each singulated die 230 leaving the electrical contacts exposed.

Figure 22:
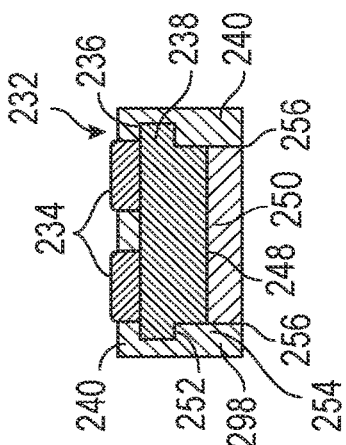
FIG. 22 is a cross sectional view of an ultra-thin semiconductor package formed by the process of FIG. 21.

Referring to FIG. 22, a cross sectional view of an ultra-thin semiconductor package formed by the process of FIG. 21 is illustrated. In various implementations, the ultra-thin semiconductor package 232 may include a power semiconductor device. Specifically, the ultra-thin semiconductor package may include a MOSFET. In other implementations, the ultra-thin semiconductor package 232 may not include a power semiconductor device.

In various implementations, the ultra-thin semiconductor package 232 has a plurality of electrical contacts 234 coupled to the first side 236 of the die and exposed through a first molding compound 90.

In various implementations, the die 238 of the semiconductor package 232 may be between about 10-25 microns thick. In other implementations, the die 238 is less than about 10 microns thick. In still other implementations, the die 238 may be more than about 25 microns thick. As previously discussed, the ultra-thin nature of the power semiconductor package may improve the $R_{DS(ON)}$ of the package.

In various implementations, the ultra-thin semiconductor package 232 is covered by the first molding compound 240 on a first side 236 and by the first molding compound 240 and the second molding compound 298 on a second side 244, a third side 246, a fourth side, and a fifth side of the die 238. In various implementations, the top 252 of the notch 254 may be considered part of the sixth side 248 of the die. In this sense, the die may be covered by the second molding compound 298 on the sixth side of the die. A metal layer 250 may be coupled to the sixth side 248 of the die. In various implementations, more than one metal layer may be coupled to the sixth side 248 of the die. The metal may include, by non-limiting example, gold, titanium, nickel, silver, copper, or any combination or alloy thereof. In various implementations, the notch 254 may extend around a perimeter of the die. In various implementations, a molding compound may cover the sides 256 of the metal layer 250.

Figure 23:
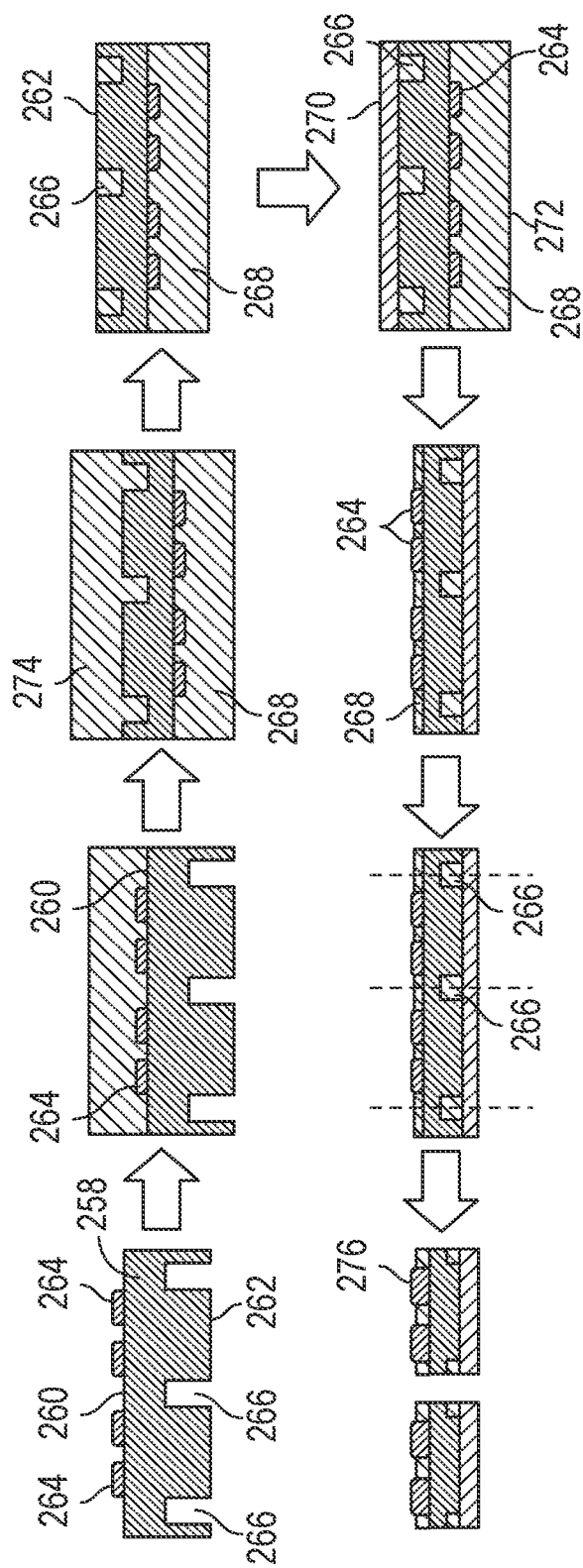
FIG. 23 is an illustration of a process flow for forming an ultra-thin semiconductor package with a portion of the die exposed.

Referring now to FIG. 23, another implementation of process flow for a method implementation for forming an ultra-thin semiconductor device with a portion of the die exposed is illustrated. The process flow illustrates cross sectional side views of the wafer and die. In various implementations, the method includes providing a wafer 258. The wafer 258 has a first side 260 and a second side 262. The wafer 258 may be, by non-limiting example, silicon, gallium nitride, silicon carbide, or other wafer substrate material disclosed herein. The first side 260 of the wafer 258 includes or is coupled to a plurality of electrical contacts 264. The electrical contacts 264 may be metallic or any other electrically conductive material disclosed herein.

In various implementations, the method for forming the ultra-thin semiconductor package includes forming a plurality of notches 266 in the second side 262 of the wafer 258. While not shown in FIG. 23, it is understood that the plurality of notches intersect one another in a substantially perpendicular direction. The notches 266 formed may be any depth previously disclosed herein, any shape previously disclosed herein, and formed using any method previously disclosed herein.

The method for forming the ultra-thin semiconductor package of FIG. 23 includes coating the first side 260 of the wafer 258 with a first molding compound 268. The first molding compound 268 may also cover the electrical contacts 264. The first molding compound 268 may be applied using any method previously disclosed herein, and may be any type previously disclosed herein. In various implementations, the first molding compound 268 may be cured or heat treated as described above in relation to FIG. 16.

In various implementations, the method for forming an ultra-thin semiconductor package may include grinding the second side 262 of the wafer 258 to a desired thickness. The second side of the wafer may be ground using any grinding method disclosed herein, and may be ground to any thickness described herein that still allows the notches to exist in the material of the wafer itself. In other implementations, the second side of the wafer is not ground.

The method of forming the ultra-thin semiconductor package as illustrated in FIG. 23 includes coating the second side 262 of the wafer 258 and the interiors of the plurality of notches 266 with a second molding compound 274. The second molding compound may be any type disclosed herein and may be applied and cured using any method described herein.

The method of forming the ultra-thin semiconductor package as illustrated in FIG. 23 includes grinding the second molding compound 274 to a desired thickness. In various implementations, the second molding compound is ground to expose the second side of the wafer 262. In various implementations, a portion of the wafer may be ground away with the second molding compound 274. At least a portion of the plurality of notches 266 remains after grinding the second molding compound 274. The second molding compound 274 may be ground using any grinding method disclosed herein.

In various implementations, the method for forming an ultra-thin semiconductor package includes forming a back metal 270 on the second side 262 of the wafer 258 and over the plurality of notches 266. The back metal may include a single metal layer or multiple metal layers. In various implementations, the back metal may include, by non-limiting example, gold, titanium, nickel, silver, copper, or any combination or alloy thereof.

Because the wafer 258 may be thinned and the back metal 270 is applied to the thinned wafer while the entirety of the first molding compound 268 is coupled to the front side 260 of the wafer 258, it reduces warpage of the wafer. Further, as discussed in this document, wafer handling issues are reduced when thinning the wafer and applying the back metal 270 because the entirety of the molding compound 268 is still coupled to the wafer 258.

In various implementations, the method for forming an ultra-thin semiconductor package includes exposing the plurality of electrical contacts 264 covered by the first molding compound 268 by grinding a first side 272 of the first molding compound. The first side 272 of the first molding compound 268 may be ground using any method disclosed herein.

In various implementations, the method for forming an ultra-thin semiconductor package includes singulating the wafer 258, first molding compound 268, and second molding compound 274 into single die 276. The wafer may be singulated by cutting or etching through the wafer where the plurality of notches 266 were originally formed. The wafer may be singulated by using, by non-limiting example, a saw, a laser, a waterjet, plasma etching, or chemical etching. In various implementations, the Bosch process may be used to singulate the wafer 258, first molding compound 268, and second molding compound 274 into individual die.

Figure 24:
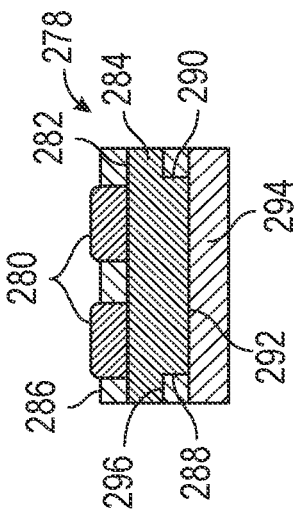
FIG. 24 is a cross sectional view of an ultra-thin semiconductor package formed by the process of FIG. 23.

Referring to FIG. 24, a cross sectional view of an ultra-thin semiconductor package formed by the process of FIG. 23 is illustrated. In various implementations, the ultra-thin semiconductor package 278 may include a power semiconductor device. Specifically, the ultra-thin semiconductor package may include a MOSFET. In other implementations, the ultra-thin semiconductor package 278 may not include a power semiconductor device. In various implementations, the ultra-thin semiconductor package 278 has a plurality of electrical contacts 280 coupled to the first side 282 of the die 284. In various implementations, the die 284 of the semiconductor package 278 may be between about 10-25 microns thick. In other implementations, the die 284 is less than about 10 microns thick. In still other implementations, the die 284 may be more than about 25 microns thick. As previously discussed, the ultra-thin nature of the power semiconductor device may improve the $R_{DS(ON)}$ of the device.

In various implementations, the ultra-thin semiconductor package 278 includes a molding 286 on a portion of a first side 282, a portion of a second side 288, a portion of a third side 290, a portion of a fourth side, and a portion of a fifth side of the die 284. A metal layer 294 may be coupled to the sixth side 292 of the die. In various implementations, more than one metal layer may be coupled to the sixth side 292 of the die. The metal may include, by non-limiting example, gold, titanium, nickel, silver, copper, or any combination or alloy thereof. In various implementations, a notch 296 cut out of the sixth side 292 of the die may extend around a perimeter of the die 284.

Figure 25:
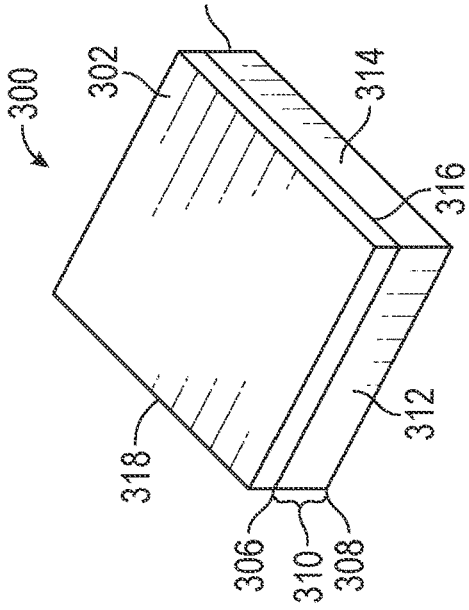
FIG. 25 is a perspective view of a first implementation of a permanent die support structure coupled with a thinned semiconductor die (die)

Referring to FIG. 25, a first implementation of a semiconductor device 1098 is illustrated. As illustrated, the device 1098 includes a permanent die support structure (die support structure) 302 coupled with a thinned semiconductor die 304. The semiconductor die 304 may include one or more semiconductor devices formed therein and/or thereon including, by non-limiting example, integrated bipolar junction transistors (IGBTs), metal oxide semiconductor field effect transistors (MOSFETs), diodes, power semiconductor devices, any semiconductor device disclosed in this document, any combination thereof, or any other active or passive semiconductor device or component, alone or in combination. As illustrated, the semiconductor die 304 has a first largest planar surface 306 that, in this implementation, opposes a second largest planar surface 308. Between the first largest planar surface 306 and the second largest planar surface 308 is thickness 310 of the semiconductor die 304. The die in the implementation illustrated in FIG. 25 also includes four sides that extend across the thickness 310, two of which, 312 and 314, are visible in FIG. 25. The semiconductor die 304 has a perimeter 316 that extends around at least one of the first largest planar surface 306 or the second largest planar surface 308. In the implementation illustrated, the semiconductor die 304 is rectangular, and so the perimeter 316 forms a rectangular shape. In various implementations of semiconductor die disclosed herein, however, the perimeter may be, by non-limiting example, elliptical, triangular, circular, rhomboidal, polygonal, hexagonal, or any other closed shape.

In various implementations disclosed herein, the thickness 310 of the thinned semiconductor die may be between about 0.1 microns and about 125 microns. In other implementations, the thickness may be between about 0.1 microns and about 100 microns. In other implementations, the thickness may be between about 0.1 microns and about 75 microns. In other implementations, the thickness may be between about 0.1 microns and about 50 microns. In other implementations, the thickness may be between about 0.1 microns and about 25 microns. In other implementations, the thickness may be between about 0.1 microns and about 10 microns. In other implementations, thickness may be between 0.1 microns and about 5 microns. In other implementations, the thickness may be less than 5 microns.

The various semiconductor die disclosed herein may include various die sizes. Die size generally refers to measured principal dimensions of the perimeter of the die. For example, for a rectangular die that is a square, the die size can be represented by referring to a height and width of the perimeter. In various implementations, the die size of the semiconductor die may be at least about 4 mm by about 4 mm where the perimeter of the die is rectangular. In other implementations, the die size may be smaller. In other implementations, the die size of the semiconductor die may be about 211 mm by about 211 mm or smaller. For die with a perimeter that is not rectangular, the surface area of the largest planar surface of die may be used as a representation of the die size.

One of the effects of thinning the semiconductor die is that as the thickness decreases, the largest planar surfaces of the die may tend to warp or bend in one or more directions as the thinned material of the die permits movement of the material under various forces. Similar warping or bending effects may be observed where the die size becomes much larger than the thickness of the die for large die above about 6 mm by about 6 mm or 36 mm$^2$ in surface area. These forces include tensile forces applied by stressed films, stress created through backgrinding, forces applied by backmetal formed onto a largest planar surface of the die, and/or forces induced by the structure of the one or more devices formed on and/or in the semiconductor die. This warping or bending of the thinned semiconductor die can prevent successful processing of the die through the remaining operations needed to form a semiconductor package around the die to allow it to ultimately function as, by non-limiting example, a desired electronic component, processor, power semiconductor device, switch, or other active or passive electrical component. Being able to reduce the warpage below a desired threshold amount may permit the die to be successfully processed through the various operations, including, by non-limiting example, die bonding, die attach, package encapsulating, clip attach, lid attach, wire bonding, epoxy dispensing, pin attach, pin insertion, or any other process involved in forming a semiconductor package. In various implementations the warpage of the die may need to be reduced to less than about 50 microns measured across a largest planar surface of the die between a highest and lowest point on the largest planar surface. In other implementations, by non-limiting example, where an assembly process involves Au—Si eutectic die attach, the warpage of the die may need to be reduced to less than about 25 microns when measured across a largest planar surface of the die. In other implementations, by non-limiting example, where a die attach process utilizing solder paste is used, the warpage of the die may need to be reduced to about 75 microns or less. In various implementations, the warpage of the die may be reduced to below about 200 microns or less. In implementations where larger die are used, more warpage may be tolerated successfully in subsequent packaging operations, so while values less than 25 microns may be desirable for many die, depending on die size, more warpage than about 25, than about 50, than about 75 microns, or up to about 200 microns may be capable of being tolerated.

In various implementations, the warpage may be measured using various techniques. For example, a capacitive scanning system with two probes that utilize changes in the capacitance for each probe when a die or wafer is inserted into the gap between the probes to determine a wafer thickness and/or position can be utilized to map the warpage of a die or wafer. An example of such a capacitive system that may be utilized in various implementations may be the system marketed under the tradename PROFORMA 300ISA by MTI Instruments Inc. of Albany, N.Y. In other implementations, the warpage may be measured by a laser profilometer utilizing confocal sensors marketed under the tradename ACUITY by Schmitt Industries, Inc. of Portland, Oreg. In other implementations, any of the following shape/profile measurement systems marketed by Keyence Corporation of America of Itasca, Ill. could be employed to measure die or wafer warpage: the reflective confocal displacement sensor system marketed under the tradename CL-3000, the 2D laser profiling system marketed under the tradename LJ-V7000, or the 3D interferometric sensing system marketed under the tradename WI-5000.

In the semiconductor device 300 implementation illustrated in FIG. 25, the permanent die support structure 302 is a layer of material coupled to the first largest planar surface 306 of the thinned semiconductor die 304. In this implementation, the shape of a perimeter 318 of the permanent die support structure 302 is substantially the same as the perimeter 316 of the die 304. However, and as described in this document, the shape of the perimeter 318 may be a wide variety of shapes, including, by non-limiting example, rectangular, triangular, polygonal, elliptical, circular, or any other closed shape. Furthermore, the permanent die support structure 302 may include two or more portions, which will be described in this document.

In the implementation illustrated in FIG. 25, the permanent die support structure includes a mold compound that is applied to the first largest planar surface 306 of the thinned semiconductor die 304. The mold compound reduces the warpage of the thinned semiconductor die in any of a wide variety of ways, such as, by non-limiting example, having a predetermined hardness value, having a predetermined stiffness value, having a predetermined Shore value, having a predetermined glass transition temperature, having a predetermined cure strength, having a predetermined thickness, having a predetermined film stress, curing at a particular temperature, curing with a particular temperature ramp profile, curing using specific light wavelengths, including one or more fillers, including one or more resins, or any other compound formation process parameter, mold compound ingredient, film parameter capable of affecting the warpage of the thinned semiconductor die. While a single layer of mold compound is illustrated as being used as the permanent die support in FIG. 25, in other implementations two or more layers of mold compound may be employed to form the die support which contain either the same or different material compositions. These two or more layers may be applied simultaneously or sequentially in various implementations.

In various implementations, the mold compound is not a polyimide material or other material generally specifically used to act as a passivating material for a semiconductor die surface. The mold compound may include any of a wide variety of compounds, including, by non-limiting example, encapsulants, epoxies, resins, polymers, polymer blends, fillers, particles, thermally conductive particles, electrically conductive particles, pigments, and any other material capable of assisting in forming a stable permanent supporting structure. In some implementations the mold compound may be non-electrically conductive (insulative). In other implementations, the mold compound may be electrically conductive, such as an anisotropic conductive film. In such implementations where the mold compound is electrically conductive, the mold compound is not a metal, but rather is formed as a matrix containing electrically conductive materials, such as, by non-limiting example, metal particles, graphene particles, graphite particles, metal fibers, graphene fibers, carbon fibers, carbon fiber particles, or any other electrically conductive particle or fiber. In various implementations, the mold compound may be a material which has a flexural strength of between about 13 N/mm$^2$ to 185 N/mm$^2$. Flexural strength is the ability of the mold compound to resist plastic deformation under load. Plastic deformation occurs when the mold compound no longer will return to its original dimensions after experiencing the load. For those implementations of permanent die support structures, flexural strength values of the mold compound to be used may generally be selected so that the chosen mold compound has sufficient flexural strength at the maximum expected operating temperature to avoid plastic deformation.

Figure 26:
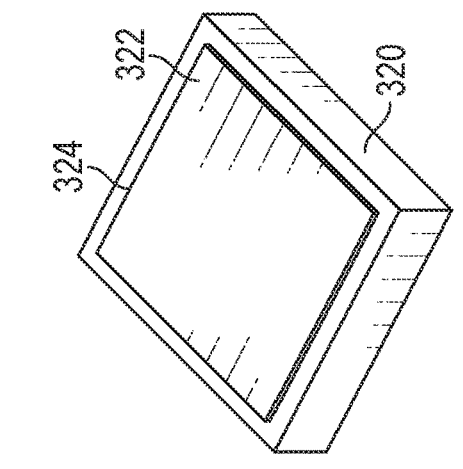
FIG. 26 is a perspective view of a second implementation of a permanent die support structure coupled with a thinned die.

A wide variety of shapes and structures may be employed as permanent die support structures in various implementations that may employ any of the material types, material parameters, or film parameters disclosed in this document. Referring to FIG. 26, a second implementation of a permanent die support structure 320 that is coupled at the thickness 324 of a semiconductor die 322. In this implementation, the permanent die support structure 320 extends continuously around the thickness/perimeter 324 of the die 322. In this implementation, having the permanent die support structure 320 around the thickness 324 of the die 322 may reduce the warpage of the die 322 to a desired level like any disclosed in this document.

Figure 27:
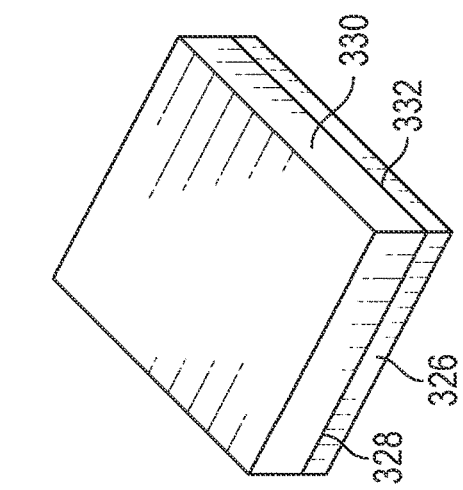
FIG. 27 is a perspective view of a third implementation of a permanent die support structure coupled with a thinned die.

While in the implementation illustrated in FIG. 25 the permanent die support structure 302 is illustrated coupled with the upper largest planar surface 306 of the die 304, in other implementations, like the third one illustrated in FIG. 27, the permanent die support structure 326 is coupled to the lower largest planar surface 328 of the die 330. In this implementation, the permanent die support 326 is a layer coupled to the lower largest planar surface 328 and is also substantially coextensive with the perimeter of the lower largest planar surface 328.

Figure 30:
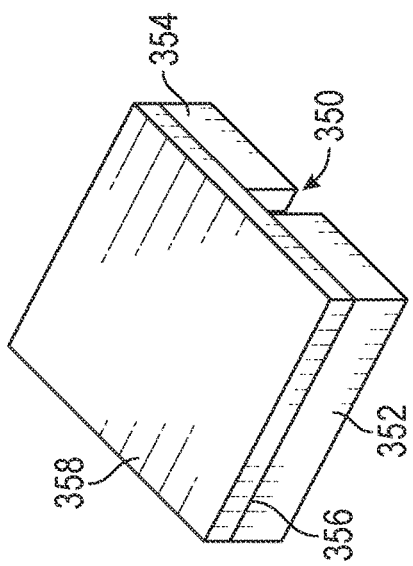
FIG. 30 is a perspective view of a sixth implementation of a permanent die support structure coupled with a thinned die.
Figure 29:
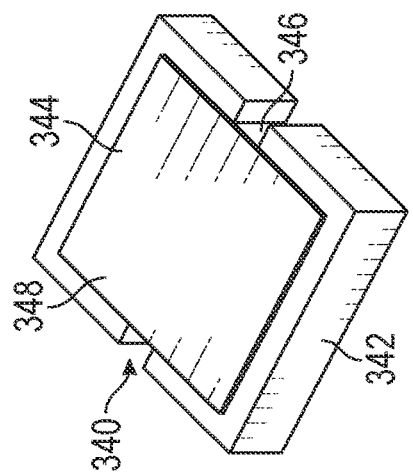
FIG. 29 is a perspective view of a fifth implementation of a permanent die support structure coupled with a thinned die.
Figure 28:
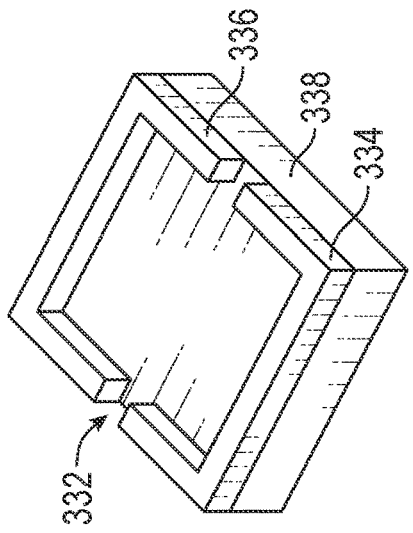
FIG. 28 is a perspective view of a fourth implementation of a permanent die support structure coupled with a thinned die.

Referring to FIG. 28, a fourth implementation of a permanent die support structure 332 is illustrated that includes two C-shaped or U-shaped portions, a first portion 334 and a second portion 336. The first portion 334 and second portion 336 are separated by a gap along each side of the semiconductor die 338. The material of the die support structure 322 in this implementation is included in the first portion 334 and second portion 336 and may be any material disclosed for use in a permanent die support structure disclosed in this document. The fifth implementation of a permanent die support structure 340 illustrated in FIG. 29 also includes U- or C-shaped first portion 342 and second portion 344, except that these portions are coupled across or over the thickness 346 of the semiconductor die 348. In other implementations, like the sixth implementation of a permanent die support structure 350 illustrated in FIG. 30, the U- or C-shaped first portion 352 and second portion 354 are coupled to the lower largest planar surface 356 of the semiconductor die 358 rather than the upper largest planar surface as in the implementation illustrated in FIG. 28.

Figure 31:
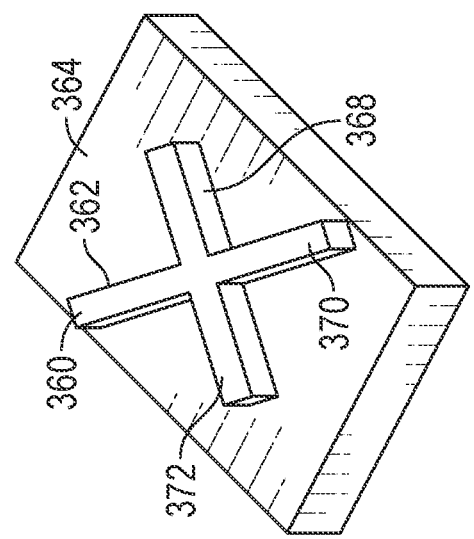
FIG. 31 is a perspective view of a seventh implementation of a permanent die support structure coupled with a thinned die.
Figure 32:
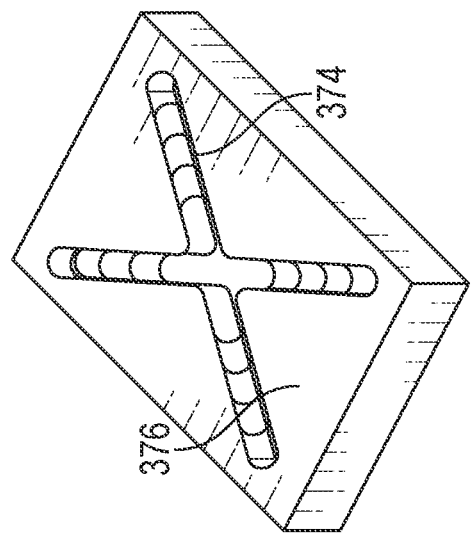
FIG. 32 is a perspective view of an eighth implementation of a permanent die support structure coupled with a thinned die.

Referring to FIG. 31, a seventh implementation of a permanent die support structure 360 is illustrated. In this implementation, the structure 360 is formed of two intersecting lines of material, which are illustrated to be asymmetric in at least one axis. In other implementations, however, the shape of the permanent die support structure 360 may be symmetric about one or all axes. The location along the upper or lower planar surfaces of the semiconductor die 362 at which the structure 360 is coupled to the die 364 may be determined by calculations based on, by non-limiting example, die size, die surface area, die shape, localized film properties, localized stress gradients, location(s) of semiconductor devices on/within the die, die thickness, die thickness uniformity, and any other parameter affecting the warpage of a semiconductor die. Also, in this implementation of a permanent die support structure 360, the length, orientation, and or position of each of the projections 366, 368, 370, 372 of the structure 360 may be calculated and/or determined using any of the previously mentioned parameters affecting the warpage of the die 364. FIG. 32 illustrated an eighth implementation of a permanent die support 374, which like the support 360 illustrated in FIG. 31 is X-shaped, but which has a different side wall profile having rounded side walls rather than straight or substantially straight side walls. In various implementations, the side wall profile of the permanent die support 374 may also be calculated/determined using any of the previously mentioned parameters that affect the warpage of the die 376.

Figure 33:
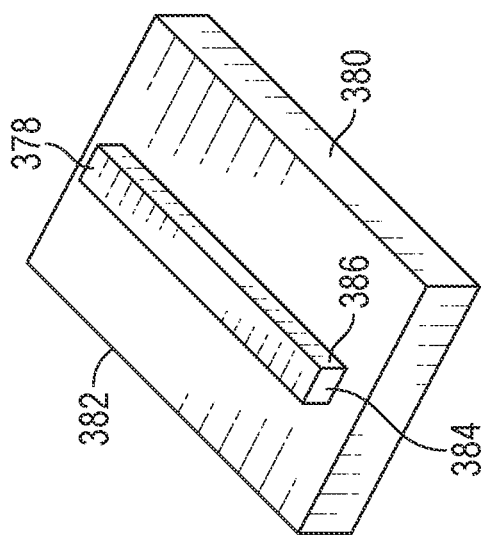
FIG. 33 is a perspective view of an ninth implementation of a permanent die support structure coupled with a thinned die.

Referring to FIG. 33, a ninth implementation of a permanent die support 378 is illustrated which takes the form of a rod/long rectangle with straight or substantially straight side walls. As previously discussed, the profile of the side walls 384, 386 may be changed to assist in reducing the warpage of the die 380 as can the location of the support 378 and its orientation relative to the perimeter 382 of the die 380. In various implementations, the rod may not be straight, but may be curved in one or more places to form, by non-limiting example, a C-shape, a U-shape, an S-shape, an N-shape, a M-shape, a W-shape, or any other curved or angled shape formed from one continuous piece of material.

Figure 34:
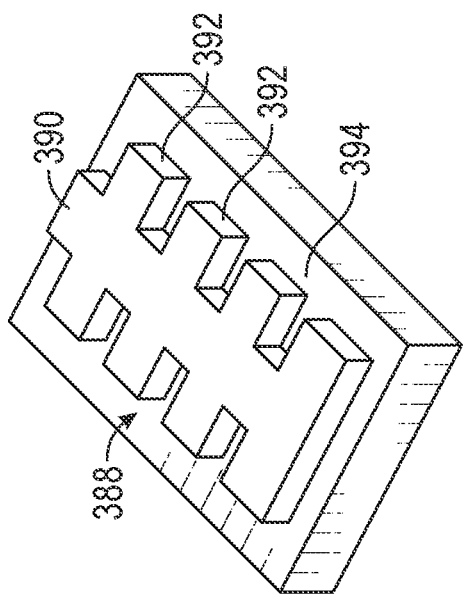
FIG. 34 is a perspective view of an tenth implementation of a permanent die support structure coupled with a thinned die.

Referring to FIG. 34, a tenth implementation of a permanent die support 388 is illustrated which contains a central portion 390 from which a plurality of ribs 392 project. The number, location, and position of the ribs 392 along the central portion 390 may be determined/calculated using any of the previously discussed parameters that affect the warpage of the die 394. The side wall profile of any or all of the ribs 392 and/or the central portion 390 may also be calculated in a similar way using the previously discussed parameters.

Figure 35:
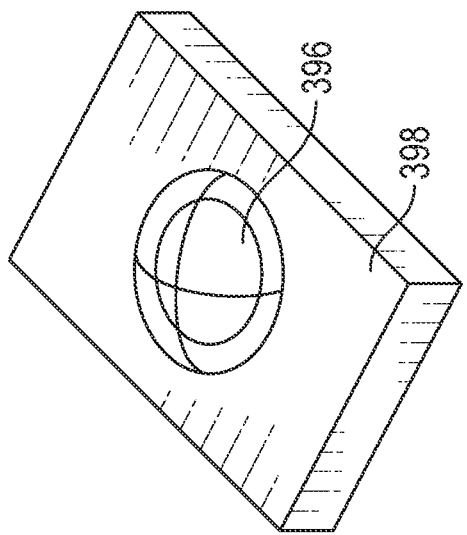
FIG. 35 is a perspective view of an eleventh implementation of a permanent die support structure coupled with a thinned die.

In various implementations, the permanent die support need not be a shape with straight edges/lines, but, like the eleventh implementation of a permanent die support 396 illustrated in FIG. 35, may include an elliptical or spherical shape. In this implementation, the overall three-dimensional shape of the die support 396 is dome-shaped as the side wall profile of the support is rounded. In other implementations, however, the overall three-dimensional shape of the support 396 may be, by non-limiting example, cylindrical with straight side walls, conical with angled side walls, frusto-conical with straight side walls and a flat upper surface, or any other three dimensional shape that is formed by projecting an elliptical cross-sectional shape upward from the surface of die 398.

Figure 36:
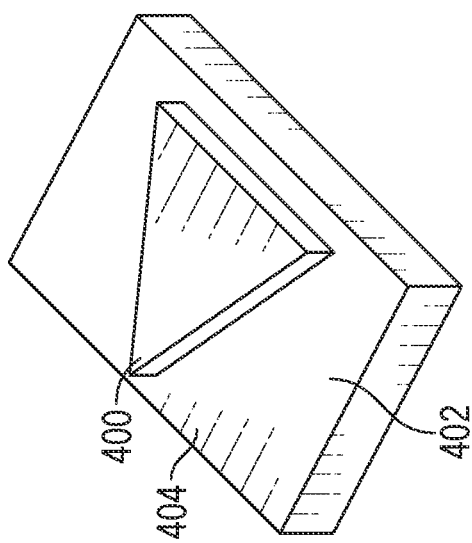
FIG. 36 is a perspective view of an twelfth implementation of a permanent die support structure coupled with a thinned die.

Referring to FIG. 36, a twelfth implementation of a permanent die support 1100 that is triangular is illustrated. For those supports 1100 that are triangular, the shape of the triangle may be acute, right, obtuse, equilateral, isosceles, or scalene in various implementations. As in the previously discussed, the side wall profile of the triangle and the placement of the permanent die support 1100 along the largest planar surface 404 of the semiconductor die 402 may be determined by any of the previously mentioned parameters that affect the warpage of the die 402.

In various implementations, the permanent die support can include more than one portion that is not directly attached to any other portion. Referring to FIG. 37, a thirteenth implementation of a permanent die support 406 with a first portion 408 and a second portion 410 that are separately coupled to the largest planar surface 412 of semiconductor die 414. In this implementation, the specific placement, sizing, and side wall profile of each of the portions 408, 410 may be determined by any of the previously mentioned parameters affecting warpage of the die 414. While in the permanent die support 406 implementation illustrated in FIG. 37, the first portion 408 and second portion 410 are coupled to the largest planar surface 412, in other implementations, as illustrated in FIGS. 38, 41, 42, 43, and 44, the different portions may be coupled on/at the thickness of the semiconductor die. FIG. 38 illustrates a fourteenth implementation of a permanent die support 416 that includes first, second, third, and fourth portions 418, 420, 422, and 424, respectively coupled around each corner of the semiconductor die 426 at the thickness 428 of the die. FIG. 41 illustrates a seventeenth implementation of a permanent die support structure 1068 that also includes 4 portions 432, 434, 436, and 438 but which are coupled at the thickness 440 at the midpoint of each side of the semiconductor die 442. While the portions of the permanent die support structures illustrated in FIGS. 37, 38, and 41 are rectangular, in other implementations, the portions may take a variety of other shapes. Referring to FIG. 42, an eighteenth implementation of a permanent die support structure 444 with four portions 446, 448, 450, and 452 each with a semicircular shape each coupled along the entire side of the semiconductor die 454 is illustrated. FIG. 43 illustrates a nineteenth implementation of a permanent die support structure 456 that has a first portion 458 and a second portion 460 that each are coupled at the thickness along an entire length of two sides of the semiconductor die 462 and then to each other at two points. In FIG. 43, the die 462 is shaped like a parallelogram. In the implementation illustrated in FIG. 44, the semiconductor die 464 is triangular and the permanent die support structure 466 illustrated includes three triangularly shaped portions 468, 470, and 472 which are each triangularly shaped as well and coupled at the thickness along a side of the die 464. In all of these implementations of permanent die supports which are coupled at the thickness at or along a side of the die, the dimensions and materials of the supports may be selected using any of the previously mentioned parameters that affect the warpage of the die.

In other implementations of permanent die supports coupled on/at the thickness of the die, only a single portion may be utilized. Referring to FIG. 39, a fifteenth implementation of a permanent die support 474 is illustrated that is coupled on the thickness of semiconductor die 478 and extends fully along one side 476 of die 478 and contains a portion that wraps around corner 480 of the die. In this implementation, the length of the portion that wraps around the corner 480 may be determined by the degree to which warpage on that side/corner/edge of the die 478 needs to be minimized in various implementations. In other implementations, referring to FIG. 40, a sixteenth implementation of a permanent die support 482 is illustrated coupled along only one side of die 482 at the thickness of the die. The extent to which the permanent die supports extend along the die sides and around corners may depend on any of the previously mentioned parameters that affect the warpage of the die. In other implementations, more than one a single portion that extends along just one side of the die at the thickness may be employed such as portions on alternate sides of the die, portions on three sides of the die, or portions on two sides of the die.

In various implementations of permanent die supports like those disclosed herein, the permanent die support material 494 may fully enclose both of the largest planar surfaces 488, 490 and the thickness 486 of a semiconductor die 492, as illustrated in FIG. 45. Whether the die support fully encloses all six sides of the die (in the case of a rectangular die) depends on the desired warpage values. In such implementations where the permanent die support 494 completely covers one or more sides of the die, one or more openings may be provided in/formed in the permanent die support through the material of the permanent die support 494 to allow electrical or physical connections with the die. In various other implementations, the permanent die support material 496 may extend over the thickness 498 and one of the two largest planar surfaces 500 of the semiconductor die 502. In such implementations, electrical and physical connections made be formed via the exposed largest planar surface 504 and/or through openings in the material 496 of the permanent die support. A wide variety of possible configurations may be constructed to form electrical and physical connections with the semiconductor die to which a permanent die support like any disclosed in this document using the principles disclosed herein. In various implementations, the permanent die support material may be conformal, or conform to the shape of the die over which the material is coupled. In other implementations, the die support material may be non-conformal forming its own shape rather than assuming part of the shape of the die. In various implementations, the permanent die support material may be applied as a coating to the semiconductor die.

The various implementations of permanent die support structures disclosed herein may be formed using various methods of forming a die support structure. In a particular method implementation, the method includes permanently coupling a material with a semiconductor die. This material may be a mold compound or any other material disclosed in this document used to form a permanent die support structure. The semiconductor die may be any type disclosed herein that includes two largest planar surfaces with a thickness between the surfaces and the thickness may be any thickness disclosed in this document. The semiconductor device(s) included on the semiconductor die may be any disclosed in this document. At the time where the material is permanently coupled with the semiconductor die, the material may be coupled with any, all, or any combination of a first largest planar surface, a second largest planar surface, or the thickness. The method includes reducing a warpage of the semiconductor die to less than 50 microns through the coupling the material. In particular implementations the method may include reducing a warpage of the semiconductor die to less than 25 microns.

As disclosed in this document, in various method implementations, the method includes permanently coupling two or more portions of material to the semiconductor die to one, all, or any combination of the first largest planar surface, the second largest planar surface, or the thickness. In various method implementations, the method may include permanently or temporarily coupling a second layer of material over the material originally permanently coupled with the semiconductor die. Additional layers beyond the second layer may also be coupled over the second layer in various method implementations.

In various method implementations, the point in a semiconductor die's processing where the permanent die support structure is coupled may vary from implementation to implementation. In some method implementations, the point at where the permanent die support structure is applied may occur before or after the semiconductor die has been physically singulated from among the plurality of semiconductor die being formed on the semiconductor substrate.

For example, referring to FIG. 47, a side view of a semiconductor substrate 506 is illustrated with a plurality of die 508 formed thereon/therein. At this point in an implementation of a method of wafer scale packaging the plurality of die 508, partial grooves 510 have been formed between the die 508 using any process disclosed in this document for forming such partial grooves 510. Following forming of the partial grooves 510 (or prior to, in some method implementations), a plurality of permanent die support structures 512 have been coupled over each of the die 508. Subsequent to application of the permanent die support structures 512, the method implementation may proceed with various additional processing steps like those disclosed in this document, including, by non-limiting example, applying a mold compound over the permanent die support structures 512; backgrinding the semiconductor substrate 506 to thin the thickness of the substrate 506 until the bottom surface of the partial grooves 510 is reached, thus singulating each of the die 508 among the plurality of die; and/or singulating the die using, by non-limiting example, a sawing process, a lasering process, a jet ablation process, a wet etching process, a plasma etching process, or any combination thereof. Many additional sequences of method steps that incorporate permanent die support structures may be devised using the principles disclosed in this document.

In various method implementations, the permanent die support structure may be employed before any singulation processes have been carried on for the plurality of die (or at an intermediate step while the substrate still remains in physical form). Referring to FIG. 48, a plurality of permanent die support structures 512 are illustrated distributed across a semiconductor substrate that takes the form of a wafer 514. In this implementation, the permanent die support structures are aligned, one per die, as illustrated in the detail view of the single die 518 in FIG. 49. As illustrated in FIG. 50, the thickness of this the permanent die support structure 512 varies across the structure, thinner at the center and becoming thicker at the edges. In various implementations, the varying nature/location of the thickness of the structure 512 may be determined by any of the previously mentioned parameters that affect the warpage of the die.

In various method implementations, the permanent die support may be coupled prior to or after probing of the individual die. Similarly, the permanent die supports may be applied to a plurality of die on a semiconductor substrate prior to or after probing the plurality of die.

In various method implementations, no precut or partial grooving between the plurality of die of a semiconductor substrate may be carried out. Where the plurality of die will be thinned, the depth of the die/saw streets/scribe lines may be sufficient to carry out the various methods of forming semiconductor packages disclosed herein. For example, and with reference to FIG. 51, where the substrate 520 will be thinned to about 10 microns, the about 5 micron depth of the die streets 524 into the material of the substrate/die resulting from the processing steps that form the plurality of semiconductor die 522 suffices to act as the equivalent of any partial grooving/precutting. In particular method implementations, the depth of the die streets can be increased during the die fabrication process. In other particular method implementations, the depth of the die streets may be increased during die preparation/packaging processes following die fabrication. In this way, any separate precut or partial grooving of the wafer using a saw or other process may be rendered unnecessary. Avoiding separately precutting/partial grooving may facilitate the sawing process and/or eliminate risk of sidewall cracking due to coefficient of thermal expansion (CTE) mismatches. While using the depth of the die streets to set sidewall coverage of mold compound rather than the depth of a precut into the semiconductor substrate may reduce the partial sidewall coverage for each die 522 of the plurality of die, the benefits may outweigh the additional coverage in various method implementations.

In various method implementations, permanent die support structures may be coupled to the plurality of die while the semiconductor substrate while it is at full thickness, or, in other words, prior to any thinning operations being performed. FIG. 52 illustrates a semiconductor substrate 526 with a plurality of die 528 formed thereon with a plurality of permanent die support structures 530 coupled thereto. Additional thinning operations can then be initiated with the permanent die support structures 530 in place. Also, for those processes where precut/grooving operations take place prior to thinning, these steps can take place after coupling of the permanent die support structures.

In various method implementations, the permanent die support structures 536 may be coupled over the die 534 after thinning is performed, as illustrated in the semiconductor substrate 532 of FIG. 53. In other implementations, the permanent die support structures 538 may be applied over the die 540 after backmetal layer(s) 542 have been applied to the semiconductor substrate 544, as illustrated by the structure in FIG. 54. In yet other method implementations, the permanent die support structures 546 may be applied over the plurality of die 548 after the semiconductor substrate 550 has been only partially thinned, such as, by non-limiting example, through removing backside oxide prior to probing, an initial grinding step prior to a polishing/lapping step, or any other process which partially removes a layer of material or bulk material from the side 552 of the semiconductor substrate opposite the die 548.

In various method implementations, the permanent die support structures 554 may be applied over the plurality of semiconductor die 556 after a full backgrinding process is carried out but prior to or after a stress relief wet etching process has been carried out, as illustrated in FIG. 56. In such implementations, the stress relief wet etching may be carried out with or without backmetal. In some implementations, the stress relief wet etching make take place after protecting the front side (die side) of the semiconductor substrate. The stress relief etching may reduce the backside damage to the semiconductor substrate that is caused by the backgrinding process. The use of the stress relief etching may also facilitate adhesion of the backmetal applied to the ground surface. In various implementations, the application of the permanent die support structures may be carried out prior to a backmetal formation process. A wide variety of sequences of method steps involving coupling of permanent die support structures may be carried out using the principles disclosed in this document for packaging process involving wafer scale operations like those disclosed in this document used for semiconductor substrates.

Similarly to the timing of applying permanent die support structures during methods of wafer scale packaging a plurality die, the timing may vary in various implementations of chip scale packaging a die. For example, the permanent die support structure may be applied as the first step following die picking from a singulation tape, or immediately following die singulation prior to picking. In other method implementations, the permanent die support structure may be applied at a later step in the process, such as, by non-limiting example, die attach, die underfilling, flux washing, epoxy cure, prior to a full encapsulating step, after lead frame attach, or any other chip scale packaging process operation. A wide variety of sequences of method steps involving coupling a permanent die support structure may be employed in various method implementations using the principles disclosed in this document.

In various semiconductor package and method implementations disclosed in this document, any of the pads or electrical connectors disclosed in this document may be formed, by any or any combination of the following: evaporation, sputtering, soldering together, screen printing, solder screen printing, silver sintering one or more layers of materials. Any of the foregoing may also be used in combination with electroplating or electroless plating methods of forming pads and/or electrical connectors.

Referring to FIG. 57, an implementation of a thinned semiconductor die 558 is illustrated. Various implementations of thinned semiconductor die disclosed in this document may be formed from a wide variety of semiconductor substrate types, including, by non-limiting example, silicon, polysilicon, silicon-on-insulator, glass, sapphire, ruby, gallium arsenide, silicon carbide, and any other semiconductor material type. Also, various implementations of thinned semiconductor die may include die of any of a wide variety of shapes, including, by non-limiting example, rectangular, elliptical, triangular, polygonal, or any other closed shape. The various implementations of thinned semiconductor die disclosed herein may include any of a wide variety of electronic devices, including, by non-limiting example, integrated bipolar junction transistors (IGBTs), metal oxide semiconductor field effect transistors (MOSFETs), diodes, power semiconductor devices, any semiconductor device disclosed in this document, any combination thereof, or any other active or passive semiconductor device or component, alone or in combination. As illustrated, the die 558 has a first largest planar surface 560 and a second largest planar surface 562 with thickness 564 between them. Because the die 558 is a rectangular die, four additional sides 566, 568, 570, and 572 extend across the thickness 564.

In various implementations disclosed herein, the thickness 564 of the thinned semiconductor die may be between about 0.1 microns and about 125 microns. In other implementations, the thickness may be between about 0.1 microns and about 100 microns. In other implementations, the thickness may be between about 0.1 microns and about 75 microns. In other implementations, the thickness may be between about 0.1 microns and about 50 microns. In other implementations, the thickness may be between about 0.1 microns and about 25 microns. In other implementations, the thickness may be between about 0.1 microns and about 10 microns. In other implementations, thickness may be between 0.1 microns and about 5 microns. In other implementations, the thickness may be less than 5 microns.

The various semiconductor die disclosed herein may include various die sizes. Die size generally refers to measured principal dimensions of the perimeter of the die. For example, for a rectangular die that is a square, the die size can be represented by referring to a height and width (length and width) of the perimeter. In various implementations, the die size of the semiconductor die may be at least about 4 mm by about 4 mm where the perimeter of the die is rectangular. In other implementations, the die size may be smaller. In other implementations, the die size of the semiconductor die may be about 211 mm by about 211 mm or smaller. For die with a perimeter that is not rectangular, the surface area of the largest planar surface of die may be used as a representation of the die size.

One of the effects of thinning the semiconductor die is that as the thickness decreases, the largest planar surfaces of the die may tend to warp or bend in one or more directions as the thinned material of the die permits movement of the material under various forces. Similar warping or bending effects may be observed where the die size becomes much larger than the thickness of the die for large die above about 6 mm by about 6 mm or 36 mm$^2$ in surface area. These forces include tensile forces applied by stressed films, stress created through backgrinding, forces applied by backmetal formed onto a largest planar surface of the die, and/or forces induced by the structure of the one or more devices formed on and/or in the semiconductor die. This warping or bending of the thinned semiconductor die can prevent successful processing of the die through the remaining operations needed to form a semiconductor package around the die to allow it to ultimately function as, by non-limiting example, a desired electronic component, processor, power semiconductor device, switch, or other active or passive electrical component. Being able to reduce the warpage below a desired threshold amount may permit the die to be successfully processed through the various operations, including, by non-limiting example, die bonding, die attach, package encapsulating, clip attach, lid attach, wire bonding, epoxy dispensing, pin attach, pin insertion, or any other process involved in forming a semiconductor package. In various implementations the warpage of the die may need to be reduced to less than about 50 microns measured across a largest planar surface of the die between a highest and lowest point on the largest planar surface.

In other implementations, by non-limiting example, where an assembly process involves Au—Si eutectic die attach, the warpage of the die may need to be reduced to less than about 25 microns when measured across a largest planar surface of the die. In other implementations, by non-limiting example, where a die attach process utilizing solder paste is used, the warpage of the die may need to be reduced to about 75 microns or less. In various implementations, the warpage of the die may be reduced to below about 200 microns or less. In implementations where larger die are used, more warpage may be tolerated successfully in subsequent packaging operations, so while values less than 25 microns may be desirable for many die, depending on die size, more warpage than about 25, than about 50, than about 75 microns, or up to about 200 microns may be capable of being tolerated.

In various implementations, the warpage may be measured using various techniques. For example, a capacitative scanning system with two probes that utilize changes in the capacitance for each probe when a die or wafer is inserted into the gap between the probes to determine a wafer thickness and/or position can be utilized to map the warpage of a die or wafer. An example of such a capacitive system that may be utilized in various implementations may be the system marketed under the tradename PROFORMA 300ISA by MTI Instruments Inc. of Albany, N.Y. In other implementations, the warpage may be measured by a laser profilometer utilizing confocal sensors marketed under the tradename ACUITY by Schmitt Industries, Inc. of Portland, Oreg. In other implementations, any of the following shape/profile measurement systems marketed by Keyence Corporation of America of Itasca, Ill. could be employed to measure die or wafer warpage: the reflective confocal displacement sensor system marketed under the tradename CL-3000, the 2D laser profiling system marketed under the tradename LJ-V7000, or the 3D interferometric sensing system marketed under the tradename WI-5000.

Referring to FIG. 58, an implementation of a temporary die support structure (temporary die support) 574 is illustrated coupled to a semiconductor die 576. In this implementation, the temporary die support 574 is coupled to and coextensive with a perimeter 578 of a largest planar surface 580 of the die 576. However, and as described in this document, the shape of the perimeter 578 may be a wide variety of shapes, including, by non-limiting example, rectangular, triangular, polygonal, elliptical, circular, or any other closed shape. The temporary die support structure works to support the die during die packaging operations. Furthermore, the temporary die support structure 574 may include two or more portions, which will be described in this document.

In the implementation illustrated in FIG. 58, the temporary die support structure includes a material that is applied to the first largest planar surface 580 of the thinned semiconductor die 576. The material reduces the warpage of the thinned semiconductor die in any of a wide variety of ways, such as, by non-limiting example, having a predetermined hardness value, having a predetermined stiffness value, having a predetermined Shore value, having a predetermined glass transition temperature, having a predetermined cure strength, having a predetermined thickness, having a predetermined film stress, curing at a particular temperature, curing with a particular temperature ramp profile, curing using specific light wavelengths, including one or more fillers, including one or more resins, or any other compound formation process parameter, mold compound ingredient, film parameter capable of affecting the warpage of the thinned semiconductor die. While a single layer of material is illustrated as being used as the temporary die support in FIG. 58, in other implementations two or more layers of material may be employed to form the die support which contain either the same or different material compositions. These two or more layers may be applied simultaneously or sequentially in various implementations.

A wide variety of forms of materials may be employed in various implementations of temporary die supports, including, by non-limiting example, a coating (which may be applied, by non-limiting example, through painting, sputtering, evaporating, electroplating, electroless plating, or spraying or any other method of coating), a tape, a film, a printed structure, a screen printed structure, a stencil printed structure, an adhesive bonded structure, or any other material form capable of being removably or releaseably coupled with the surface of a semiconductor die. A wide variety of material types may be employed in various implementations of temporary die supports, including, by non-limiting example, polyimides, polybenzoxazoles, polyethylenes, metals, benzocyclobutenes (BCBs), photopolymers, adhesives, and any other material or combination of materials capable of being removably or releaseably coupled with a semiconductor die.

A wide variety of shapes and structures may be employed as temporary die support structures in various implementations that may employ any of the material types, material forms, material parameters, or film parameters disclosed in this document to reduce the warpage of a thinned die to any of the desired levels disclosed in this document. In various implementations, the flexural strength of the temporary die support material may be a factor to be considered. Flexural strength is the ability of the temporary die support material to resist plastic deformation under load. Plastic deformation occurs when the temporary die support material no longer will return to its original dimensions after experiencing the load.

Referring to FIG. 59, an implementation of a temporary die support 582 is illustrated after a first layer 584 has been applied to the largest planar surface 586 of semiconductor die 588. A second layer 590 is illustrated being coupled over the first layer 584. In various implementations, the materials of the first layer 584 and the second layer 590 may be the same or different. Also, in some implementations, the first layer 584 may be remain permanently coupled to the die 588 as a permanent die support structure while just the second layer 590 is removable therefrom. In other implementations, however, both the first layer 584 and the second layer 590 are removable or releasable from the die 588.

Referring to FIG. 60, an implementation of a temporary die support structure 592 is illustrated that includes two C-shaped or U-shaped portions, a first portion 594 and a second portion 596. The first portion 594 and second portion 596 are separated by a gap along each side of the semiconductor die 598. The material of the die support structure 592 in this implementation is included in the first portion 594 and second portion 596 and may be any material disclosed for use in a temporary die support structure disclosed in this document. While the first portion 594 and second portion 596 are coupled to a top largest planar surface 598 of the die 600, in other implementations, they may be coupled to a bottom largest planar surface 602. In other implementations, the U- or C-shaped first portion 594 and second portion 596 are coupled just across or over the thickness 602 of the semiconductor die 600.

Referring to FIG. 61, an implementation of a temporary die support structure 604 is illustrated. In this implementation, the structure 604 is formed of two intersecting lines of material, which are illustrated to be asymmetric in at least one axis. In other implementations, however, the shape of the temporary die support structure 604 may be symmetric about one or all axes. The location along the upper or lower planar surfaces of the semiconductor die 606 at which the structure 604 is coupled to the die 606 may be determined by calculations based on, by non-limiting example, die size, die surface area, die shape, localized film properties, localized stress gradients, location(s) of semiconductor devices on/within the die, die thickness, die thickness uniformity, and any other parameter affecting the warpage of a semiconductor die. Also, in this implementation of a temporary die support structure 604, the length, orientation, and or position of each of the projections 608, 1086, 1090, 614 of the structure 604 may be calculated and/or determined using any of the previously mentioned parameters affecting the warpage of the die 606. In other implementations of a temporary die may be X-shaped, but have a different side wall profile having rounded side walls rather than straight or substantially straight side walls. In various implementations, the side wall profile of the temporary die support 604 may also be calculated/determined using any of the previously mentioned parameters that affect the warpage of the die 606.

Referring to FIG. 62, an implementation of a temporary die support 1092 is illustrated which takes the form of a rod/long rectangle with straight or substantially straight side walls. As previously discussed, the profile of the side walls 1096, 620 may be changed to assist in reducing the warpage of the die 622 as can the location of the support 1092 and its orientation relative to the perimeter 624 of the die 622. In various implementations, the rod may not be straight, but may be curved in one or more places to form, by non-limiting example, a C-shape, a U-shape, an S-shape, an N-shape, a M-shape, a W-shape, or any other curved shape formed from one continuous piece of material.

Figure 63:
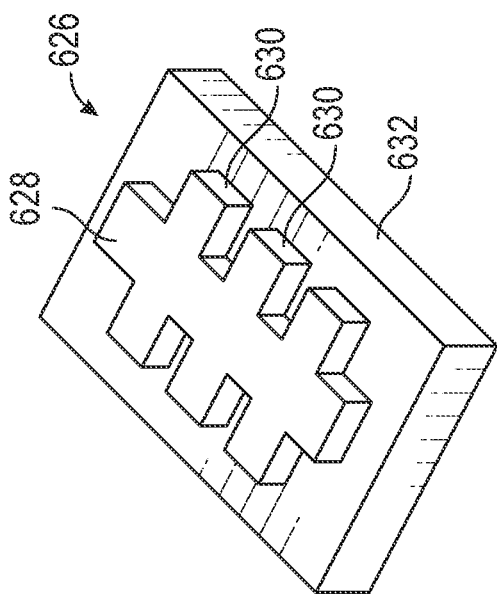
FIG. 63 is a perspective view an implementation of a temporary die support with a central portion with ribs extending therefrom.

Referring to FIG. 63, an implementation of a temporary die support 626 is illustrated which contains a central portion 628 from which a plurality of ribs 630 project. The number location, and position of the ribs 630 along the central portion 628 may be determined/calculated using any of the previously discussed parameters that affect the warpage of the die 632. The side wall profile of any or all of the ribs 630 and/or the central portion 628 may also be calculated in a similar way using the previously discussed parameters.

Figure 64:
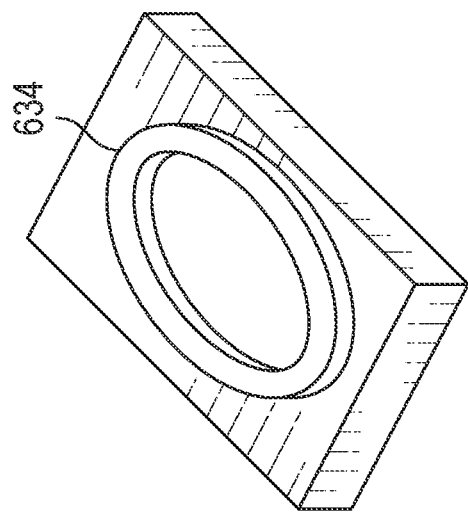
FIG. 64 is a perspective view of an implementation of a temporary die support with an elliptical shape.
Figure 70:
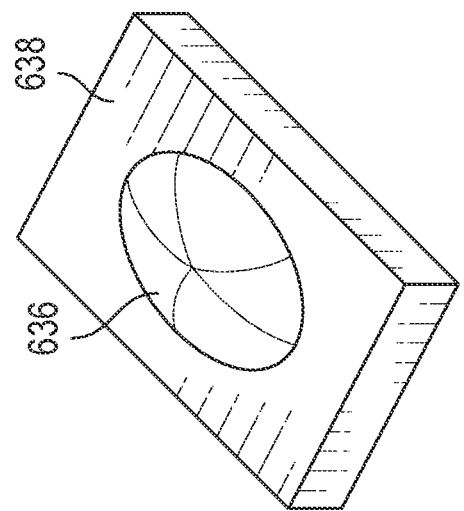
FIG. 70 is a perspective view of an implementation of a temporary die support including an elliptical shape.

In various implementations, the temporary die support need not be a shape with straight edges/lines, but, like the implementation of a temporary die support 634 illustrated in FIG. 64, may include an elliptical or spherical shape. In this implementation, the die support 634 is in the shape of an oval ring. In other implementations, however, as illustrated in FIG. 70, the overall three-dimensional shape of the die support 636 is dome-shaped as the side wall profile of the support 636 is rounded. In other implementations, however, the overall three-dimensional shape of the support 636 may be, by non-limiting example, cylindrical with straight side walls, conical with angled side walls, frustoconical with straight side walls and a flat upper surface, or any other three dimensional shape that is formed by projecting an elliptical cross-sectional shape upward from the surface of die 638.

Figure 65:
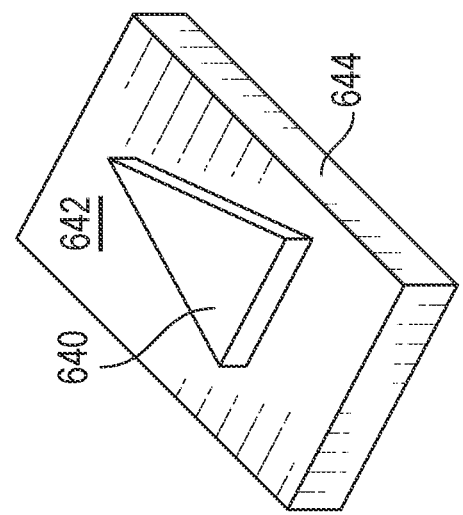
FIG. 65 is a perspective view of an implementation of a temporary die support with a triangular shape.

Referring to FIG. 65, an implementation of a temporary die support 640 that is triangular is illustrated. For those supports 640 that are triangular, the shape of the triangle may be acute, right, obtuse, equilateral, isosceles, or scalene in various implementations. As in the previously discussed, the side wall profile of the triangle and the placement of the temporary die support 640 along the largest planar surface 642 of the semiconductor die 644 may be determined by any of the previously mentioned parameters that affect the warpage of the die 644.

Figure 66:
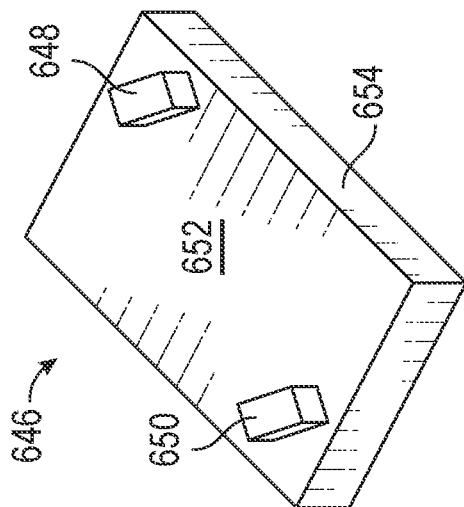
FIG. 66 is a perspective view of an implementation of a temporary die support having two portions.

In various implementations, the temporary die support can include more than one portion that is not directly attached to any other portion. Referring to FIG. 66, an implementation of a temporary die support 646 with a first portion 648 and a second portion 650 that are separately coupled to the largest planar surface 652 of semiconductor die 654. In this implementation, the specific placement, sizing, and side wall profile of each of the portions 648, 650 may be determined by any of the previously mention parameters affecting warpage of the die 654. While in the temporary die support 646 implementation illustrated in FIG. 66, the first portion 648 and second portion 650 are coupled to the largest planar surface 652, in other implementations, the different portions may be coupled on/at the thickness of the semiconductor die or on different sides of the die 654.

Figure 69:
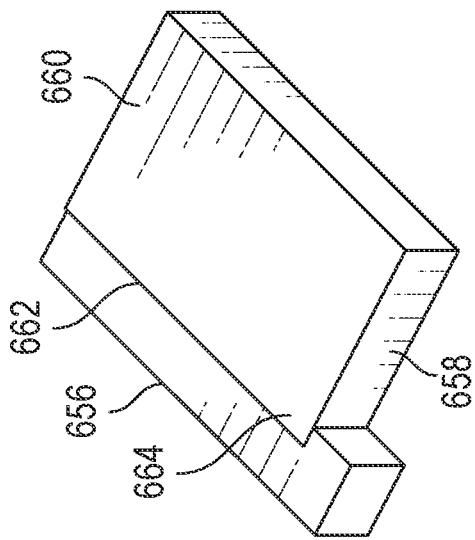
FIG. 69 is a perspective view of an implementation of a temporary die support coupled along a side and around a corner of a semiconductor die.

In other implementations of temporary die supports coupled on/at the thickness of the die, only a single portion may be utilized. Referring to FIG. 69, an implementation of a temporary die support 656 is illustrated that is coupled on the thickness 658 of semiconductor die 660 and extends fully along one side 662 of die 660 and contains a portion that wraps around corner 664 of the die. In this implementation, the length of the portion that wraps around the corner 664 may be determined by the degree to which warpage on that side/corner/edge of the die 660 needs to be minimized in various implementations. In other implementations, referring to FIG. 67, an implementation of a temporary die support 666 is illustrated coupled along only one side 668 of die 670 at the thickness 672 of the die 670. The extent to which the temporary die supports extend along the die sides and around corners may depend on any of the previously mentioned parameters that affect the warpage of the die. In other implementations, more than one a single portion that extends along just one side of the die at the thickness may be employed such as portions on alternate sides of the die, portions on three sides of the die, or portions on two sides of the die.

Figure 68:
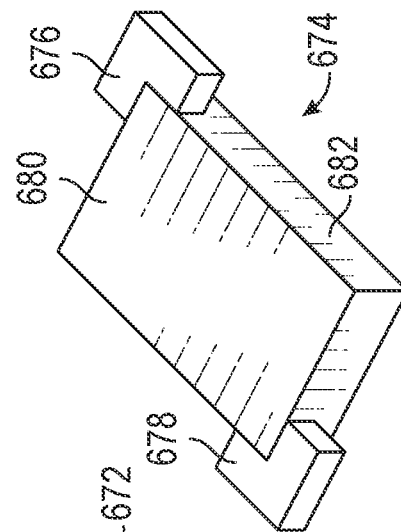
FIG. 68 is a perspective view of an implementation of a temporary die support with two portions each coupled around a corner of a semiconductor die.
Figure 67:
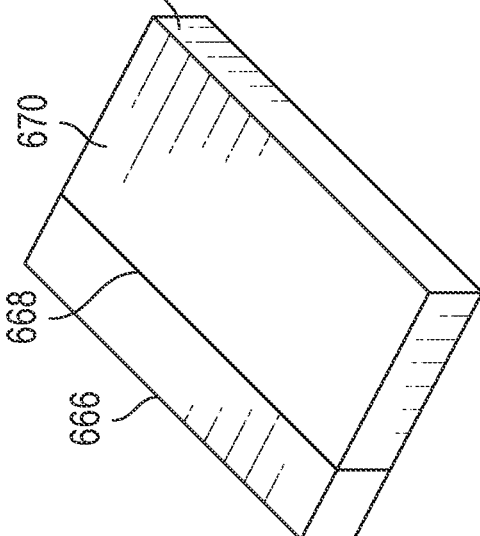
FIG. 67 is a perspective view of an implementation of a temporary die support coupled along a side of a semiconductor die.

FIG. 68 illustrates an implementation of a temporary die support 674 that includes first and second portions 676, 678 respectively coupled around two corners of the semiconductor die 680 at the thickness 682 of the die. In other implementations, a temporary die support structure could also include two portions coupled at the thickness at the midpoint of each side of a semiconductor die. While the portions of the temporary die support structures illustrated in FIGS. 67 and 68 are rectangular, in other implementations, the portions may take a variety of other shapes. For example, the portions could take on a semicircular shape each coupled along the entire side of the semiconductor die. In other implementations, the temporary support structure could be coupled at the thickness along an entire length of two sides of the semiconductor die and then to each other at two points. Where the semiconductor die is triangular, the temporary die support structure may include three triangularly shaped portions each triangularly shaped as well coupled at the thickness along a side of the die. In all of these implementations of temporary die supports which are coupled at the thickness at or along a side of the die, the dimensions and materials of the supports may be selected using any of the previously mentioned parameters that affect the warpage of the die.

Figure 71:
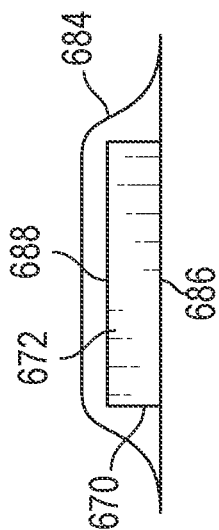
FIG. 71 is a side view of an implementation of a temporary die support coupled over a semiconductor die.
Figure 72:
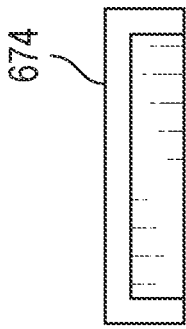
FIG. 72 a side view of an implementation of a conformal temporary die support coupled over a semiconductor de.

Referring to FIG. 71, in various implementations of temporary die supports like those disclosed herein, the temporary die support material 684 may enclose one, both, or partially fully enclose both of the largest planar surfaces 686, 688 and the thickness 670 of a semiconductor die 672. In the implementation illustrated in FIG. 71, the largest planar surface 688 and the surfaces on the thickness 670 are enclosed. Since the temporary die support is intended to be removably/releaseably coupled with the die, generally the die support does not fully encloses all six sides of the die (in the case of a rectangular die). However, in some implementations where the temporary die support can be sequentially etched prior to and after die bonding, fully enclosing temporary die supports could potentially be used. The number of sides covered/partially covered by the temporary die support depends on the desired warpage values. In some implementations where the temporary die support 684 completely covers one or more sides of the die, one or more openings may be provided in/formed in the temporary die support through the material of the temporary die support 684 to allow electrical or physical connections with the die. In various implementations, the temporary die support material may be conformal, or conform to the shape of the die over which the material is coupled, as illustrated by the temporary die support 674 of FIG. 72. In other implementations, the die support material may be non-conformal or partially non-conformal forming its own shape rather than assuming part of the shape of the die as in the temporary die support 684 of FIG. 71. In various implementations, the temporary die support material may be applied as a coating to the semiconductor die.

Figure 74:
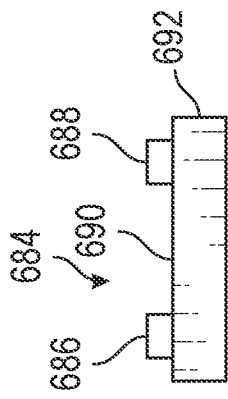
FIG. 74 is a side view of an implementation of a temporary die support with two portions coupled on a largest planar surface of a semiconductor die.
Figure 73:
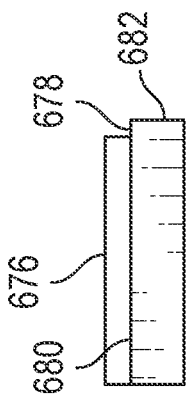
FIG. 73 is a side view of an implementation of a temporary die support coupled partially on a largest planar surface of a semiconductor die.

Referring to FIGS. 73 and 74, side views of two implementations of temporary support structures are illustrated. In FIG. 73, an implementation of a temporary support structure 676 is illustrated that does not coextensive with the perimeter 678 of the largest planar surface 680 of a semiconductor die 682. In FIG. 74, an implementation of a temporary support structure 684 with two portions 686, 688 is illustrated indicating their position along the largest planar surface 690 of the semiconductor die 692. FIG. 83 illustrates a side view of a semiconductor die 694 with a temporary support structure 696 that includes a first layer 698 coupled on one side of the die 694 and a second layer 700 coupled on a second side of the die 694. The materials of each of the first layer 698 and 700 may be different from each other, enabling control of the warpage of the die 694 to a desired value. FIG. 84 illustrates another implementation of a temporary support structure 702 coupled to die 704 where the structure 702 includes two layers, a first layer 706 coextensive with the perimeter 708 of the die 704 and a second layer 710 coupled over the first layer 706 and containing an elliptical opening 712 therein. The dimensions, size, and positioning of opening 712 may be used to allow minimization of the warpage of the die 704 to a desired level. While a single elliptical opening in the second layer 710 is illustrated, in other implementations, multiple openings and/or openings with any closed shape may be employed in various implementations.

Referring to FIG. 76, a top view of a temporary die support 714 is illustrated that has a first portion 716 and a second portion 718 that are curved and mirrored with respect to each other. The spacing and radius of curvature of the first portion 716 and second portion 718 may be varied to assist with controlling the warpage of the die 720. While the first portion 716 and second portion 718 are illustrated as being symmetrically arranged on the die 720 and mirrored, in other implementations, they may be asymmetrically arranged and/or not mirrored, each with different radiuses of curvature.

Referring to FIG. 77, an implementation of a temporary die support structure 722 similar to FIG. 61 is illustrated from a side view, but where thickness of the support 722 varies across the support. Here the center 724 of the support is thinner than the outer edges 726 of the support 722. In various implementations the reverse could be true and in other implementations the thickness may vary regularly or irregularly across the temporary support depending upon the desired warping control effect.

In the various implementations of temporary die support structures disclosed herein, a thickness of the support structure may be thicker than a thickness of the die. Such a situation is illustrated in the side view in FIG. 85, where the thickness 728 of die 730 is much thinner than the thickness 732 of the temporary die support 734. A wide variety of combinations of temporary die support thicknesses, layer thicknesses used in temporary die supports, and die thicknesses may be constructed using the principles disclosed in this document.

The various implementations of temporary die support structures disclosed herein may be formed using various methods of forming a die support structure. In a particular method implementation, the method includes temporarily coupling a material with a semiconductor die. This material may be any material disclosed in this document used to form a temporary die support structure. The semiconductor die may be any type disclosed herein that includes two largest planar surfaces with a thickness between the surfaces and the thickness may be any thickness disclosed in this document. The semiconductor device(s) included on the semiconductor die may be any disclosed in this document. At the time where the material is temporarily coupled with the semiconductor die, the material may be coupled with any, all, or any combination of a first largest planar surface, a second largest planar surface, or the thickness. The method includes reducing a warpage of the semiconductor die to less than 50 microns through the coupling the material. In particular implementations the method may include reducing a warpage of the semiconductor die to less than 25 microns.

As disclosed in this document, in various method implementations, the method includes temporarily coupling two or more portions of material to the semiconductor die to one, all, or any combination of the first largest planar surface, the second largest planar surface, or the thickness. In various method implementations, the method may include temporarily coupling a second layer of material over material permanently or temporarily coupled with the semiconductor die. Additional layers beyond the second layer may also be coupled over the second layer in various method implementations.

In various method implementations, the point in a semiconductor die's processing where the temporary die support structure is coupled may vary from implementation to implementation. In some method implementations, the point at where the temporary die support structure is applied may occur before or after the semiconductor die has been physically singulated from among the plurality of semiconductor die being formed on the semiconductor substrate.

In various method implementations, the temporary die support structure may be employed before any singulation processes have been carried on for the plurality of die (or at an intermediate step while the substrate still remains in physical form). Referring to FIG. 75, a plurality of temporary die support structures 734 are illustrated distributed across a semiconductor substrate that takes the form of a wafer 736. In this implementation, the temporary die support structures are aligned, one per die.

In various method implementations, the temporary die support may be coupled prior to or after probing of the individual die. Similarly, the temporary die supports may be applied to a plurality of die on a semiconductor substrate prior to or after probing the plurality of die.

In various method implementations, no precut or partial grooving between the plurality of die of a semiconductor substrate may be carried out. Where the plurality of die will be thinned, the depth of the die/saw streets/scribe lines may be sufficient to carry out the various methods of forming semiconductor packages disclosed herein. For example, and with reference to FIG. 86, where the substrate 738 will be thinned to about 10 microns, the about 5 micron depth of the die streets 740 into the material of the substrate/die resulting from the processing steps that form the plurality of semiconductor die 742 suffices to act as the equivalent of any partial grooving/precutting. In particular method implementations, the depth of the die streets can be increased during the die fabrication process. In other particular method implementations, the depth of the die streets may be increased during die preparation/packaging processes following die fabrication. In this way, any separate precut or partial grooving of the wafer using a saw or other process may be rendered unnecessary. Avoiding separately precutting/partial grooving may facilitate the sawing process and/or eliminate risk of sidewall cracking due to coefficient of thermal expansion (CTE) mismatches. While using the depth of the die streets to set sidewall coverage of mold compound rather than the depth of a precut into the semiconductor substrate may reduce the partial sidewall coverage for each die 742 of the plurality of die, the benefits may outweigh the additional coverage in various method implementations.

In various method implementations, temporary die support structures may be coupled to the plurality of die while the semiconductor substrate while it is at full thickness, or, in other words, prior to any thinning operations being performed. Additional thinning operations can then be initiated with the temporary die support structures in place. Also, for those processes where precut/grooving operations take place prior to thinning, these steps can take place after coupling of the temporary die support structures.

In various method implementations, the temporary die support structures 208 may be coupled over a plurality of die 746 after thinning is performed, as illustrated in the semiconductor substrate 748 of FIG. 78. In other implementations, the temporary die support structures 744 may be applied over the plurality of die 746 after backmetal layer(s) have been applied to the semiconductor substrate. In yet other method implementations, the temporary die support structures 744 may be applied over the plurality of die 746 after the semiconductor substrate 748 has been only partially thinned, such as, by non-limiting example, through removing backside oxide prior to probing, an initial grinding step prior to a polishing/lapping step, or any other process which partially removes a layer of material or bulk material from the side 750 of the semiconductor substrate 748 opposite the die 746.

In various method implementations, the temporary die support structures 744 may be applied over the plurality of semiconductor die 746 after a full backgrinding process is carried out but prior to or after a stress relief wet etching process has been carried out. In such implementations, the stress relief wet etching may be carried out with or without backmetal. In some implementations, the stress relief wet etching make take place after protecting the front side (die side) of the semiconductor substrate. The stress relief etching may reduce the backside damage to the semiconductor substrate that is caused by the backgrinding process. The use of the stress relief etching may also facilitate adhesion of the backmetal applied to the ground surface. In various implementations, the application of the temporary die support structures may be carried out prior to a backmetal formation process. A wide variety of sequences of method steps involving coupling of temporary die support structures may be carried out using the principles disclosed in this document for packaging process involving wafer scale operations like those disclosed in this document used for semiconductor substrates.

Referring to FIG. 79, the temporary die support structures 752 may be applied to the thinned die 754 after die singulation but before die picking while the thinned die 754 are still supported on dicing tape 756. A wide variety of potential options may exist for the timing of when the temporary support structures may be applied to the die during wafer scale packaging operations.

Similarly to the timing of applying temporary die support structures during methods of wafer scale packaging a plurality die, the timing may vary in various implementations of chip scale packaging a die. For example, the temporary die support structure may be applied as the first step following die picking from a singulation tape, or immediately following die singulation prior to picking. In other method implementations, the temporary die support structure may be applied at or just prior to a later step in the process, such as, by non-limiting example, die attach, die underfilling, flux washing, epoxy cure, prior to a full encapsulating step, after lead frame attach, or any other chip scale packaging process operation. In various implementations, the temporary die support may generally be applied prior to die attach, as after die attach there may be no further need for the temporary die support. A wide variety of sequences of method steps involving coupling a temporary die support structure may be employed in various method implementations using the principles disclosed in this document.

A wide variety of methods and processes may be employed to remove the temporary die supports from the die at the point in the process where the temporary supports are no longer needed. Referring to FIG. 80, an implementation of a temporary die support 758 is being illustrated while being peeled off of the surface of die 760 after or during exposure from light source 762. This light source may be, by non-limiting example, a visible light source, an infrared light source, an ultraviolet light source, a laser light source, or any other source of light capable of acting to release or assist in releasing the temporary die support. For example, if the temporary die support was a UV release tape, then the support could be peeled from the surface of the thinned die following exposure to a UV light source for a predetermined period of time after the thinned die had been attached to, by non-limiting example, a substrate, leadframe, another die, a lead, a redistribution layer, any combination thereof, or any other die bonding structure.

Referring to FIG. 81, a temporary die support 764 is illustrated being etched from a die 766 using a plasma etching source 768. While a plasma etching source 768 is illustrated in FIG. 81, any other etching process could be employed in various implementations, including, by non-limiting example, a wet etching process, a spray etching process, a reactive ion etching process, an ion bombardment process, a lasering process, a grinding process, or any other process capable of reacting away or ablating the material of the temporary die support.

In other implementations, the temporary die support may be removed using energy assisting processes. Referring to FIG. 82, an implementation of a temporary die support 770 is illustrated separating from thinned die 772 in a bath 774 under ultrasonic energy produced by ultrasonic energy source 776. Under the influence of the compression waves in the fluid of the bath 774, the temporary die support 770 may separate without requiring any pulling force, or the peeling of the temporary die support 770 may be enabled by the ultrasonic energy. While the use of a bath 774 is illustrated, in various implementations a puddle may be used. In still other implementations, the ultrasonic energy may be directly or indirectly applied to the die 772 through a spindle, a chuck, a plate, or a liquid stream. In various implementations, the source of sonic energy 776 may range from about 20 kHz to about 3 GHz. Where the sonic frequencies utilized by the ultrasonic energy source 776 are above 360 kHz, the energy source may also be referred to as a megasonic energy source. In particular implementations, the sonic energy source 776 may generate ultrasonic vibrations at a frequency of 40 kHz at a power of 80 W. In various implementations, the sonic energy source 776 may apply a frequency of between about 30 kHz to about 50 kHz or about 35 kHz to about 45 kHz. However, in various implementations, frequencies higher than 50 kHz may be employed, including megasonic frequencies. A wide variety of power levels may also be employed in various implementations.

In various semiconductor package and method implementations disclosed in this document, any of the pads or electrical connectors disclosed in this document may be formed, by any or any combination of the following: evaporation, sputtering, soldering together, screen printing, solder screen printing, silver sintering one or more layers of materials. Any of the foregoing may also be used in combination with electroplating or electroless plating methods of forming pads and/or electrical connectors.

Figure 87:
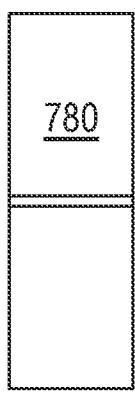
FIG. 87 is a top view of two semiconductor die joined through a die street/scribe line/saw street.

Referring to FIG. 87, an implementation of two thinned semiconductor die 778 is illustrated. Various implementations of groups of thinned semiconductor die disclosed in this document may be formed from a wide variety of semiconductor substrate types, including, by non-limiting example, silicon, polysilicon, silicon-on-insulator, glass, sapphire, ruby, gallium arsenide, silicon carbide, and any other semiconductor material type. Also, various implementations of groups of thinned semiconductor die may include die of any of a wide variety of shapes, including, by non-limiting example, rectangular, elliptical, triangular, polygonal, or any other closed shape. The various implementations of groups of thinned semiconductor die disclosed herein may include any of a wide variety of electronic devices, including, by non-limiting example, integrated bipolar junction transistors (IGBTs), metal oxide semiconductor field effect transistors (MOSFETs), diodes, power semiconductor devices, any semiconductor device disclosed in this document, any combination thereof, or any other active or passive semiconductor device or component, alone or in combination. As illustrated with reference to FIGS. 87 and 88, the two semiconductor die 778 collectively form a first largest planar surface 780 and a second largest planar surface 782 with thickness 784 between them. Because the shape formed by the two semiconductor die 778 is a rectangle, four additional sides 786, 788, 790, and 792 extend across the thickness 784.

In various implementations disclosed herein, the thickness 784 of the groups of thinned semiconductor die may be between about 0.1 microns and about 125 microns. In other implementations, the thickness may be between about 0.1 microns and about 100 microns. In other implementations, the thickness may be between about 0.1 microns and about 75 microns. In other implementations, the thickness may be between about 0.1 microns and about 50 microns. In other implementations, the thickness may be between about 0.1 microns and about 25 microns. In other implementations, the thickness may be between about 0.1 microns and about 10 microns. In other implementations, thickness may be between 0.1 microns and about 5 microns. In other implementations, the thickness may be less than 5 microns.

The groups of various semiconductor die disclosed herein may form groups of various sizes (die sizes). Die size generally refers to measured principal dimensions of the perimeter of the shape formed by a particular group of semiconductor die. For example, for a group of two rectangular die that collectively have a perimeter shaped like a square, the die size can be represented by referring to a height and width of the perimeter. In various implementations, the die size of the group of semiconductor die may be at least about 4 mm by about 4 mm where the perimeter of the group of die is rectangular. In other implementations, the die size may be smaller. In other implementations, the die size of the group of semiconductor die may be about 211 mm by about 211 mm or smaller. For a group of die with a perimeter that is not rectangular, the surface area of the largest planar surface of the group of die may be used as a representation of the die size.

One of the effects of thinning the groups of semiconductor die is that as the thickness decreases, the largest planar surfaces of the groups of semiconductor die may tend to warp or bend in one or more directions as the thinned material of the die permits movement of the material under various forces. Similar warping or bending effects may be observed where the die size becomes much larger than the thickness of the die for large groups of die above about 6 mm by about 6 mm or 36 mm$^2$ in surface area. These forces include tensile forces applied by stressed films, stress created through backgrinding, forces applied by backmetal formed onto a largest planar surface of the die, and/or forces induced by the structure of the one or more devices formed on and/or in the semiconductor die. This warping or bending of the thinned groups of semiconductor die can prevent successful processing of the die through the remaining operations needed to form a semiconductor package around the die to allow it to ultimately function as, by non-limiting example, a desired electronic component, processor, module, power semiconductor device, switch, or other active or passive electrical component. Being able to reduce the warpage below a desired threshold amount may permit the groups of die to be successfully processed through the various operations, including, by non-limiting example, die bonding, die attach, package encapsulating, clip attach, lid attach, wire bonding, epoxy dispensing, pin attach, pin insertion, or any other process involved in forming a semiconductor package. In various implementations the warpage of the group of die may need to be reduced to less than about 50 microns measured across a largest planar surface of the die between a highest and lowest point on the largest planar surface. In other implementations, by non-limiting example, where an assembly process involves Au—Si eutectic die attach, the warpage of the group of die may need to be reduced to less than about 25 microns when measured across a largest planar surface of the group of die. In other implementations, by non-limiting example, where a die attach process utilizing solder paste is used, the warpage of the group of die may need to be reduced to about 75 microns or less. In various implementations, the warpage of the group of die may be reduced to below about 200 microns or less. In implementations where larger die are used, more warpage may be tolerated successfully in subsequent packaging operations, so while values less than 25 microns may be desirable for many groups of die, depending on die size, more warpage than about 25, than about 50, than about 75 microns, or up to about 200 microns may be capable of being tolerated.

In various implementations, the warpage may be measured using various techniques. For example, a capacitative scanning system with two probes that utilize changes in the capacitance for each probe when a group of die or wafer is inserted into the gap between the probes to determine a wafer thickness and/or position can be utilized to map the warpage of a die or wafer. An example of such a capacitive system that may be utilized in various implementations may be the system marketed under the tradename PROFORMA 300ISA by MTI Instruments Inc. of Albany, N.Y. In other implementations, the warpage may be measured by a laser profilometer utilizing confocal sensors marketed under the tradename ACUITY by Schmitt Industries, Inc. of Portland, Oreg. In other implementations, any of the following shape/profile measurement systems marketed by Keyence Corporation of America of Itasca, Ill. could be employed to measure die or wafer warpage: the reflective confocal displacement sensor system marketed under the tradename CL-3000, the 2D laser profiling system marketed under the tradename LJ-V7000, or the 3D interferometric sensing system marketed under the tradename WI-5000.

Figure 88:
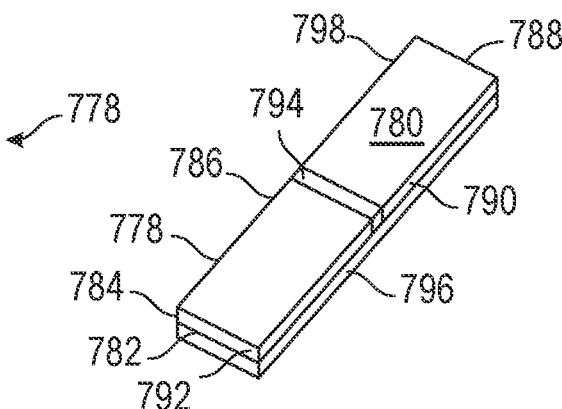
FIG. 88 is a perspective view of the two semiconductor die of FIG. 87 coupled with an implementation of a permanent die support structure coupled with a lower largest planar surface.

Referring to FIG. 88, the two semiconductor die are illustrated coupled together through die street 794. In such an implementation, the two semiconductor are formed through singulating all of the die streets around the two die except for the one that couples the two die together. As illustrated in FIG. 88, an implementation of a permanent die support structure (permanent die support, die support) 796 is illustrated coupled to the two semiconductor die 778. In this implementation, the die support 796 is coupled to and coextensive with a perimeter 798 of a largest planar surface 4 of the two semiconductor die 778. However, and as described in this document, the shape of the perimeter 798 may be a wide variety of shapes, including, by non-limiting example, rectangular, triangular, polygonal, elliptical, circular, or any other closed shape. The permanent die support structure 18 works to support the two semiconductor die during die packaging operations. Furthermore, the permanent die support structure 796 may include two or more portions, which will be described in this document.

In various implementations disclosed in this document, where two or more semiconductor die are packaged together which are intended to be electrically isolated from each other, one or more isolation trenches may be formed between the two more semiconductor die. These isolation trenches may take various forms in different implementations. By non-limiting example, an isolation trench may be formed by etching or ablating a trench structure into the material of the die street between the two more semiconductor die and then filling the trench with an electrically insulating material, such as, by non-limiting example, an oxide, an organic material, a mold compound, any combination thereof, or any other electrically insulating material. In another non-limiting example, the isolation trench may be formed by etching or ablating a series of holes (vias) into the material of the die street between the two or more semiconductor die and then filling the vias with an electrically insulating material like any disclosed herein. A wide variety of isolation trench structures may be formed using the principles disclosed herein to ensure electrical isolation between semiconductor die that are packaged together while joined by a die street region.

Figure 89:
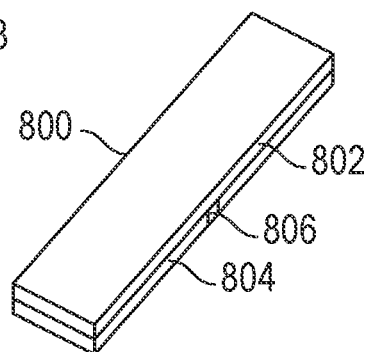
FIG. 89 is a perspective view of the two semiconductor die of FIG. 87 coupled with an implementation of a temporary die support structure coupled with an upper largest planar surface.

While in the implementation illustrated in FIG. 88 the die support structure 796 is a permanent die support structure, in other implementations of die support structures disclosed in this document, the die supports structures may be temporary. Referring to FIG. 89, an implementation of a temporary die support structure 800 coupled to an upper planar surface 802 of a group 804 of two semiconductor die is illustrated. Like the die of FIG. 87 and FIG. 88, the two semiconductor die are coupled together through die street 806. The temporary die support structure 800 is designed to be removably/releaseably coupled to the group of die 804 and reduce the warpage of the group of die during die packaging operations.

In the implementations illustrated in FIGS. 88 and 89, the permanent die support structure 796 and the temporary die support structure 800 each include a material that is applied to the first largest planar surface of their respective group of thinned semiconductor die. The material reduces the warpage of the group of thinned semiconductor die in any of a wide variety of ways, such as, by non-limiting example, having a predetermined hardness value, having a predetermined stiffness value, having a predetermined Shore value, having a predetermined glass transition temperature, having a predetermined cure strength, having a predetermined thickness, having a predetermined film stress, curing at a particular temperature, curing with a particular temperature ramp profile, curing using specific light wavelengths, including one or more fillers, including one or more resins, or any other compound formation process parameter, mold compound ingredient, film parameter capable of affecting the warpage of the thinned semiconductor die. While a single layer of material is illustrated as being used as the permanent die support in FIG. 88 or the temporary die support in FIG. 89, in other implementations two or more layers of material may be employed to form the die support which contain either the same or different material compositions. These two or more layers may be applied simultaneously or sequentially in various implementations.

A wide variety of forms of materials may be employed in various implementations of temporary die supports, including, by non-limiting example, a coating (which may be applied, by non-limiting example, through painting, sputtering, evaporating, electroplating, electroless plating, or spraying or any other method of coating), a tape, a film, a printed structure, a screen printed structure, a stencil printed structure, an adhesive bonded structure, or any other material form capable of being removably or releaseably coupled with the surface of a semiconductor die. A wide variety of material types may be employed in various implementations of temporary die supports, including, by non-limiting example, polyimides, polybenzoxazoles, polyethylenes, metals, benzocyclobutenes (BCBs), photopolymers, adhesives, and any other material or combination of materials capable of being removably or releaseably coupled with a semiconductor die.

In various implementations, the material of the permanent die supports disclosed in this document may be mold compounds. In various implementations, the mold compound is not a polyimide material or other material generally specifically used to act as a passivating material for a semiconductor die surface. The mold compound may include any of a wide variety of compounds, including, by non-limiting example, encapsulants, epoxies, resins, polymers, polymer blends, fillers, particles, thermally conductive particles, electrically conductive particles, pigments, and any other material capable of assisting in forming a stable permanent supporting structure. In some implementations the mold compound may be non-electrically conductive (insulative). In other implementations, the mold compound may be electrically conductive, such as an anisotropic conductive film. In such implementations where the mold compound is electrically conductive, the mold compound is not a metal, but rather is formed as a matrix containing electrically conductive materials, such as, by non-limiting example, metal particles, graphene particles, graphite particles, metal fibers, graphene fibers, carbon fibers, carbon fiber particles, or any other electrically conductive particle or fiber. In various implementations, the mold compound may be a material which has a flexural strength of between about 13 N/mm$^2$ to 185 N/mm$^2$. Flexural strength is the ability of the mold compound to resist plastic deformation under load. Plastic deformation occurs when the mold compound no longer will return to its original dimensions after experiencing the load. For those implementations of permanent die support structures, flexural strength values of the mold compound to be used may generally be selected so that the chosen mold compound has sufficient flexural strength at the maximum expected operating temperature to avoid plastic deformation.

A wide variety of shapes and structures may be employed as permanent or temporary die support structures in various implementations that may employ any of the material types, material forms, material parameters, or film parameters disclosed in this document to reduce the warpage of a group of thinned die to any of the desired levels disclosed in this document.

Figure 90:
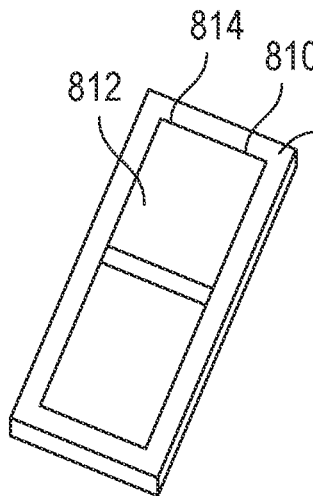
FIG. 90 is a perspective view of the two semiconductor die of FIG. 87 coupled with an implementation of a die support structure coupled at a thickness.

Referring to FIG. 90, an implementation of a permanent die support structure 808 that is coupled at the thickness 810 of a group of semiconductor die 812. In this implementation, the permanent die support structure 808 extends continuously around the thickness/perimeter 810/814 of the group of die 812. In this implementation, having the permanent die support structure 808 around the thickness 810 of the die 812 may reduce the warpage of the die 812 to a desired level like any disclosed in this document.

Figure 91:
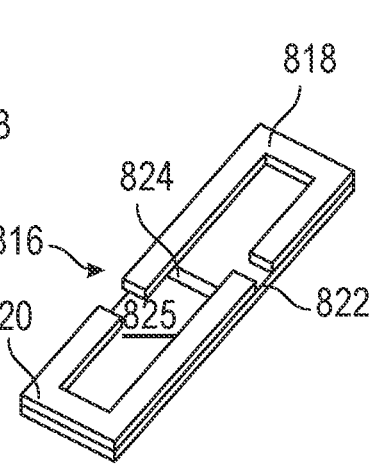
FIG. 91 is a perspective view of an implementation of a die support structure that includes a first portion and a second portion coupled to a largest planar surface of two semiconductor die.

Referring to FIG. 91, an implementation of a permanent die support structure 816 is illustrated that includes two C-shaped or U-shaped portions, a first portion 818 and a second portion 820. The first portion 818 and second portion 820 are separated by a gap along each side of the group of semiconductor die 822 which are coupled through die street 824. The material of the die support structure 816 in this implementation is included in the first portion 818 and second portion 820 and may be any material disclosed for use in a permanent die support structure disclosed in this document. In other implementations, the two C-shaped or U-shaped portions may alternatively be coupled across or over the thickness the group of semiconductor die. In other implementations, the U- or C-shaped first portion and second portion may be coupled to the lower largest planar surface of the group of semiconductor die rather than the upper largest planar surface 825. The same two U- or C-shaped structures may also be employed as a temporary die support for a group of thinned semiconductor die in the same various coupling locations previously described in various implementations.

Figure 92:
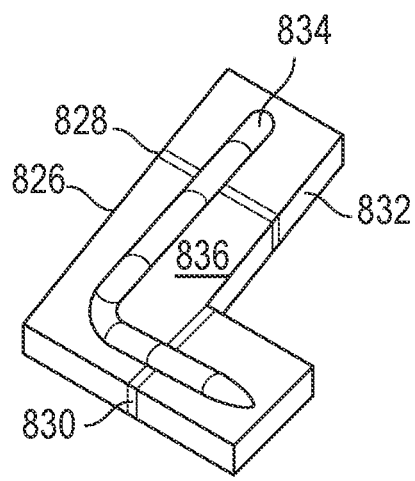
FIG. 92 is a perspective view of an implementation of a die support structure that is coupled along a largest planar surface of three semiconductor die.

Referring to FIG. 92, a group of three semiconductor die 826 is illustrated coupled through die streets 828, 830 where at least one of the die has a different individual die and the group has a non-rectangular shape to its perimeter 832. An implementation of a temporary die support 834 is coupled to the upper largest planar surface 836 of the group of die 826. In this implementation, the temporary die support 834 is used to maintain the warpage of the group of die 826 below a desired value until the group of die are attached to a substrate and the need for the temporary die support 834 is no longer needed and it is removed.

Figure 93:
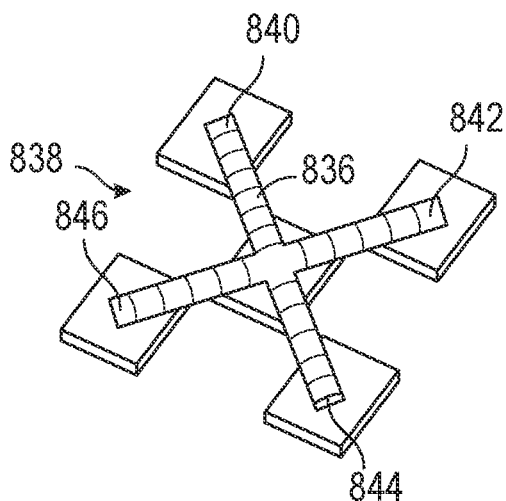
FIG. 93 is a perspective view of an implementation of an X-shaped die support structure coupled to five semiconductor die.

Referring to FIG. 93, an implementation of a permanent die support structure 836 is illustrated. In this implementation, the structure 836 is formed of two intersecting lines of material, which are illustrated to be symmetric in at least one axis. In other implementations, however, the shape of the permanent die support structure 58 may be asymmetric about one or all axes. The locations along the upper or lower planar surfaces of the group of five semiconductor die 838 at which the structure 836 is coupled to the die 838 may be determined by calculations based on, by non-limiting example, individual die size, individual die surface area, individual die shape, localized film properties, localized stress gradients, location(s) of semiconductor devices on/within the die, die thickness, die thickness uniformity, and any other parameter affecting the warpage of an individual semiconductor die. Also, in this implementation of a permanent die support structure 836, the length, orientation, and or position of each of the projections 840, 842, 844, 846 of the structure 836 may be calculated and/or determined using any of the previously mentioned parameters affecting the warpage of a group of die. In FIG. 93, the permanent die support is illustrated with rounded side walls. However, in various implementations, different side wall profiles having straight or substantially straight side walls may be employed. In various implementations, the side wall profile of the permanent die support 836 may also be calculated/determined using any of the previously mentioned parameters that affect the warpage of a group of semiconductor die disclosed in this document. Various implementations of temporary die support structures may also utilize any of the aforementioned permanent die structures.

Various permanent and temporary die support implementations may take the form of a rod/long rectangle with straight or substantially straight side walls. As previously discussed, the profile of the side walls may be changed to assist in reducing the warpage of the group of semiconductor die as can the location of the support and its orientation relative to the perimeter of the die. In various implementations, the rod may not be straight, but may be curved in one or more places to form, by non-limiting example, a C-shape, a U-shape, an S-shape, an N-shape, an M-shape, a W-shape, or any other curved or angled shape formed from one continuous piece of material (see FIG. 92).

In other implementations of permanent or temporary die supports like those disclosed in this document, die support structures with a central portion from which a plurality of ribs project may be utilized. The number, location, and position of the ribs along the central portion may be determined/calculated using any of the previously discussed parameters that affect the warpage of the group of die. The side wall profile of any or all of the ribs and/or the central portion may also be calculated in a similar way using the previously discussed parameters.

Figure 94:
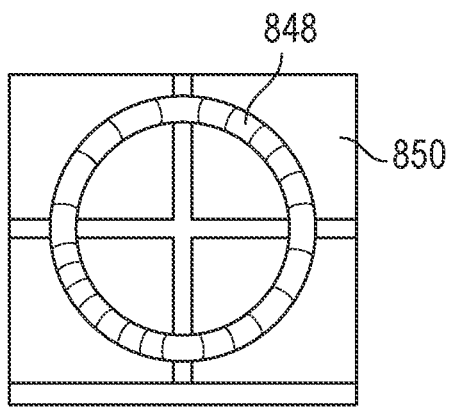
FIG. 94 is a top view of an implementation of an elliptically shaped die support structure coupled to four semiconductor die.

In various implementations, the temporary or permanent die support need not be a shape with straight edges/lines, but, like the implementation of a temporary die support 848 illustrated in FIG. 94, may include an elliptical or spherical shape. In this implementation, the overall three-dimensional shape of the die support 848 is that of a rounded ring as the side wall profile of the material of the ring is rounded. In other implementations, however, the overall three-dimensional shape of the support 848 may be, by non-limiting example, a ring with straight or substantially straight sidewalls, cylindrical with straight side walls, conical with angled side walls, frustoconical with straight side walls and a flat upper surface, or any other three dimensional shape that is formed by projecting an elliptical cross-sectional shape upward from the surface of a group of die 850.

In various implementations of temporary or permanent die supports, various triangular shapes may be utilized. For those supports that are triangular, the shape of the triangle may be acute, right, obtuse, equilateral, isosceles, or scalene in various implementations. As in the previously discussed, the side wall profile of the triangle and the placement of the die support along the largest planar surface of a group of semiconductor die may be determined by any of the previously mentioned parameters that affect the warpage of the group of die.

Figures 95, 96, 97:
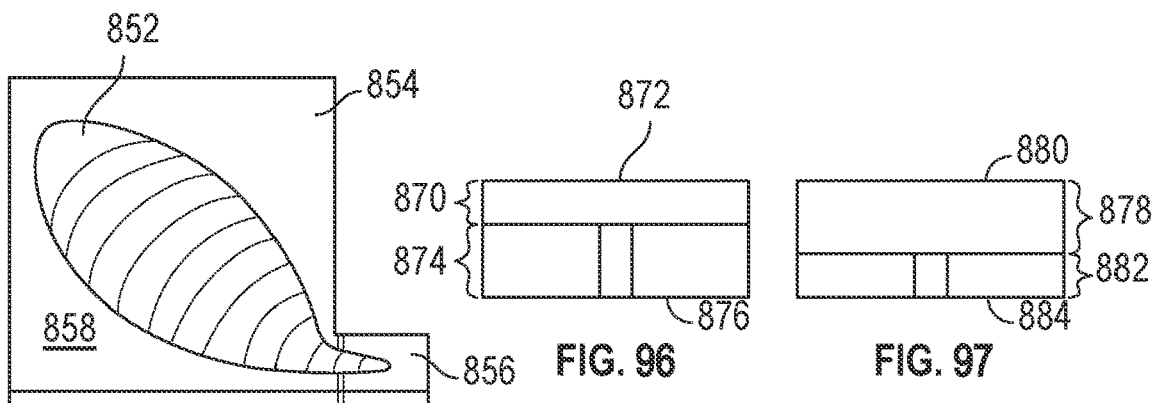
FIG. 95 is a top view of an implementation of an irregularly shaped die support structure coupled to two semiconductor die of different sizes.
FIG. 96 is a side view of an implementation of a die support structure coupled to two semiconductor die where the die support is thinner than the thickness of the two semiconductor die.
FIG. 97 is a side view of an implementation of a die support structure coupled to two semiconductor die where the die support is thicker than the thickness of the two semiconductor die.

Referring to FIG. 95, in various implementation of temporary or permanent die supports the shape of the die support 852 may be irregular as determined by what is calculated to minimize the warpage of a particular configuration of multiple die. In the implementation illustrated, the two die 854, 856 are of different sizes, and so the die support 852 is designed to contact both but in different locations in order to minimize the warpage of the largest planar surface 858 of the group of die. The sidewall profile of the die support 852, like previously discussed, is rounded as determined by what is needed to minimize the warpage of the largest planar surface 858.

In various implementations, the permanent or temporary die support can include more than one portion that is not directly attached to any other portion (see FIG. 91). In various implementations, the specific placement, sizing, and side wall profile of each of the portions may be determined by any of the previously mentioned parameters affecting warpage of a group of die. While in implementation illustrated in FIG. 91, the first portion 818 and second portion 820 are coupled to the largest planar surface 825, in other implementations the different portions may be coupled on/at the thickness of the group of semiconductor die in a manner similar to the implementation illustrated in FIG. 90. In some implementations, first, second, third, and fourth portions may be coupled around each corner of the group of semiconductor die at the thickness of the group. In other implementations, four portions may be included but may be coupled at the thickness at the midpoint of each side of the group of semiconductor die. In various implementations, portions coupled at the thickness may take a variety of other shapes, including, by non-limiting example, semicircular, triangular, square, angled, or any other closed shape. In other implementations, a single permanent or temporary die support structure may be coupled along a side of the group of semiconductor die at the thickness; in others, the single permanent or temporary die support structure may be coupled on a side and may wrap around one or more corners formed by the group of semiconductor die.

Referring to FIG. 104, an implementation of a permanent die support 860 is illustrated coupled over two die 862. In this implementation, the die support 860 takes the form of a frame 868 with curved sections 864, 866 extending across the largest planar surface of the two die 862. The radius of curvature of the curved sections 864, 866 may be determined by any of the various parameters that govern warpage disclosed in this document. While the curved sections 864, 866 are illustrated as being symmetrically distributed about the frame 868, in various implementations they may be, by non-limiting example, asymmetric about one or more axes, have different radii of curvature, extend from any side of the frame, include one or more sections, extend nearly across the dimension of the frame, or be placed as determined by any of the parameters that control warpage of groups of die disclosed in this document.

In various implementations of permanent die supports like those disclosed herein, a permanent die support material may fully enclose both of the largest planar surfaces and the thickness of a group of semiconductor die. Whether the die support fully encloses all six sides of the group (in the case of a rectangularly shaped group of die) depends on the desired warpage values. In such implementations where the permanent die support completely covers one or more sides of the group of die, one or more openings may be provided in/formed in the permanent die support through the material of the permanent die support to allow electrical or physical connections with one or more of the group of die. In various other implementations, permanent or temporary die support material may extend over the thickness and one of the two largest planar surfaces of the group of semiconductor die. In such implementations, electrical and physical connections made be formed via the exposed largest planar surface and/or through openings in the material of the die support. A wide variety of possible configurations may be constructed to form electrical and physical connections with a group of semiconductor die to which a permanent or temporary die support like any disclosed in this document using the principles disclosed herein. In various implementations, the permanent die support material may be conformal, or conform to the shape of the die over which the material is coupled. In other implementations, the die support material may be non-conformal forming its own shape rather than assuming part of the shape of the die. In various implementations, the permanent die support material may be applied as a coating to the semiconductor die.

Referring to FIG. 96, in various implementations, a thickness 870 of the die support material 872 may be thinner than a thickness 874 of the group of die 876. In other implementations, as illustrated in FIG. 97, a thickness 878 of the die support material 880 may be thicker than a thickness 882 of the group of die 884. The particular thickness and uniformity of the thickness of the die support material over the surfaces of the group of die may be determined using any of the factors influencing the warpage of a group of die disclosed herein.

The various implementations of permanent and temporary die support structures disclosed herein may be formed using various methods of forming a die support structure. In a particular method implementation, the method includes permanently or temporarily coupling a material with a two or more semiconductor die. This material may be a mold compound or any other material disclosed in this document used to form a permanent die support structure. This material may also be any material disclosed in this document used to form a temporary die support structure. The group of semiconductor die may be any type disclosed herein that includes two largest planar surfaces with a thickness between the surfaces and the thickness may be any thickness disclosed in this document. The semiconductor device(s) included on the group of semiconductor die may be any disclosed in this document. At the time where the material is permanently or temporarily coupled with the group of semiconductor die, the material may be coupled with any, all, or any combination of a first largest planar surface, a second largest planar surface, or the thickness. The method includes reducing a warpage of a largest planar surface of the group of semiconductor die to less than 50 microns through the coupling the material. In particular implementations the method may include reducing a warpage of a largest planar surface of the group of semiconductor die to less than 25 microns.

As disclosed in this document, in various method implementations, the method includes permanently or temporarily coupling (or temporarily and permanently coupling in some implementations) two or more portions of material to the group of semiconductor die to one, all, or any combination of the first largest planar surface, the second largest planar surface, or the thickness. In various method implementations, the method may include permanently or temporarily coupling a second layer of material over the material originally permanently coupled with the semiconductor die. Additional layers beyond the second layer may also be coupled over the second layer in various method implementations.

In various method implementations, the point in a group of semiconductor die's processing where the permanent die support structure is coupled may vary from implementation to implementation. In some method implementations, the point at where the permanent die support structure is applied may occur before or after the group of semiconductor die has been physically singulated from among the plurality of semiconductor die being formed on a semiconductor substrate. Similarly, in various method implementations, the point in processing where a temporary die support structure is coupled may vary from implementation to implementation. In some implementations the temporary die support may be attached prior to attachment of the group of die to a substrate or other attachment structure, at which point the temporary die support is removed.

Figure 98:
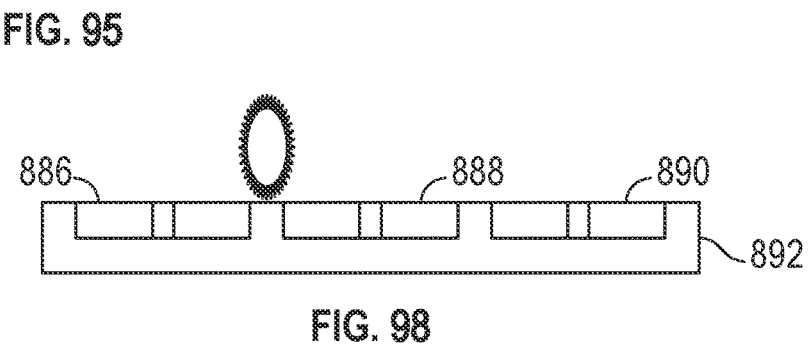
FIG. 98 is a side view of an implementation of a permanent die support structure formed of a mold compound coupled to multiple groups of two semiconductor die during a singulation process.

Referring to FIG. 98, an implementation of three groups of semiconductor die 886, 888, 890 are illustrated coupled together in a permanent die support 892 which is composed of a mold compound. In this implementation, the three groups 886, 888, 890 were molded into the permanent die support 892 at the same time. Following formation of the permanent die support 892, the groups 886, 888, 890 are singulated from each other using any of a wide variety of process, including, by non-limiting example, sawing (illustrated), lasering, jet ablating, etching, plasma etching, and any other singulating method. Following singulation the groups 886, 888, 890 are then used in subsequent die packaging operations.

Figure 99:
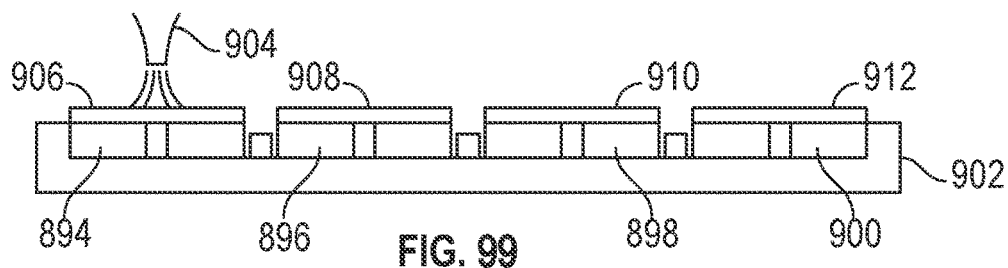
FIG. 99 is a side view of a plurality of die support structures being applied to a plurality of groups of two semiconductor die using a jig.

Referring to FIG. 99, four groups of semiconductor die 894, 896, 898, 900 are illustrated placed into a jig/mold/guide 902 which is designed to retain the groups in a place. As illustrated, a dispensing process 904 is being used to apply a temporary die support structure 906, 908, 910, 912 over each of the groups. Following the dispensing, the groups 894, 896, 898, 900 are then removed from the jig 902 and used in subsequent die packaging operations. The various implementations, the jig/mold/guide 902 may include various vacuum/air pressure ports/openings designed to hold the groups in a desired location and/or retain the groups in a desired warpage value until the temporary die support has been applied/formed. Various curing steps may also be carried out to cure/harden the material of the temporary die supports 906, 908, 910, 912 while the groups are retained in the jig 902.

Figure 100:
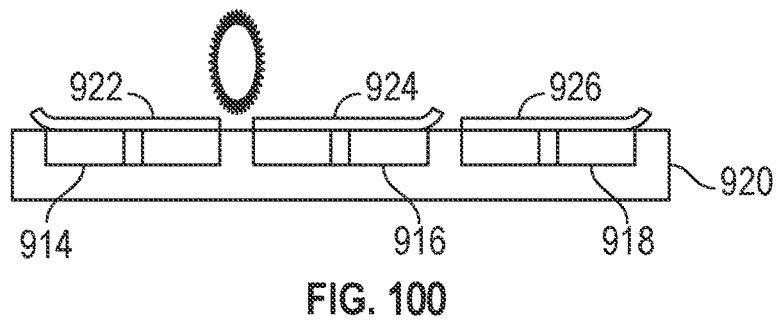
FIG. 100 is a side view of the plurality of groups of two semiconductor die of FIG. 99 after coupling with a permanent die support structure showing removal of a temporary die support prior to a singulation process.

Referring to FIG. 100, three groups of semiconductor die 914, 916, 918 are illustrated after molding into a permanent die support 920 while being supported by temporary die supports 922, 924, 926. As illustrated, the temporary die supports 922, 924, 926 are now being peeled from the surface of each of the three groups 922, 924, 926 in preparation for a singulation process (in this case, sawing) like any disclosed in this document.

In various method implementations, the temporary or permanent die supports may be coupled prior to or after probing of the individual die/groups of die. Similarly, the temporary or permanent die supports may be applied to a plurality of die on a semiconductor substrate prior to or after probing the plurality of die/groups of die.

Figure 101:
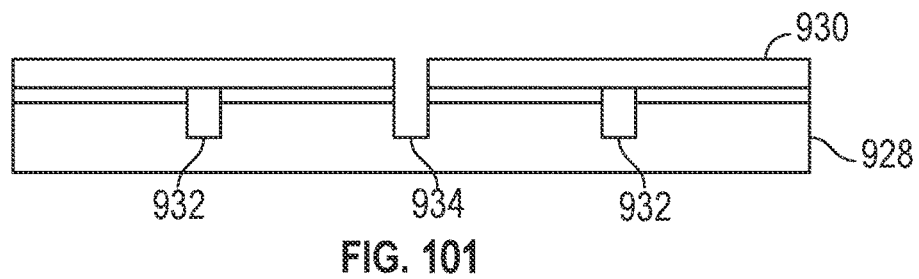
FIG. 101 is a side view of a thinned semiconductor substrate showing a die support structure coupled over two groups of two semiconductor die showing a plurality of die streets.

In various method implementations, no precut or partial grooving between the plurality of die of a semiconductor substrate (or groups of die) may be carried out. Where the plurality of die (or groups of die) will be thinned, the depth of the die/saw streets/scribe lines may be sufficient to carry out the various methods of forming semiconductor packages disclosed herein. For example, and with reference to FIG. 101, where the semiconductor substrate 928 will be thinned to about 10 microns, the about 5 micron depth of the die streets 932 into the material of the substrate/die resulting from the processing steps that form the groups of semiconductor die suffices to act as the equivalent of any partial grooving/precutting. In various implementations, as illustrated in FIG. 101, permanent or temporary die support structures 930 may be applied over the groups of die leaving specific die streets 934 exposed for subsequent processing.

In particular method implementations, the depth of the exposed die streets 934 can be increased during the die fabrication process. In other particular method implementations, the depth of the exposed die streets may be increased during die preparation/packaging processes following die fabrication. In this way, any separate precut or partial grooving of the wafer using a saw or other process may be rendered unnecessary. Avoiding separately precutting/partial grooving may facilitate the sawing process and/or eliminate risk of sidewall cracking due to coefficient of thermal expansion (CTE) mismatches. While using the depth of the die streets to set sidewall coverage of mold compound rather than the depth of a precut into the semiconductor substrate may reduce the partial sidewall coverage for each group of die, the benefits may outweigh the additional coverage in various method implementations.

In various method implementations, temporary or permanent die support structures may be coupled to the plurality of die while the semiconductor substrate while it is at full thickness, or, in other words, prior to any thinning operations being performed. Additional thinning operations can then be initiated with the temporary or permanent die support structures in place. Also, for those processes where precut/grooving operations take place prior to thinning, these steps can take place after coupling of the temporary or permanent die support structures.

In various method implementations, temporary or permanent die support structures may be coupled over groups of die after thinning is performed. In other implementations, the temporary or permanent die support structures may be applied over the groups of die after backmetal layer(s) have been applied to the semiconductor substrate. In yet other method implementations, the temporary or permanent die support structures may be applied over the groups of die after the semiconductor substrate has been only partially thinned, such as, by non-limiting example, through removing backside oxide prior to probing, an initial grinding step prior to a polishing/lapping step, or any other process which partially removes a layer of material or bulk material from the side of the semiconductor substrate opposite the die.

In various method implementations, the temporary or permanent die support structures may be applied over the groups of semiconductor die after a full backgrinding process is carried out but prior to or after a stress relief wet etching process has been carried out. In such implementations, the stress relief wet etching may be carried out with or without backmetal. In some implementations, the stress relief wet etching may take place after protecting the front side (die side) of the semiconductor substrate. The stress relief etching may reduce the backside damage to the semiconductor substrate that is caused by the backgrinding process. The use of the stress relief etching may also facilitate adhesion of the backmetal applied to the ground surface. In various implementations, the application of the temporary or permanent die support structures may be carried out prior to a backmetal formation process. A wide variety of sequences of method steps involving coupling of temporary or permanent die support structures may be carried out using the principles disclosed in this document for packaging process involving wafer scale operations like those disclosed in this document used for semiconductor substrates.

Referring to FIG. 102, temporary or permanent die support structures 938 may be applied to a thinned semiconductor substrate 936 prior to singulation of the various groups of die. In other implementations, temporary or permanent die support structures may be coupled with the groups of thinned die after singulation but before picking of the groups of die while the thinned groups of die are still supported on dicing tape. A wide variety of potential options may exist for the timing of when the temporary or permanent support structures may be applied to the die during wafer scale packaging operations.

Similarly to the timing of applying temporary or permanent die support structures during methods of wafer scale packaging groups of die, the timing may vary in various implementations of chip scale packaging groups of die. For example, referring to FIG. 103, a temporary or a permanent die support structure 944, 946 may be applied individually to groups of die 940, 942. Temporary or permanent dies supports may be applied as the first step following die picking from a singulation tape, or immediately following die singulation prior to picking. In other method implementations, a temporary or permanent die support structure may be applied at or just prior to a later step in the process, such as, by non-limiting example, die attach, die underfilling, flux washing, epoxy cure, prior to a full encapsulating step, after lead frame attach, or any other chip scale packaging process operation. In various implementations, temporary die supports may generally be applied prior to die attach, as after die attach there may be no further need for the temporary die support. A wide variety of sequences of method steps involving coupling a temporary or permanent die support structures may be employed in various method implementations using the principles disclosed in this document.

A wide variety of methods and processes may be employed to remove the temporary die supports from groups of die at the point in the process where the temporary supports are no longer needed. Various implementations of a temporary die supports may be peeled off of the surface of groups of die after or during exposure from a light source. This light source may be, by non-limiting example, a visible light source, an infrared light source, an ultraviolet light source, a laser light source, or any other source of light capable of acting to release or assist in releasing the temporary die support. For example, if the temporary die support was a UV release tape, then the support could be peeled from the surface of the group of thinned die following exposure to a UV light source for a predetermined period of time after the group of thinned die had been attached to, by non-limiting example, a substrate, leadframe, another die, a lead, a redistribution layer, any combination thereof, or any other die bonding structure.

In various implementations, temporary die supports may be etched from a group of die using a plasma etching source. While a plasma etching source may be used, any other etching process could be employed in various implementations, including, by non-limiting example, a wet etching process, a spray etching process, a reactive ion etching process, an ion bombardment process, a lasering process, a grinding process, or any other process capable of reacting away or ablating the material of the temporary die support.

In other implementations, the temporary die support may be removed using energy assisting processes. In various implementations, a temporary die support may be separated from a group of thinned die in a bath under ultrasonic energy produced by ultrasonic energy source. Under the influence of the compression waves in the fluid of the bath, the temporary die support may separate without requiring any pulling force, or the peeling of the temporary die support may be enabled by the ultrasonic energy. While the use of a bath 774 is illustrated, in various implementations a puddle may be used. In still other implementations, the ultrasonic energy may be directly or indirectly applied to the group of die through a spindle, a chuck, a plate, or a liquid stream. In various implementations, the source of sonic energy may range from about 20 kHz to about 3 GHz. Where the sonic frequencies utilized by the ultrasonic energy source are above 360 kHz, the energy source may also be referred to as a megasonic energy source. In particular implementations, the sonic energy source may generate ultrasonic vibrations at a frequency of 40 kHz at a power of 80 W. In various implementations, the sonic energy source may apply a frequency of between about 30 kHz to about 50 kHz or about 35 kHz to about 45 kHz. However, in various implementations, frequencies higher than 50 kHz may be employed, including megasonic frequencies. A wide variety of power levels may also be employed in various implementations.

In various semiconductor package and method implementations disclosed in this document, any of the pads or electrical connectors disclosed in this document may be formed, by any or any combination of the following: evaporation, sputtering, soldering together, screen printing, solder screen printing, silver sintering one or more layers of materials. Any of the foregoing may also be used in combination with electroplating or electroless plating methods of forming pads and/or electrical connectors.

Referring to FIG. 105, an implementation of thinned die 948 is illustrated that includes an organic material 950 that extends across a thickness 952 of the die. As illustrated, the thinned die includes a backmetal 954 coupled over a second side 956 of the die. In this implementation, the thickness 952 of the die 948 may be between about 7 microns to about 20 microns. At the location 958 indicated on FIG. 105, the thinness of the organic material 950 at is where a solder joint will be formed during bonding of the package with a mother board. This thinness can result in a high stress area. The increase in stress during the formation of the solder joint can cause cracking of the joint and/or the die during package formation or during operation of the package, particularly where the die is very thin. In various implementations of the package illustrated, the organic material 950 may form a permanent die support with a structure like any disclosed in this document that permits the warpage of the thinned die 948 to be controlled to any of the warpage values disclosed in this document. While the use of the permanent die support and/or the organic material 950 may allow for control of the warpage and provide support to the thinned die 948, the ability to thicken the thickness of the die around the edge of the die reduce the stress of subsequent joints may improve performance and/or long-term reliability.

The method implementations disclosed herein may be employed with die that are full thickness (not thinned) and with die that are thinned. In various implementations, the initial steps of processing a semiconductor substrate containing a plurality of die may be those disclosed in this document, particularly those method implementation illustrated in FIGS. 16, 19, 21, and 23. Referring to FIG. 16, a detail cross sectional view implementation of a semiconductor substrate 960 is illustrated after processing through the formation of a plurality of notches 962, applying an organic material 964 over the first side 966 of the substrate 960, and then thinning of the organic material to the height of electrical connectors 968 using any thinning method disclosed herein. Any organic material disclosed herein used as an encapsulant or die support material may be employed in various method implementations. In this view, the detail focuses on a single semiconductor die for the purposes of illustration, but it is understood that the process steps illustrated are actually carried out simultaneously on multiple die included in the semiconductor substrate 960. Electrical connectors 968 were formed on the first side 966 of the semiconductor die prior to the application of the organic material.

In various method implementations, the semiconductor substrate 960 may be thinned using any method of thinning disclosed in this document as illustrated in the third figure in FIG. 16. In other method implementation, however, the semiconductor substrate 960 may not be thinned and may be processed at full thickness (particularly when the process of FIGS. 109-111 may be used). Referring to FIG. 107, the substrate 960 is illustrated following formation of a cavity 970 into each semiconductor die in the semiconductor substrate 960. In various implementations, the cavity 970 is formed through any etching process capable of etching the particular semiconductor material of the semiconductor substrate 960 (which may be any substrate material type disclosed herein). In various implementations, the cavity is etched following a patterning process which may be, by non-limiting example, a photolithographic patterning process, a passivation material patterning process, stencil printing, screen printing, lasering, or any other process of patterning. The depth of the cavity 970 into the material of the substrate 960 is set by the particular thickness desired. Because the sidewalls 972 of the cavity 970 remain at the thickness of the substrate 960 prior to the etching of the cavity 970, the depth of the cavity 970 can extend deeply into the material to create a largest planar surface 974 of the cavity 970 at a thinner remaining material thickness than could ordinarily be reached while keeping the semiconductor die capable of being processed through subsequent packaging operations. In various implementations, the remaining material thickness 976 may be, by non-limiting example, less than 5 microns, less than 1 micron, or less than 500 nanometers. Because the sidewalls 972 are at the original substrate thickness, the potential issues with joint stresses during subsequent packaging operations can be reduced. Also, the warpage of the die can be better controlled when higher stress films such as those that form a backmetal are coupled over the second side 978 of the substrate 960 as illustrated in FIG. 108. Where backmetal 980 is formed over the second side 978 of the substrate 960, the backmetal may be formed using any of the methods disclosed herein and may include any of the backmetal structures and backmetal material types disclosed in this document. Following application of the backmetal 980, the semiconductor substrate 960 is then singulated through the organic material 964 to form a plurality of semiconductor packages.

Referring to FIG. 109, another implementation of a semiconductor substrate 982 is illustrated which has been processed in accordance with the first two processes illustrated in FIG. 19 (forming of notches 984 into the material of the substrate and application of organic material 986 into the notches). As illustrated, the plurality of notches 984 extend only partly into the thickness of the substrate material. In the implementation illustrated in FIG. 109, the substrate 982 has been thinned toward the notches but not sufficiently to expose the organic material 986 in the notches as illustrated in the third figure in FIG. 19. In other implementations, however, no thinning may be carried out and the substrate 982 may be processed at full thickness. The thinning of the substrate 982 material may be carried out using any method and process disclosed in this document. In the implementation illustrated in FIG. 109, the organic material 986 has also been thinned to the height of electrical connectors 988 using any of the thinning methods disclosed herein.

Referring to FIG. 110, the substrate 982 is illustrated following formation of cavity 990 into the material of substrate 982. The cavity 990 may be formed using any of the methods disclosed previously and may have any remaining material thickness between the largest planar surface of the cavity and the first side of the substrate. FIG. 111 illustrates the substrate 982 after application of backmetal 992 to the cavity 990. Note that the application of backmetal is substantially conformal with the shape of the cavity 990 and includes coverage of the sidewalls 994. In other implementations, however, the backmetal may not be conformally deposited, leaving little of the backmetal on the sidewalls of the cavity 990 and a majority on the largest planar surface.

Following application of the backmetal 992, the substrate 982 is then singulated into a plurality of semiconductor die, each containing a cavity 990. Note that in the implementation illustrated in FIG. 11 the organic material 986 extends only partially down the thickness of the semiconductor die. Because the thickness of the edge of the die is thicker because of the thickness of the sidewalls, this implementation of a die may likewise exhibit the improved bonding properties discussed previously. However, in this implementation and in the other implementations disclosed in this document, solderable metal may not fully cover the entire bottom edge surface of the package. Furthermore, the ability to utilize the cavities may allow for minimum semiconductor substrate underactive area and/or increasing the package height to further reduce warpage without significantly increase $RDS_{on}$. Furthermore, the ability to remove solder from extending from under the edge of the package by allowing the solder to flow into the cavity may reduce the risk of solder spreading and causing shorts with adjacent packages/devices. This ability to reduce solder spreading may allow the packages to be placed on customer motherboards in closer proximity to each other.

Figure 112:
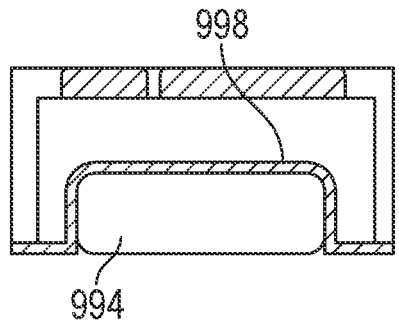
FIG. 112 is a side cross sectional view of an implementation of a thinned die with a filled cavity.
Figure 113:
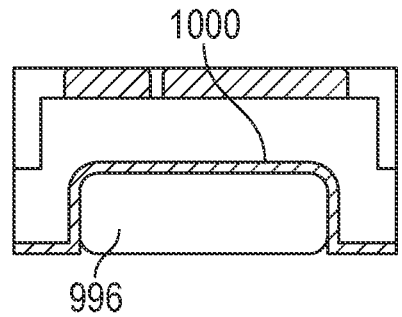
FIG. 113 is a side cross sectional view of another implementation of a thinned die with a filled cavity.

In both of the previously disclosed method implementations, additional method steps may be employed. Referring to FIGS. 112 and 113, in both method implementations following application of the backmetal, a conductive metal 994, 996 can be deposited/formed into the cavities 998, 1000, respectively. The conductive metal 994, 996 may be formed through, by non-limiting example, electroplating, electroless plating, solder printing, stencil printing, squeegee dispensing, solder screening, solder paste forming, solder preforms, or any other method of depositing/forming an electrically conductive material. In various implementations, the conductive metal 994, 996 may not extend all the way to the level of the mold compound along the sidewalls (in the case of the implementation illustrated in FIG. 112) or the die edge of the sidewalls (in the case of the implementation illustrated in FIG. 113). In various implementations, the use of the conductive metal 994, 996 may work to pattern the backside of the package so that the placement of the solder/solder flow around the package can be restricted/limited/controlled as desired In various implementations, the use of various conformal relief coatings between the sidewalls of the die and the conductive metal may be employed to isolate/reduce stresses between the conductive metal and the material of the die.

Figure 114:
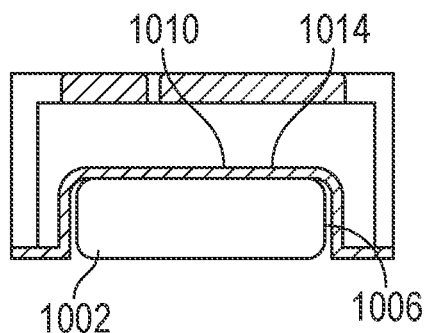
FIG. 114 is a side cross sectional view of an implementation of a thinned die with a filled cavity that does not include the cavity sidewalls.
Figure 115:
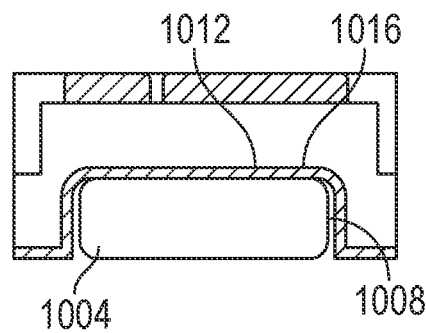
FIG. 115 is a side cross sectional view of another implementation of a thinned die with a filled cavity that does not include the cavity side walls.
Figure 116:
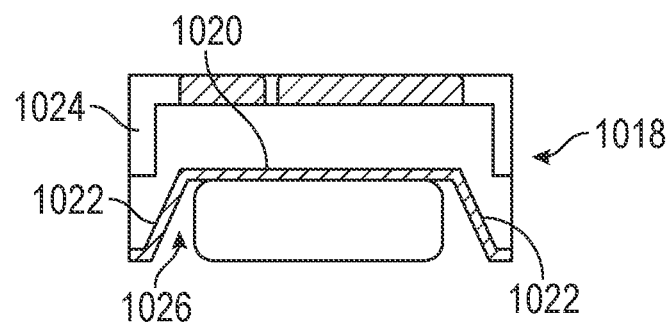
FIG. 116 is a side cross sectional view of another implementation of a thinned die with a filled cavity that has slanted side walls.

In various method implementations, the conductive metal may not actually contact/form on the backmetal on the sidewalls of the cavity. The implementations illustrated in FIGS. 114 and 115 show how the conductive metal 1002, 1004 is separated from the material of the sidewall by gaps 1006, 1008. In various method implementations, the gaps may be created by the patterning and etching the material of the conductive metal or through selectively depositing the interconnect material only onto the largest planar surfaces 1010, 1012 of the cavities 1014, 1016. The ability to leave gaps 1006, 1008 between the conductive metal 1002, 1004 may assist in reducing solder flow and/or assist with patterning the solder at the point where the package is attached to the motherboard. Referring to FIG. 116, an additional implementation of a semiconductor die 1018 is illustrated where the cavity 1020 has been formed with sloped sidewalls 1022. To form the sloped sidewalls, the method implementation illustrated in FIGS. 109-111 is utilized to allow the organic material 1024 to extend only partially across the thickness of the die 1018. By using the sloped sidewalls 1022, the gap 1026 is larger than in the implementations illustrated in FIGS. 114 and 115.

In the various method and die implementations that include cavities disclosed herein the organic material can be a permanent die support or temporary die support (or a combination of permanent and temporary die supports. The structure of the permanent and/or temporary die support may be any die support structure disclosed in this document. The permanent and/or temporary die support works to reduce the warpage of a thinned die to a desired level, which may be any disclosed in this document.

In some implementations, the notches may not be separately formed from the semiconductor substrate manufacturing process used to form the plurality of semiconductor die that are included in/on the semiconductor substrate. In such implementations the notches may be the die streets themselves. In various die street implementations, the depth of the die streets may extend about 1 to about 10 microns into the material of the semiconductor substrate. Where the semiconductor substrate is thinned to less than 25 microns thick, the die streets may provide sufficient depth into the semiconductor substrate to enable to the various semiconductor die to be singulated using die streets themselves. In such implementations, the subsequent processing disclosed herein may be carried out with the die streets functioning as the notches.

The present description includes, among other features, a through-substrate via structure having a conductive via structure extending from a first major surface to a first depth or distance, and a recessed region extending from a second major surface to a second depth or distance. In one implementation, the second depth is greater than the first depth. A conductive structure is electrically connected to the conductive via within the recessed portion, and the conductive structure is disposed at least along a sidewall surface of the recessed region. The present implementations provide for, among other things, a more robust and cost effective through-substrate via structure, which can be used for different applications including, for example, interposer structures or heat sinking structures.

More particularly, in one implementation, a through-substrate via structure comprises a substrate having a first major surface and a second major surface opposite to the first major surface. A conductive via structure comprises a trench extending from the first major surface to a first distance and a conductive material disposed within the trench. A recessed region is disposed extending from the second major surface inward to a second distance, and in one implementation, the recessed region is wider than the conductive via structure. A first conductive region is disposed at least adjacent and extending along a sidewall surface of the recessed region in cross-sectional view, and in one implementation, the first conductive region is physically connected to the conductive material. In some implementations, the conductive material comprises tungsten. In some implementations, the second distance is greater than the first distance. In some implementations, the first distance in less than 100 microns. In another implementation, the first distance is less than about 50 microns. In other implementations, the first distance is in a range from about 20 microns through about 40 microns. In further implementations, the first distance is in a range from about 10 microns through about 30 microns. In other implementations, the first conductive region is further disposed along at least portion of the second major surface. In another implementation, the conductive via structure further comprises an insulating structure disposed along a sidewall surface of the trench, and the insulating structure is interposed between the conductive material and the sidewall surface of the trench.

In another implementation, a through-substrate via structure comprises a substrate having a first major surface and a second major surface opposite to the first major surface. A conductive via structure comprises a trench extending from the first major surface to a first distance, an insulating structure is disposed along a sidewall surface of the trench, and a conductive material is disposed adjacent the insulating structure within the trench. A recessed region is disposed extending from the second major surface inward to a second distance, wherein the second distance is greater than the first distance. A first conductive region is disposed at least adjacent and extending along a sidewall surface of the recessed region in cross-sectional view, and in one implementation, the first conductive region is electrically connected to the conductive material.

In a further implementation, a method for forming a through-substrate via structure comprises providing a substrate having a first major surface and a second major surface opposite to the first major surface. The method includes providing a conductive via structure comprising a trench extending from the first major surface to a first distance, an insulating structure disposed along a sidewall surface of the trench, and a conductive material disposed adjacent the insulating structure within the trench. The method includes forming a recessed region disposed extending from the second major surface inward to a second distance, wherein the second distance is greater than the first distance. In one implementation, the second distance is more than twice the first distance. The method includes forming a first conductive region disposed at least adjacent and extending along a sidewall surface of the recessed region in cross-sectional view, and in one implementation, the first conductive region is electrically coupled to the conductive material. In some implementations, providing the conductive via structure includes providing the first distance less than about 100 microns. In some implementations, the method includes forming an insulating layer between first conductive region and the substrate within the recessed region.

Figure 117:
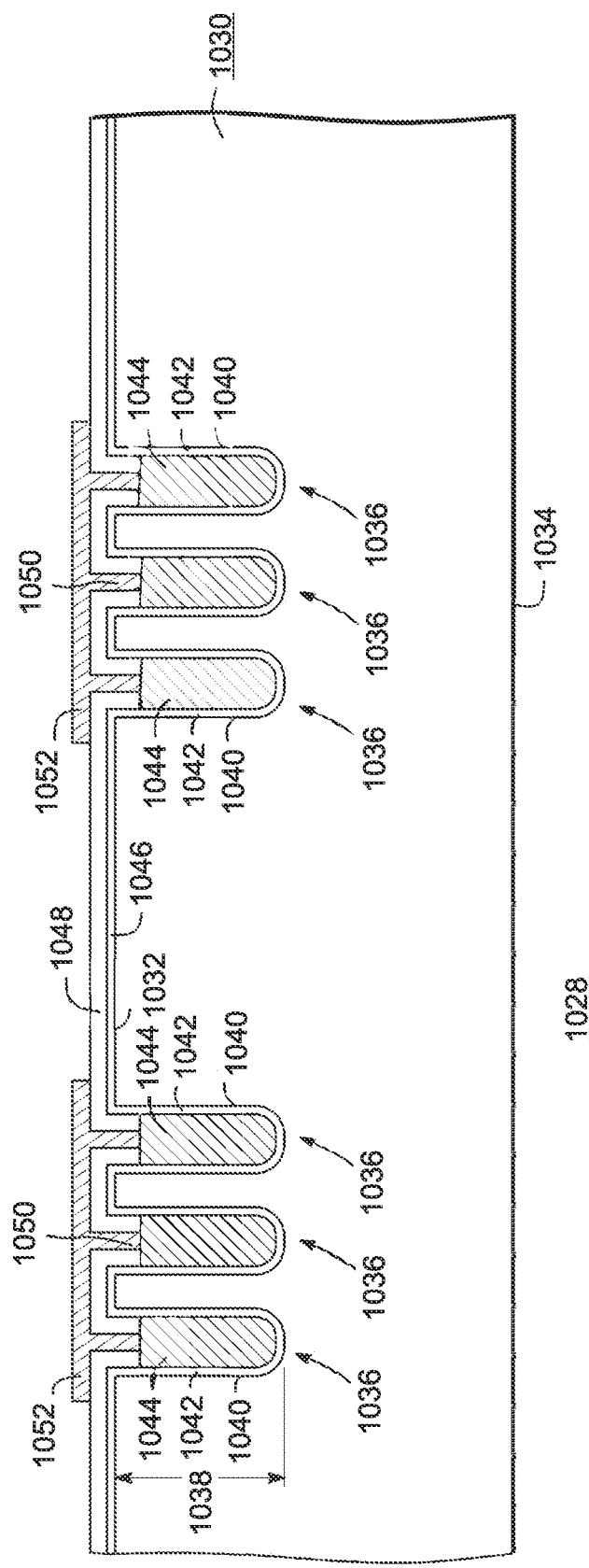
FIG. 117 illustrates an enlarged partial cross-sectional view of a through-substrate via structure at an intermediate stage of fabrication in accordance with an implementation of a semiconductor package.

FIG. 117 illustrates an enlarged partial cross-sectional view of a structure 1028, a substrate structure 1028 or a through-substrate via structure 1028 at an intermediate stage of fabrication in accordance with a first implementation. In some implementations, structure 1028 includes a work piece 1030, which can be a substrate 1030, a body of semiconductor material 1030, or a semiconductor substrate 1030. In some implementations, substrate 1030 comprises a semiconductor material, including, for example, silicon or other Group IV semiconductor materials, IV-IV semiconductor materials, or III-V semiconductor materials. In one implementation, substrate 1030 is a substantially monocrystalline semiconductor wafer having a (100) crystal plane along major surfaces 1032 and 1034. In other implementations, substrate 1030 can be a semiconductor-on-insulator material, or an insulating material, such as a ceramic material. In other implementations, substrate 1030 can be glass, quartz, or other similar materials as known to those skilled in the art. Substrate 1030 has a major surface 1032, such as a first major surface 1032 and an opposing major surface 1034, such as a second major surface 1034.

In accordance with the present implementation, one or more conductive vias 1036, conductive via structures 1036, or conductive trench via structure 1036 are disposed within substrate 1030 extending from first major surface 1032 to a first depth 1038 or first distance 1038. In accordance with the present implementation, first distance 1038 is selected so as to be as small as possible in order to, for example, reduce manufacturing costs and/or improve manufacturability of through-substrate via structure 1028. In some implementations, first depth 1038 is less than about 100 microns. In other implementations, first depth 1038 is less than about 75 microns. In further implementations, first depth 1038 is less than about 50 microns. In still further implementations, first depth 1038 is in a range from about 10 microns through about 40 microns. Conductive via structures 1036 include a trench 1040, which can be formed using photolithographic and etch techniques. In one implementation, a hard mask structure is provided overlying first major surface 1032 and patterned to provide openings in the hard mask structure where trenches 1040 will be formed. In some implementations, the hard mask structure can be an oxide, a nitride, combinations of both, or other protective or masking materials as known to those of skill in the art. In some implementations, trenches 1040 are formed using plasma etching techniques and a chemistry that selectively etches the substrate material at a much higher rate than that of dielectrics and/or other masking material(s). In one implementation, substrate 1030 can be etched using a process commonly referred to as the Bosch process. In other implementations, trenches 1040 can be formed using wet etch techniques. In some implementations trenches 1040 can have a width in range from about 0.2 microns through about 5 microns. It is understood that the width of trenches 1040 can vary depending on the depth of the trenches. Trenches 1040 can have different shapes and sizes depending on the application.

Conductive via structures 1038 further include an insulating structure 1042 or an insulating layer(s) 1042 disposed along at least sidewall surfaces of trenches 1040 in cross-sectional view. In some implementations, insulating structure 1042 can be an oxide material, a nitride material, combinations thereof, or other insulating materials as known to those of skill in the art. In some implementations, insulating structure 1042 is disposed along sidewall and lower or bottom surfaces of trenches 1040. In other implementations, insulating structure 1042 can have an opening formed to expose the bottom surfaces of trenches 1040 and substrate 1040. By way of example, a spacer process can be used to provide the opening in insulating structure 1042 proximate to the bottom surfaces of trenches 1040. Insulating structure 1042 can be formed using thermal oxidation, low-pressure chemical vapor deposition (LPCVD) processes, plasma-enhanced CVD (PECVD) processes, or other processes known to those of skill in the art. In some implementations, insulating structure 1042 has a thickness no greater than 0.9 microns. In other implementations, insulating structure 1042 has a thickness no greater than 0.7 microns. In further implementations, insulating structure 1042 has a thickness of at least 0.1 microns. In another implementation, insulating structures 1042 may not be present.

Conductive via structures 1036 further include a conductive material 1044 disposed at least within trench 1040. In one implementation, insulating structures 1042 are interposed between conductive material 1044 and the sidewall and lower surfaces of trenches 1040. In one preferred implementation, conductive material 1044 comprises tungsten, which is a more cost effective material in some implementations compared to, for example, copper materials. Conductive material 1044 can be formed using deposition, evaporation, sputtering, plating, or similar techniques as known to those of skill in the art. After conductive material 1044 is formed, a planarization process can be used to remove excess material as desired leaving conductive material disposed within trench 1040, or conductive material 1044 may extend out of trench 1040 overlapping major surface 1032. In alternative implementations, conductive material 1044 can be a copper material, doped polycrystalline semiconductor material, combinations thereof, or other similar materials as known to those of skill in the art.

In some implementations, through-substrate via structure 1028 further includes insulating layers 1046 and 1048 disposed over first major surface 1032. In one implementation, insulating layers 1046 and 1048 comprise different insulating materials, such as an oxide and nitride. In other implementations, insulating layers 1046 and 1048 can be similar materials, such as doped and undoped oxides. Openings 1050 can be provided in insulating layers 1046 and 1048 to allow conductive layers 1052 to make electrical contact to conductive material 1044. Conductive layers 1052 can be patterned to provide bonding areas for connecting through-substrate via structure 1028 to another device, such as a semiconductor device or other devices as known to those of skill in the art. Conductive layers 1052 can be a conductive material including, for example, Al/Ni/Au, Al/Ni/Cu, Cu/Ni/Au, Cu/Ni/Pd, Ti/Ni/Au, Ti/Cu/Ni/Au, Ti—W/Cu/Cu, Cr/Cu/Cu, Cr/Cu/Cu/Ni, Ni—V, Ti/Ni/Ag, or similar materials as known to those of skill in the art.

Figure 118:
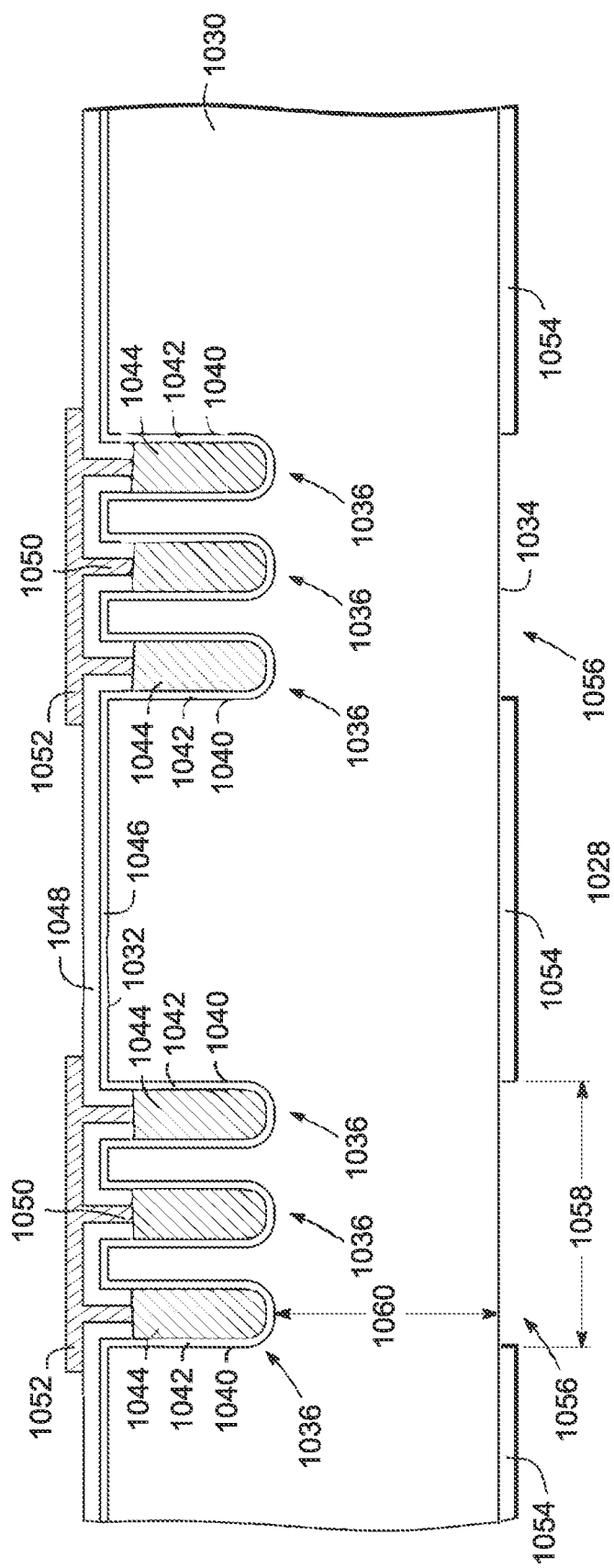
FIG. 118 illustrates an enlarged partial cross-sectional view of the through-substrate via structure of FIG. 117 after additional processing.

FIG. 118 illustrates an enlarged partial cross-sectional view of through-substrate via structure 1028 after additional processing. In one implementation, a masking layer 1054 is provided disposed adjacent to second major surface 1034 of substrate 1030. In one implementation, masking layer 1054 comprises a hard mask structure, such as an oxide or a combination of oxide and nitride. In other implementations, masking layer 1054 can be a polymer material, such as a photoresist material or polyimide material. In some implementations, masking layer 1054 has a thickness in range from about 250 nm through about 1500 nm. Openings 1056 are provided within masking layer 1054, which preferably vertically coincide with groups of conductive via structures 1036 as generally illustrated in FIG. 118. Openings 1056 can be provided using photolithographic and removal steps. In some implementations, a double-sided alignment tool is used to facilitate appropriate alignment with conductive via structures 1036.

In some implementations, openings 1056 are provided with a width 1058. In one implementation, width 1058 is selected based on second distance 1060 between second major surface 1034 and the bottom regions of trenches 1040. For example, when wet etching techniques are used to form recessed regions 1062 (illustrated in FIG. 119), the amount of lateral etching must be taken into to account when determining the width of openings 1056. In one implementation, width 1058 increases by a factor of about 10 for every unit of second distance 1060. For example, in some implementations, width 1058 increases 10 microns for every 1 micron of second distance 1060. In some implementations, width 1058 can be selected based on the final desired width of recessed region 1062 at second major surface 1034, or selected based on the desired final width of surface 1064 (illustrated in FIG. 119) of recessed region 1062. In some implementations, the shape of recessed region 1062 is determined by the crystal lattice of substrate 1030 and the type of removal processed used to form recessed regions 1062. For example, with an isotropic wet etchant, the etch profile will follow the crystal lattice, which defines the angle of the sidewall surfaces of recessed regions 1062. Note that FIG. 118 is not drawn to scale, and is exaggerated in the vertical direction so as to make the present implementation better understood.

Figure 119:
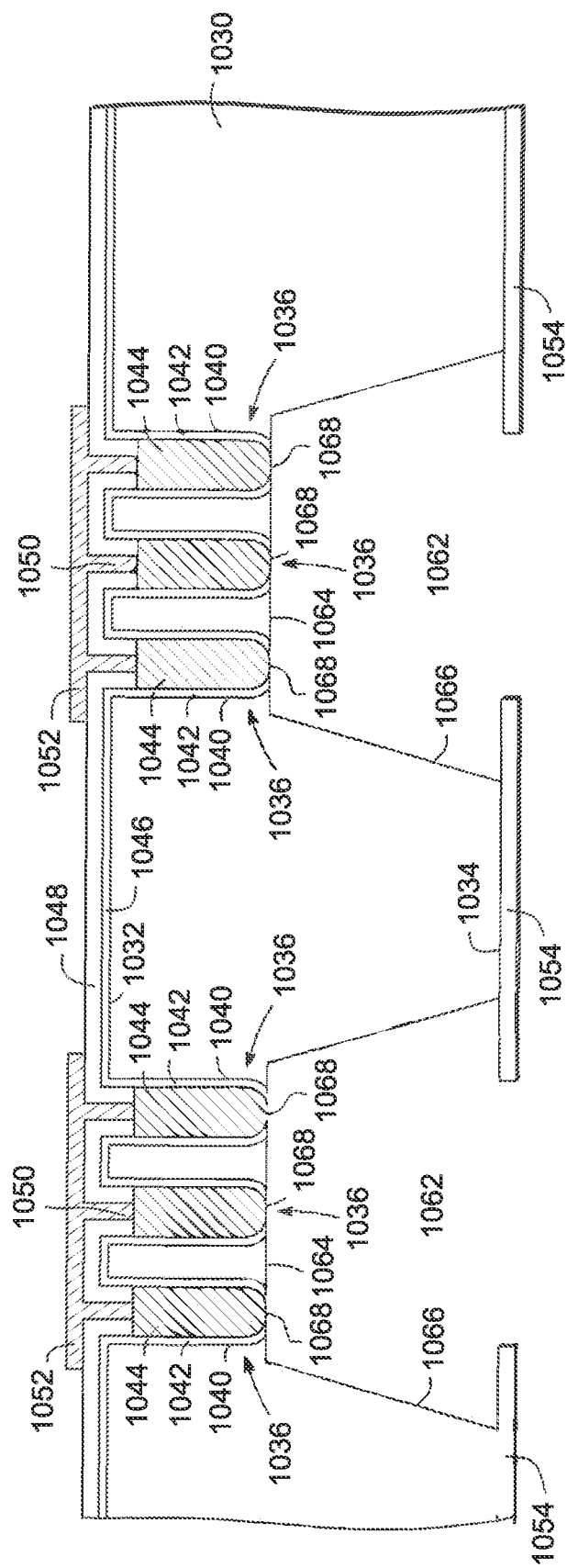

FIG. 119 illustrates an enlarged partial cross-sectional view of through-substrate via structure 1028 after further processing. In one implementation, a protective layer (not shown) is disposed overlying first major surface 1032 to protect conductive layers 1052. Next, portions of substrate 1030 exposed through openings 1058 are removed to form recessed regions 1062, which extend inward from second major surface 1034. In accordance with the present implementation, recessed regions 1062 extend to second depth 1060 or second distance 1060 from second major surface 1034, and include sidewall portions 1066 and surface 1064 contiguous with surfaces 1068 of conductive material 1044 in conductive via structures 1036. In one implementation, an additional etching step can be used to remove portions of insulating structures 1042 to expose surfaces 1068 of conductive material 1044.

In one implementation, recessed regions 1062 are etched using a chemistry that etches substrate 1030 at a much higher rate than masking layer 1054. By way of example, when substrate 1030 comprises silicon, a chemistry including HF/Nitric/Acetic acids can be used. In other implementations, a caustic solution, such as KOH is used to form recessed regions 1062. In still other implementations, a dry etch process can be used. In accordance with the present implementation, second distance 1060 is greater than first distance 1038 and is determined by the difference between the thickness of substrate 1030 and the selected first distance 1038. In one implementation, second distance 1060 is more than two times greater than distance 1038. In some implementations, second distance 1060 is in a range from about 150 microns through about 400 microns. Further, in accordance with the present implementation, recessed regions 1062 are configured to facilitate conductive via structures 1036 being shallower compared to related devices where the conductive via structures extend all the way through the full thickness substrate. This allows for tungsten to be used for conductive material 1044, which provides for reduced manufacturing costs. In addition, recessed regions 1062 allow for substrate 1030 to retain a full thickness (or retain a thickness greater than approximately 200 microns or more), which provides substrate 1030 with more stability to support demands for larger interposer die sizes, to support larger conductive bumps, and support larger semiconductor devices attached to conductive layers 1052.

In some implementations, sidewall portions 1066 have a sloped profile in cross-sectional view. In other implementations, sidewall portions 1066 have a curved profile in cross-sectional view. In still further implementations, sidewall portions 1066 have a substantially vertical profile in cross-sectional view. In some implementations, the lateral width of surface 1064 is less than the lateral width of recessed region 1062 proximate to second major surface 1034. One benefit of sidewall portions 1066 having a sloped profile is that such a profile can provide for, in some implementations, better metal step coverage in subsequent processing. In accordance with the present implementation, recessed region 1062 is wider than the combined width of conductive via structures 1036 adjacent to recessed region 1062 as generally illustrated in FIG. 119. That is, the width of surface 1064 is greater than the combined width of conductive via structures 1036 adjoining recessed region 1062.

Figure 120:
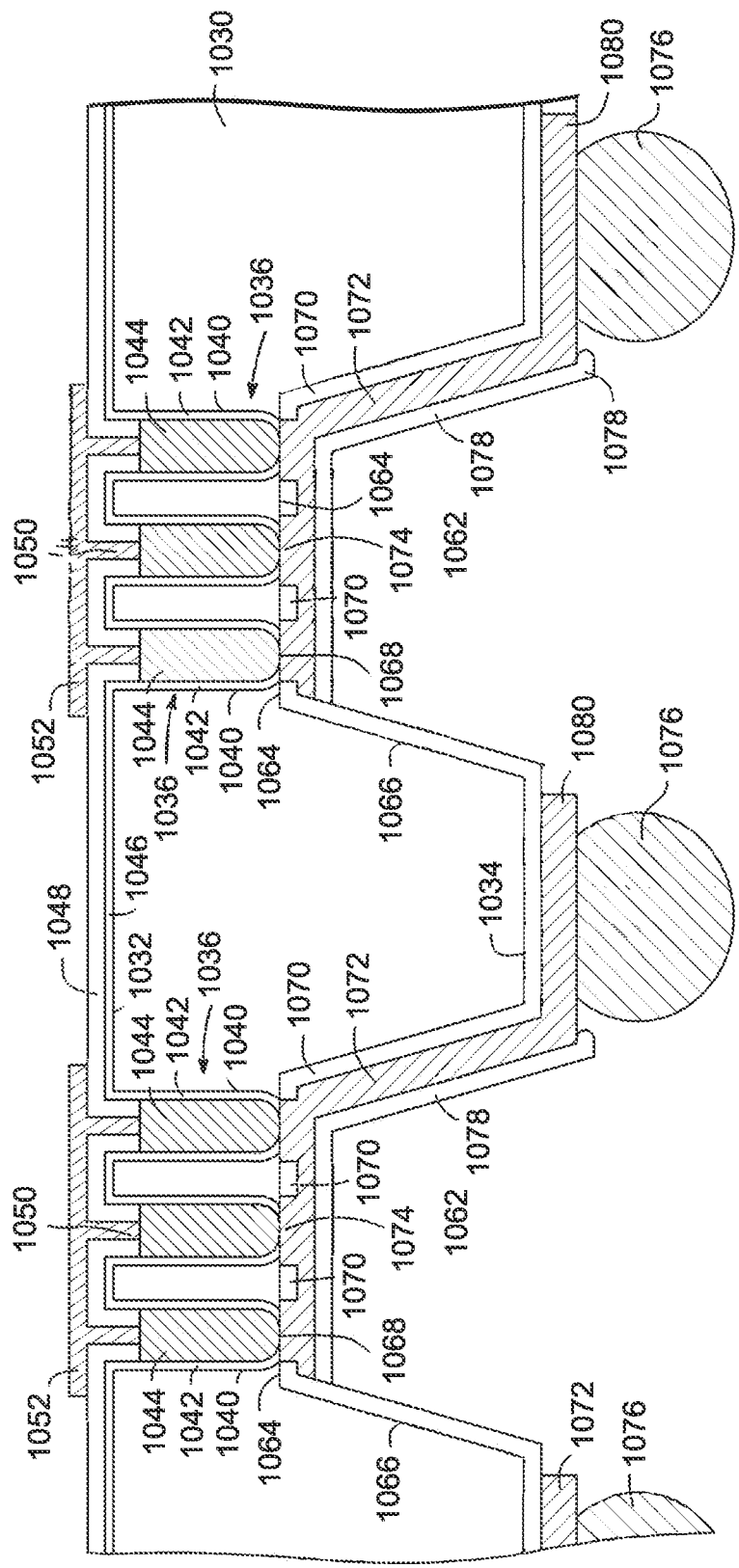

FIG. 120 illustrates an enlarged partial cross-sectional view of through-substrate via structure 1028 after still further processing. In some implementations, through-substrate via structure 1028 further includes an insulating structure 1070 interposed between sidewall portions 1066, at least portions of surface 1064 and a conductive region 1072, conductive layer 1072, or conductive structure 1072. In some implementations, insulating structure 1070 can be one or more polymer materials, such as a polyimide, and is configured to electrically isolate conductive region 1072 from at least portions of substrate 1030. Also, insulating structure 1070 is configured to reduce stresses between conductive region 1072 and substrate 1030. In other implementations, insulating structure 1070 can be a dielectric material, such as an oxide, a nitride, combinations thereof including combinations with a polycrystalline semiconductor material, or other similar materials as known to those of skill in the art. Insulating structure 1070 can be formed using deposition or growth techniques, lamination techniques, spin-on techniques, and/or other formation techniques as known to those of skill in the art. In some implementations, openings 1074 are provided in insulating structure 1070 to facilitate conductive region 1072 making physical and/or electrical contact to conductive material 1044 within conductive vias 1036. In other implementations, insulating structure 1070 may not be present.

In accordance with the present implementation, conductive regions 1072 are disposed along at least one sidewall surface 1066 of recessed portions, disposed to be in electrical communication with conductive material 1044, and further disposed to overlap second major surface 1034 outside of recessed regions 1062. In some implementations, at least one conductive bump 1076 or conductive solder structure 1076 is disposed on that portion of conductive region 1072 overlapping second major surface 1034 as generally illustrated in FIG. 120. In some implementations, conductive regions 1072 can be a conductive material including, for example, Al/Ni/Au, Al/Ni/Cu, Cu/Ni/Au, Cu/Ni/Pd, Ti/Ni/Au, Ti/Cu/Ni/Au, Ti—W/Cu/Cu, Cr/Cu/Cu, Cr/Cu/Cu/Ni, Ni—V, Ti/Ni/Ag, or similar materials as known to those of skill in the art. In some implementations, conductive regions 1072 have a thickness greater than 100 nm. In other implementations, conductive regions 1072 have a thickness greater than 1000 nm. Conductive regions 1072 can be formed using deposition, evaporation, sputtering, plating, or other techniques as known to those of skill in the art. In one implementation, photolithographic and etch techniques can be used to pattern conductive region 1072 in a predetermined manner. In some implementations, a masking layer 1078, solder mask layer 1078, or protective layer 1078 is disposed adjacent to at least conductive region 1072 and patterned to provide exposed bonding pads 1080 as generally illustrated in FIG. 120. In one implementation, protective layer 1078 comprises a polymer material, such as polyimide or other organic materials as known to those skilled in the art. In some implementations, protective layer 1078 is further disposed adjacent all sidewall portions 1066 including sidewall portions 1066 that are devoid of conductive region 1072. In other implementations, protective layer 1078 is not used.

Through-substrate via structure 1028 further includes conductive bumps 1076 disposed adjacent to bonding pad 1080 portions of conductive regions 1072 as generally illustrated in FIG. 120. In accordance with the present implementation, conductive bumps 1076 are laterally spaced away or apart from conductive via structures 1036, and are in electrical communication with conductive via structures 1036 through conductive regions 1072. Stated another way, in the present implementation conductive bumps 1076 are disposed outside of recessed regions 1062. That is, in accordance with some implementations, conductive bumps 1076 are not directly physically attached to conductive material 1044 in conductive vias 1036. In some implementations, conductive bumps 1076 comprise Sn/Pb solder bumps, lead-free solder bumps, or other reflowable solder bump or ball materials as known to those skilled in the art.

In accordance with the present implementation, through-substrate via structure 1028 is provided with conductive vias 1036, which extend to a first depth 1038 less than about 100 microns, which facilitates the use of a lower cost conductive material, such as tungsten, compared to copper for conductive material 1044 in conductive vias 1036. Through-substrate via structure 1028 is further provided with recessed regions 1062, which facilitate first depth 1038 being less than about 100 microns and further facilitate substrate 1030 having a full thickness in other regions of substrate 1030 outside of recessed regions 1062. Thus, through-substrate via structure 1028 can be thicker (e.g., 200 microns to 250 microns thick or thicker) compared to related devices that are 100 microns thick or less. Also, this facilitates through-substrate via structure 1028 being larger, for example, 15 mm per side semiconductor die, and facilitates the use of multiple or larger semiconductor die with through-substrate via structure 1028, and facilitates the use of larger conductive bumps.

Figure 121:
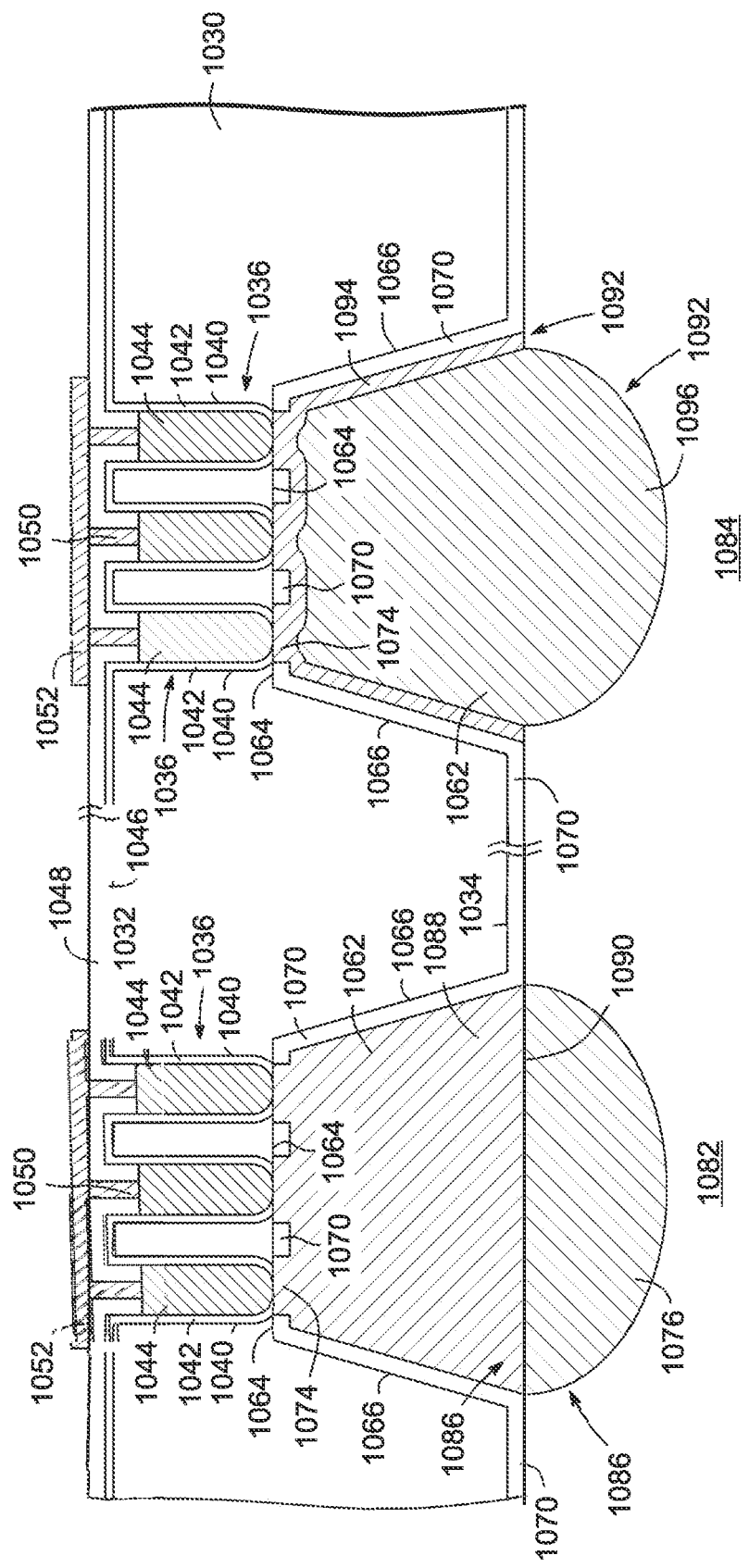

FIG. 121 illustrates an enlarged partial cross-sectional view of through-substrate via structures 1082 and 1084 in accordance with two alternative implementations. Through-substrate via structures 1082 and 1084 are similar to through-substrate via structure 1028, and only the differences will be described hereinafter. Turning first to through-substrate structure 1082, conductive region 1086 comprises a conductive-fill structure 1088 or first conductive portion 1088, which is configured to substantially fill recessed region 1062. Stated another way, first conductive portion 1088 laterally extends completely between opposing sidewall surfaces 1066 without an inward step. That is, first conductive portion 1088 is other than a conductive liner. In one implementation, first conductive portion 1088 completely fills recessed region 1062 so that an outer surface 1090 is proximate to second major surface 1034. In other implementations, first conductive portion 1088 extends outside of recessed region 1062 so that outer surface 1090 and second major surface 1034 both reside on different planes with outer surface 1090 spaced further away from surface 1064 than second major surface 1034. In one implementation, first conductive portion 1088 comprises copper, a copper alloy or other materials as known to those of skill in the art, and can be formed using deposition, evaporation, sputtering, plating, or other processes as known to those of skill in the art. In one implementation, conductive region 1086 further includes a conductive bump 1076 disposed adjoining outer surface 1090 of first conductive portion 1088. One advantage of through-substrate via structure 1082 is that it provides a thicker low cost structure with semi-recessed conductive region 1086, which has a reduced height compared to, for example, through-substrate via structure 1028.

Through-substrate via structure 1084 includes a conductive region 1092, which, in one implementation, includes a conductive liner structure 1094 and a conductive bump 1096. In one implementation, conductive liner structure 1094 is interposed between conductive bump 1096 and insulating structure 1070. In one implementation, conductive liner structure 1094 comprises a metal, such as copper or a copper alloy, or other conductive materials as known to those of skill in the art. Conductive liner structure 1094 can be formed using deposition, evaporation, sputtering, plating, or other processes as known to those of skill in the art. In one implementation, conductive bump 1096 comprises a Sn/Pb solder bump, a lead-free solder bump, or another reflowable solder bump or ball materials as known to those skilled in the art. In one implementation, conductive liner structure 1094 is disposed on two opposing sidewall surface 1066 and surface 1064 in cross-sectional view. In one implementation, conductive bump 1096 completely fills recessed region 1062 so as to extend outward from second major surface 1034. In some implementations, conductive bump 1096 can be formed using a ball drop process, a stencil process, or similar processes as known to those skilled in the art. One advantage of through-substrate via structure 1084 is it provides a thicker low cost structure with semi-recessed conductive region 1092, which has a reduced height compared to, for example, through-substrate via structure 1028.

Figure 122:
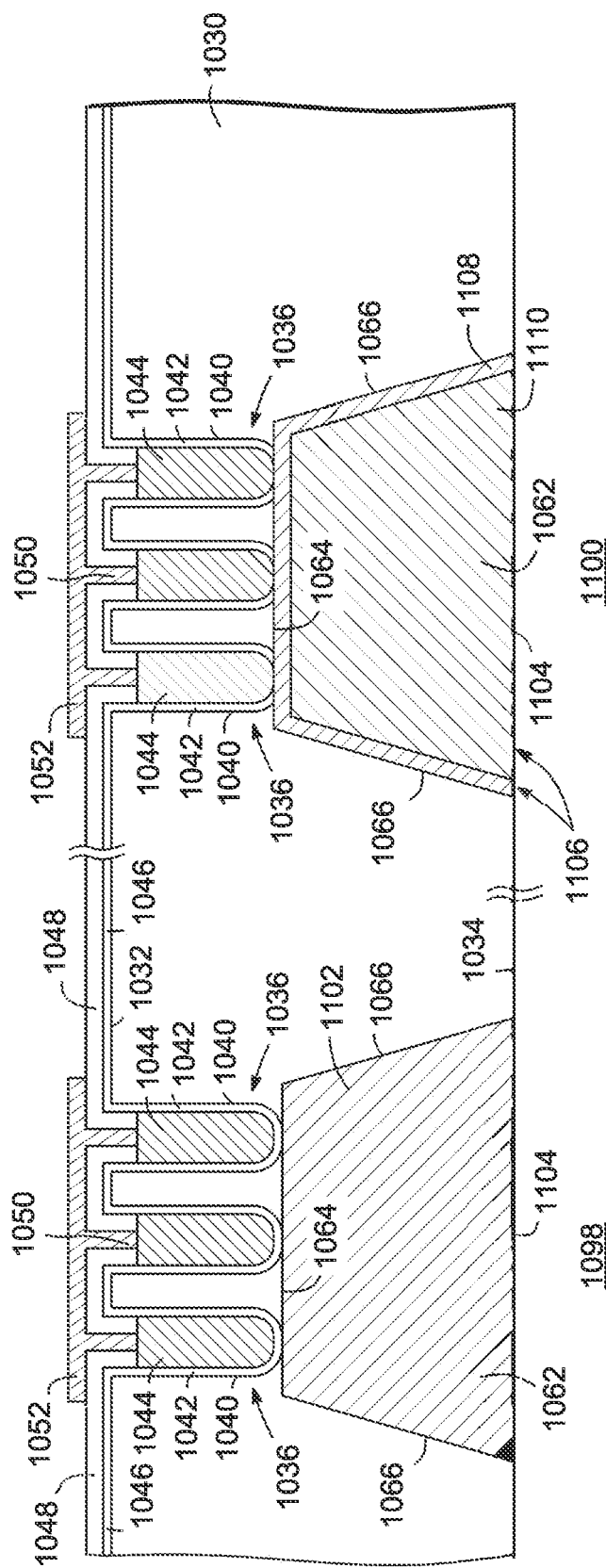

FIG. 122 illustrates an enlarged partial cross-sectional view of through-substrate via structures 1098 and 1100 in accordance with two alternative implementations. Through-substrate via structures 1098 and 1100 are similar to through-substrate via structures 1028, 1082, and 1084 and only the differences will be described hereinafter. In accordance with the present implementation, through-substrate via structures 1098 and 1100 are heat sinking structures configured to address thermal crowding that may occur in active structures disposed adjacent first major surface 1032 of substrate 1030. In some implementations, conductive vias 1036 do not have to be electrically connected to input/output (I/O) structures, and instead can be configured as part of the heat sinking structure to reduce, for example, thermal transient issues.

Through-substrate via structure 1098 includes a conductive region 1102 disposed within recessed region 1062. Similar to through-substrate via structure 1082, conductive region 1102 comprises a conductive-fill structure, which is configured to substantially fill recessed region 1062. Stated another way, conductive region 1102 laterally extends completely between opposing sidewall surfaces 1098 without an inward step. That is, conductive region 1102 is other than a conductive liner. In one implementation, conductive region 1102 completely fills recessed region 1062 so that an outer surface 1104 is proximate to second major surface 1034. In other implementations, outer surface 1104 can extend outward from second major surface 1034. In accordance with the present implementation, outer surface 1104 can be connected to a next level of assembly, such as an additional heat sink structure. In some implementations, conductive region 1102 comprises one or metal materials, such as copper or a copper alloy, and can be formed using deposition, evaporation, sputtering, screen printing, plating or other processes as known to those of skill in the art. In one implementation, insulating structures 1042 in conductive vias 1036 can electrically isolate (but not thermally isolate) conductive material 1044 from conductive region 1102. In other implementations, conductive material 1044 can be electrically connected to conductive region 1104 as in other implementations described previously. Although not illustrated, insulating structure 1070 can be interposed between surfaces of recessed region 1062 and conductive region 1102 with or without openings 1074 as illustrated in other implementations.

Through-substrate via structure 1100 includes a conductive region 1106, which, in one implementation, includes a conductive liner structure 1108 and a conductive-fill structure 1110. In one implementation, conductive liner structure 1108 is interposed between surfaces of recessed region 1062 and conductive-fill structure 1110. In one implementation, conductive liner structure 1108 comprises a metal, such as copper or a copper alloy, or other thermally conductive materials as known to those of skill in the art. Conductive liner structure 1108 can be formed using deposition, evaporation, sputtering, plating, or other processes as known to those of skill in the art. In one implementation, conductive-fill structure 1110 comprises a Sn/Pb solder, a lead-free solder, or other reflowable solder materials as known to those skilled in the art. In some implementations, conductive-fill structure 1110 can be formed using a ball drop process, a stencil process, or similar processes as known to those skilled in the art. In one implementation, conductive liner structure 1108 is disposed on two opposing sidewall surface 1066 and surface 1064 in cross-sectional view. In one implementation, conductive-fill structure 1110 completely fills recessed region 1062 so as to extend proximate to second major surface 1034. In one implementation, conductive material 1044 is electrically connected to conductive region 1106. In other implementations, conductive material 1044 is electrically isolated, but in thermal communication with conductive region 1106. Although not illustrated, insulating structure 1070 can be interposed between surfaces of recessed region 1062 and conductive region 1106 with or without openings 1074 as illustrated in other implementations.

In view of all of the above, it is evident that a novel method and structure is disclosed. Included, among other features, is a through-substrate via structure having one or more conductive via extending only partially inward within a substrate from a first major surface. A recessed region is disposed extending inward from a second major surface to the conductive via. In one implementation, a conductive region is disposed within the recessed region to electrically connect the conductive via to another conductive structure, such as a conductive bump. Among other things, the through-substrate via structure facilities a thicker substrate structure while also facilitating the use of more cost-effective conductive materials for the via structure, such as tungsten. Also, the structure is better suited for use with larger electronic die and is more robust against warpage and breakage. In other implementations, the through-substrate via structure is configured as a heat sinking structure for reducing thermal crowding issues with active devices disposed adjacent one surface of the through-substrate via structure.

While the subject matter of the invention is described with specific preferred implementations and example implementations, the foregoing drawings and descriptions thereof depict only typical implementations of the subject matter, and are not therefore to be considered limiting of its scope. It is evident that many alternatives and variations will be apparent to those skilled in the art. For example, substrate 1030 can be provided with an edge support ring structure In places where the description above refers to particular implementations of die support structures and implementing components, sub-components, methods and sub-methods, it should be readily apparent that a number of modifications may be made without departing from the spirit thereof and that these implementations, implementing components, sub-components, methods and sub-methods may be applied to other die support structures and related methods.

What is claimed is:

1. A semiconductor package comprising:
a semiconductor die comprising a first side and a second side opposite the first side;
a cavity extending into the second side of the semiconductor die and only partially through the semiconductor die;
a backmetal coupled within the cavity and directly coupled to an entirety of the second side; and
an organic material coupled over the first side of the semiconductor die and over a plurality of sidewalls of the semiconductor die;
wherein a first portion of the first side directly opposite the cavity is coplanar with a second portion of the first side at an outer edge of the first side.

2. The semiconductor package of claim 1, wherein the organic material further comprises a die support structure.

3. The semiconductor package of claim 1, wherein multiple surfaces of the backmetal form multiple outer surfaces of the semiconductor package.

4. The semiconductor package of claim 2, wherein the organic material comprises a temporary die support structure.

5. The semiconductor package of claim 1, further comprising one or more electrical contacts exposed through one or more openings in the organic material.

6. The semiconductor package of claim 1, wherein a thinned portion of the semiconductor die is less than 5 microns thick.

7. A semiconductor package comprising:
- a semiconductor die comprising a first side and a second side opposite the first side;
- a cavity extending into the second side of the semiconductor die and only partially through the semiconductor die;
- a backmetal coupled within the cavity; and
- an organic material coupled over the first side of the semiconductor die and over an entirety of each sidewall of a plurality of sidewalls of the semiconductor die;
- wherein an outer perimeter of the backmetal is a same size and shape as an outermost perimeter of the semiconductor die; and
- wherein an entirety of the first side lies in a same plane and extends to the outermost perimeter of the semiconductor die.

8. The semiconductor package of claim 7, wherein the organic material is directly coupled to the backmetal.

9. The semiconductor package of claim 7, wherein the organic material further comprises a die support structure.

10. The semiconductor package of claim 7, wherein a largest planar surface of the second side of the semiconductor die is within the cavity.

11. The semiconductor package of claim 7, wherein a thinned portion of the semiconductor die is less than five microns thick.

12. The semiconductor package of claim 7, further comprising one or more electrical contacts exposed through one or more openings in the organic material.

13. The semiconductor package of claim 7, further comprising a conductive material coupled within the cavity.

* * * * *